(12) United States Patent
Ogata

(10) Patent No.: US 10,192,879 B2
(45) Date of Patent: *Jan. 29, 2019

(54) SEMICONDUCTOR DEVICE AND MANUFACTURING METHOD THEREOF

(71) Applicant: Renesas Electronics Corporation, Koutou-ku, Tokyo (JP)

(72) Inventor: Tamotsu Ogata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/429,498

(22) Filed: Feb. 10, 2017

(65) Prior Publication Data

US 2017/0154893 A1    Jun. 1, 2017

Related U.S. Application Data

(63) Continuation of application No. 15/043,576, filed on Feb. 14, 2016, now Pat. No. 9,595,532.

(30) Foreign Application Priority Data

Mar. 30, 2015 (JP) ................................. 2015-070245

(51) Int. Cl.
   *H01L 27/11568* (2017.01)
   *H01L 29/51* (2006.01)
   (Continued)

(52) U.S. Cl.
   CPC .... *H01L 27/11568* (2013.01); *G11C 16/0433* (2013.01); *G11C 16/0466* (2013.01);
   (Continued)

(58) Field of Classification Search
   CPC ........................ H01L 27/11568; H01L 21/0214
   See application file for complete search history.

(56) References Cited

U.S. PATENT DOCUMENTS 7,045,848 B2   5/2006   Shukuri
7,446,371 B2   11/2008  Kim
(Continued)

FOREIGN PATENT DOCUMENTS

JP    2006-41227 A    2/2006
JP    2006-121094 A   5/2006
(Continued)

OTHER PUBLICATIONS

Office Action dated Aug. 14, 2018, in Japanese Patent Application No. 2015-070245.

*Primary Examiner* — Eugene Lee
(74) *Attorney, Agent, or Firm* — Shapiro, Gabor and Rosenberger, PLLC

(57) ABSTRACT

An improvement is achieved in the performance of a semiconductor device having a nonvolatile memory. A memory cell of the nonvolatile memory includes a control gate electrode formed over a semiconductor substrate via a first insulating film and a memory gate electrode formed over the semiconductor substrate via a second insulating film to be adjacent to the control gate electrode via the second insulating film. The second insulating film includes a third insulating film made of a silicon dioxide film, a fourth insulating film made of a silicon nitride film over the third insulating film, and a fifth insulating film over the fourth insulating film. The fifth insulating film includes a silicon oxynitride film. Between the memory gate electrode and the semiconductor substrate, respective end portions of the fourth and fifth insulating films are located closer to a side surface of the memory gate electrode than an end portion of a lower surface of the memory gate electrode. Between the memory gate electrode and the semiconductor substrate, in a region where the second insulating film is not formed, another silicon dioxide film is embedded.

29 Claims, 32 Drawing Sheets

(51) Int. Cl.
  *H01L 29/792* (2006.01)
  *H01L 29/423* (2006.01)
  *H01L 21/28* (2006.01)
  *H01L 21/02* (2006.01)
  *H01L 21/311* (2006.01)
  *H01L 29/66* (2006.01)
  *G11C 16/04* (2006.01)
  *G11C 16/10* (2006.01)
  *G11C 16/14* (2006.01)
  *H01L 29/08* (2006.01)

(52) U.S. Cl.
  CPC .............. *G11C 16/10* (2013.01); *G11C 16/14* (2013.01); *H01L 21/0214* (2013.01); *H01L 21/0217* (2013.01); *H01L 21/02164* (2013.01); *H01L 21/28282* (2013.01); *H01L 21/31111* (2013.01); *H01L 29/0847* (2013.01); *H01L 29/42344* (2013.01); *H01L 29/513* (2013.01); *H01L 29/518* (2013.01); *H01L 29/66833* (2013.01); *H01L 29/792* (2013.01)

(56) References Cited

U.S. PATENT DOCUMENTS

| | | | |
|---|---|---|---|
| 7,507,611 B2 * | 3/2009 | Park | H01L 21/28202 438/149 |
| 7,915,666 B2 | 3/2011 | Yasui et al. | |
| 8,865,548 B2 | 10/2014 | Charpin-Nicolle et al. | |
| 2008/0258205 A1 | 10/2008 | Ishimaru et al. | |
| 2013/0256776 A1 | 10/2013 | Charpin-Nicolle et al. | |
| 2015/0129953 A1 * | 5/2015 | Owada | H01L 27/11568 257/326 |
| 2015/0372136 A1 | 12/2015 | Chang et al. | |
| 2017/0352675 A1 * | 12/2017 | Mihara | H01L 21/28282 |

FOREIGN PATENT DOCUMENTS

| | | |
|---|---|---|
| JP | 2008-270343 A | 11/2008 |
| JP | 2008-288503 A | 11/2008 |

* cited by examiner

| OPERATION \ APPLIED VOLTAGE | Vd | Vcg | Vmg | Vs | Vb |
|---|---|---|---|---|---|
| WRITE | 0.5V | 1V | 10V | 5V | 0 |
| ERASE | 0 | 0 | 12V | 0 | 0 |
| READ | 1.5V | 1.5V | 0 | 0 | 0 |

SEMICONDUCTOR DEVICE AND MANUFACTURING METHOD THEREOF

CROSS-REFERENCE TO RELATED APPLICATIONS

The disclosure of Japanese Patent Application No. 2015-070245 filed on Mar. 30, 2015 including the specification, drawings and abstract is incorporated herein by reference in its entirety.

BACKGROUND

The present invention relates to a semiconductor device and a manufacturing method thereof, which can be used appropriately as, e.g., a semiconductor device having a nonvolatile memory and a manufacturing method thereof.

As an electrically writable/erasable nonvolatile semiconductor storage device, an EEPROM (Electrically Erasable and Programmable Read Only Memory) has been used widely. Such a storage device represented by a flash memory which is currently used widely has a conductive floating gate electrode or trapping insulating film surrounded by oxide films under the gate electrode of a MISFET. A charge storage state in the floating gate electrode or trapping insulating film is used as stored information and read as the threshold of the transistor. The trapping insulating film refers to an insulating film capable of storing charges therein, and examples thereof include a silicon nitride film. By injection/release of charges into/from such a charge storage region, the threshold of the MISFET is shifted to allow the MISFET to operate as a storage element. Examples of the flash memory include a split-gate cell using a MONOS (Metal Oxide Nitride Oxide Semiconductor) film. In such a memory, a silicon nitride film is used as a charge storage region. This provides advantages over the case where the conductive floating gate film is used as the charge storage regions such that, due to discrete storage of charges, data retention reliability is high, and the high data retention reliability allows the oxide films over and under the silicon nitride film to be thinned and allows a voltage for a write/erase operation to be reduced.

Each of Japanese Unexamined Patent Publication Nos. 2006-41227 (Patent Document 1), 2008-288503 (Patent Document 2), and 2008-270343 (Patent Document 3) describes a technique related to a semiconductor device having a nonvolatile memory.

RELATED ART DOCUMENTS

Patent Documents

[Patent Document 1]
  Japanese Unexamined Patent Publication No. 2006-41227
  Japanese Unexamined Patent Publication No. 2008-288503
  Japanese Unexamined Patent Publication No. 2008-270343

SUMMARY

Even in a semiconductor device having a nonvolatile memory, it is desired to maximize performance.

Other problems and novel features of the present invention will become apparent from a statement in the present specification and the accompanying drawings.

According to an embodiment, a semiconductor device includes a first gate electrode formed over a semiconductor substrate via a first gate insulating film to be included in a memory cell of a nonvolatile memory and a second gate electrode formed over the semiconductor substrate via a multi-layer insulating film to be adjacent to the first gate electrode via the multi-layer insulating film and included in the memory cell. The multi-layer insulating film includes a first silicon dioxide film, a first silicon nitride film over the first silicon dioxide film, and a first insulating film over the first silicon nitride film. The first insulating film includes a silicon oxynitride film. The second gate electrode has a first side surface adjacent to the first gate electrode via the multi-layer insulating film and a second side surface opposite to the first side surface. Between a lower surface of the second gate electrode and the semiconductor substrate, a first end portion of the first silicon nitride film and a second end portion of the first insulating film are located closer to the first side surface than a third end portion of the lower surface of the second gate electrode which is closer to the second side surface. Between the lower surface of the second gate electrode and the semiconductor substrate, in a region where the multi-layer insulating film is not formed, a second silicon dioxide film is embedded.

Also, according to another embodiment, a method of manufacturing a semiconductor device includes the steps of (a) providing a semiconductor substrate and (b) forming a first gate electrode included in a memory cell of a nonvolatile memory over the semiconductor substrate via a first gate insulating film. The method of manufacturing the semiconductor device further includes the step of (c) forming a multi-layer insulating film including a first silicon dioxide film, a first silicon nitride film over the first silicon dioxide film, and a first insulating film over the first silicon nitride film over a main surface of the semiconductor substrate and a top surface of the first gate electrode. Here, the first insulating film includes a silicon oxynitride film. The method of manufacturing the semiconductor device further includes the steps of (d) forming a second gate electrode included in the memory cell over the multi-layer insulating film such that the second gate electrode is adjacent to the first gate electrode via the multi-layer insulating film and (e) removing a portion of the multi-layer insulating film which is uncovered with the second gate electrode. The second gate electrode has a lower surface facing the semiconductor substrate, a first side surface adjacent to the first gate electrode via the multi-layer insulating film, and a second side surface opposite to the first side surface. The step (e) includes the steps of (e1) removing a part of the multi-layer insulating film interposed between the lower surface of the second gate electrode and the semiconductor substrate and (e2) after the step (e1), embedding a second silicon dioxide film in a region between the lower surface of the second gate electrode and the semiconductor substrate from which the multi-layer insulating film has been removed. By performing the step (e1), between the lower surface of the second gate electrode and the semiconductor substrate, a first end portion of the first silicon nitride film and a second end portion of the first insulating film are located closer to the first side surface than a third end portion of the lower surface of the second gate electrode which is closer to the second side surface.

According to the embodiment, the performance of the semiconductor device can be improved.

DETAILED DESCRIPTION

Figure 1:
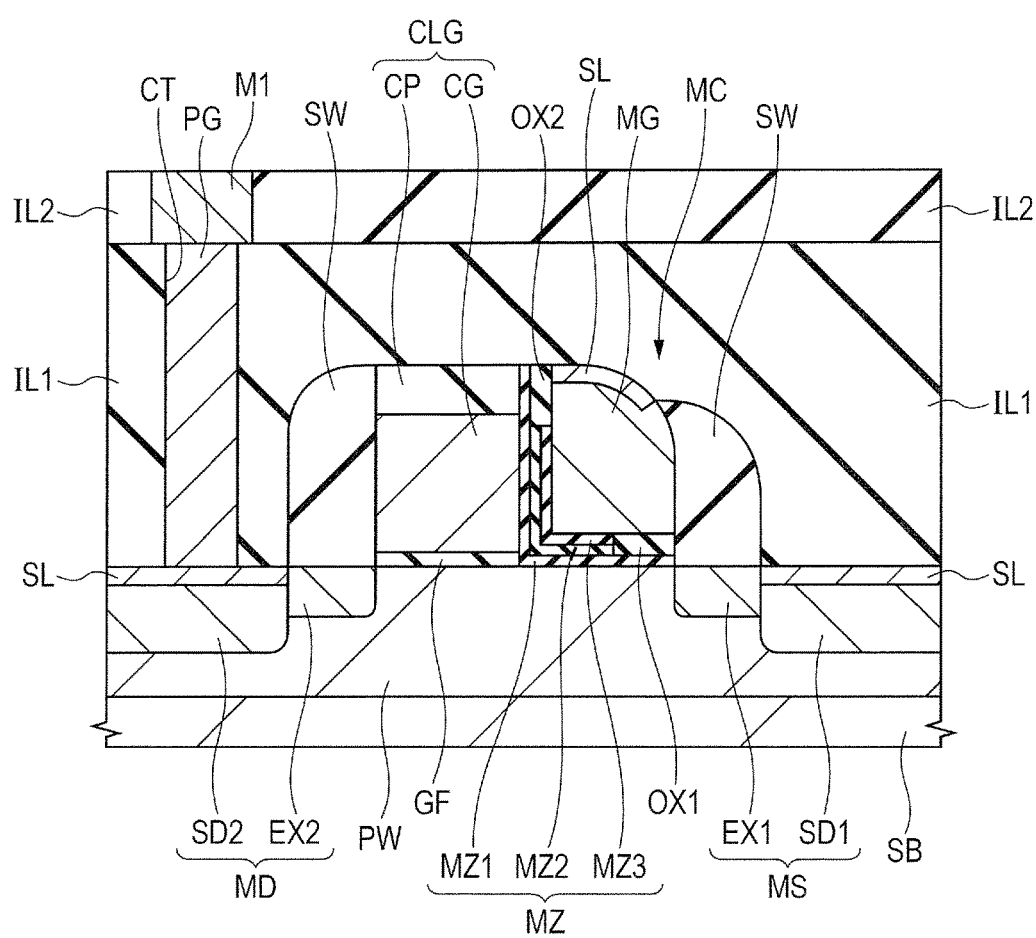
FIG. 1 is a main-portion cross-sectional view of a semiconductor device as an embodiment.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

(Embodiment 1)
<About Structure of Semiconductor Device>

Each of semiconductor devices in the present and following embodiments has a nonvolatile memory (nonvolatile storage element, flash memory, or nonvolatile semiconductor storage device). In each of the present and following embodiments, the nonvolatile memory will be described on the basis of a memory cell based on an n-channel MISFET (Metal Insulator Semiconductor Field Effect Transistor). Also, in each of the present and following embodiments, polarities (the polarities of voltages applied during write/erase/read operations and the polarities of carriers) are for describing operations when the memory cell is based on the n-channel MISFET. When the memory cell is based on a p-channel MISFET, by inverting all the polarities such as the polarities of applied potentials and carriers, basically the same operations can be obtained.

Referring to the drawings, the semiconductor device in Embodiment 1 will be described.

Figure 2:
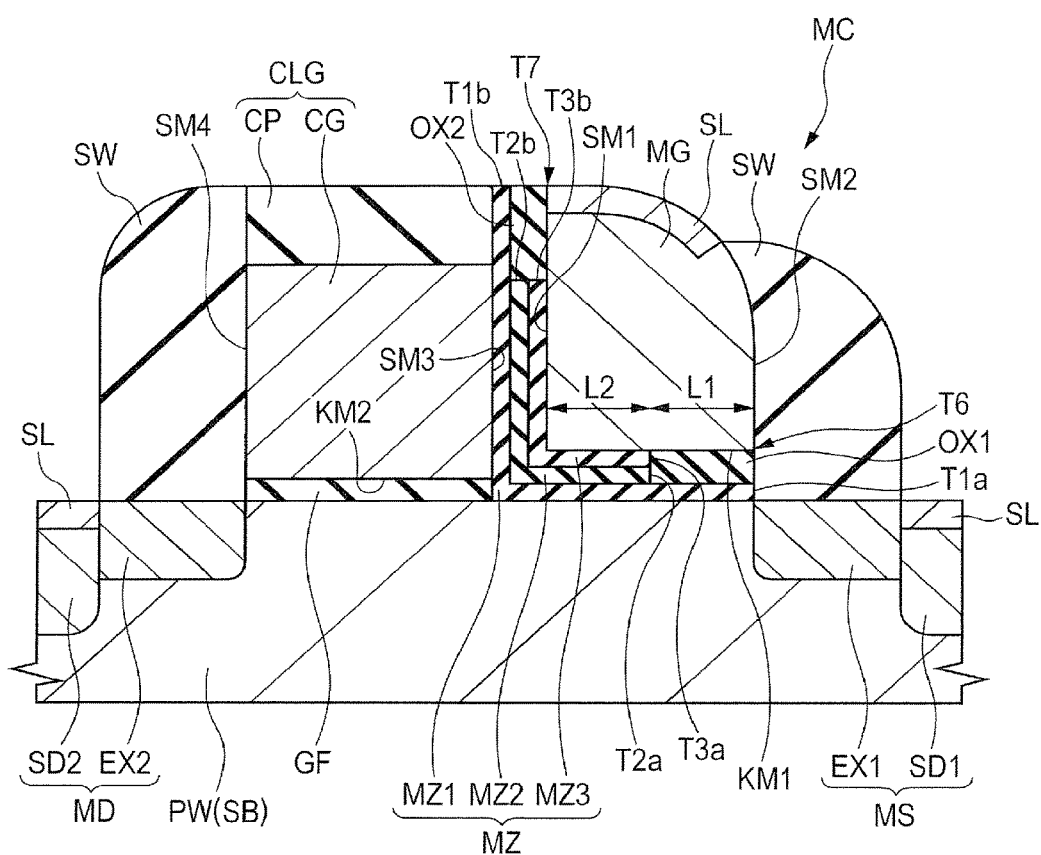
FIG. 2 is a partially enlarged cross-sectional view showing a part of FIG. 1 in enlarged relation.
Figures 3, 4:
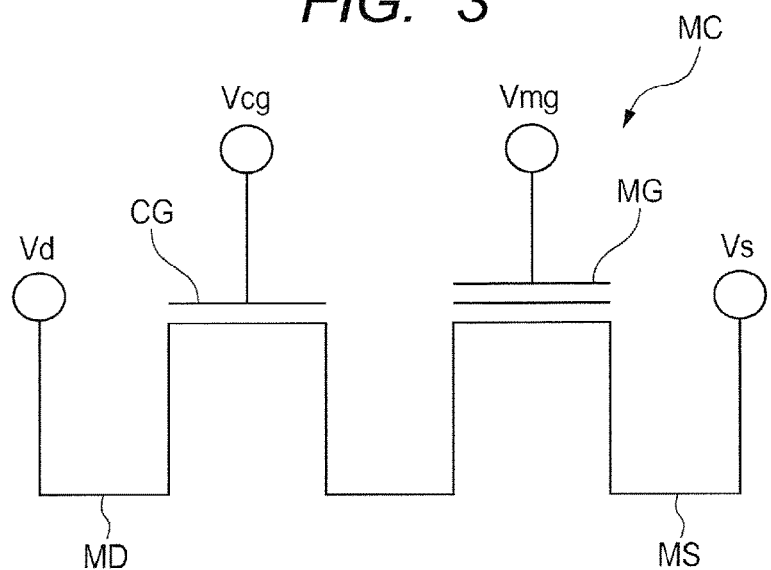
FIG. 3 is an equivalent circuit diagram of a memory cell.
FIG. 4 is a table showing an example of conditions under which voltages are applied to the individual portions of a selected memory cell during "Write", "Erase", and "Read" operations.

FIG. 1 is a main-portion cross-sectional view of the semiconductor device in Embodiment 1. The semiconductor device in Embodiment 1 has the nonvolatile memory. FIG. 1 shows a main-portion cross-sectional view of a memory cell region in the nonvolatile memory. FIG. 2 is a partially enlarged cross-sectional view (main-portion cross-sectional view) of a memory cell MC in the semiconductor device in Embodiment 1, which shows a part of FIG. 1 in enlarged relation. Note that, in FIG. 2, for improved clarity of illustration, the depiction of an interlayer insulating film IL1, contact holes CT, plugs PG, an insulating film IL2, and wires M1 which are shown in FIG. 1 is omitted. FIG. 3 is an equivalent circuit diagram of the memory cell MC.

As shown in FIG. 1, in a semiconductor substrate (semiconductor wafer) SB made of, e.g., p-type monocrystalline silicon having a specific resistance of about 1 to 10 Ωcm or the like, an isolation region (not shown in FIG. 1) for isolating an element is formed. In the active region isolated (defined) by the isolation region, a p-type well region PW is formed. In the p-type well PW in the memory cell region, the memory cell MC of the nonvolatile memory including a memory transistor and a control transistor (selection transistor) each as shown in FIG. 1 is formed. In an actual situation, in the semiconductor substrate SB, a plurality of the memory cells MC are formed in an array-like configuration. FIG. 1 shows a cross section of one of the memory cells MC. Each of the memory cell regions is electrically isolated from the other region by the isolation region.

As shown in FIGS. 1 to 3, the memory cell (memory element) MC of the nonvolatile memory in the semiconductor device in Embodiment 1 is a split-gate memory cell (memory element) in which two MISFETs which are the control transistor (selection transistor) having a control gate electrode CG and the memory transistor having a memory gate electrode MG are coupled to each other.

Here, the MISFET having a gate insulating film including a charge storage portion (charge storage layer) and the memory gate electrode MG is referred to as a memory transistor. On the other hand, the MISFET having a gate insulating film and the control gate electrode CG is referred to as a control transistor. Accordingly, the memory gate electrode MG is the gate electrode of the memory transistor, the control gate electrode CG is the gate electrode of the control transistor, and the control gate electrode CG and the memory gate electrode MG are gate electrodes included in the memory cell of the nonvolatile memory. Note that the control transistor, which is for selecting the memory cell, can also be regarded as the selection transistor. The memory transistor is a storage transistor.

The following will specifically describe a configuration of the memory cell MC.

As shown in FIGS. 1 to 3, the memory cell MC of the nonvolatile memory includes n-type semiconductor regions MS and MD each formed in the p-type well PW of the semiconductor substrate SB to serve as a source or drain region, the control gate electrode CG formed over the semiconductor substrate SB (p-type well PW), and the memory gate electrode MG formed over the semiconductor substrate SB (p-type well PW) to be adjacent to the control gate electrode CG. The memory cell MC of the nonvolatile memory further has an insulating film (gate insulating film) GF formed between the control gate electrode CG and the semiconductor substrate SB (p-type well PW) and an insulating film MZ formed between the memory gate electrode MG and the semiconductor substrate SB (p-type well PW) and between the memory gate electrode MG and the control gate electrode CG.

The control gate electrode CG and the memory gate electrode MG extend along a main surface of the semiconductor substrate SB with the insulating film MZ being interposed between the respective facing side surfaces of the control gate electrode CG and the memory gate electrode MG to be arranged side by side. The directions in which the control gate electrode CG and the memory gate electrode MG extend is perpendicular to the surface of the paper sheet with FIG. 1. The control gate electrode CG and the memory gate electrode MG are formed over the semiconductor substrate SB (p-type well PW) located between the semiconductor regions MD and MS. The memory gate electrode MG is located closer to the semiconductor region MS. The control gate electrode CG is located closer to the semiconductor region MD. The control gate electrode CG is formed over the semiconductor substrate SB (p-type well PW) via the insulating film GF, while the memory gate electrode MG is formed over the semiconductor substrate SB (p-type well PW) via the insulating film MZ.

Over the control gate electrode CG, a cap insulating film CP is formed. A multi-layer body (multi-layer structure) formed of the control gate electrode CG and the cap insulating film CP over the control gate electrode CG is hereinafter referred to as a control gate CLG. In another embodiment, it may also be possible that the cap insulating film CP is not formed over the control gate electrode CG. The following will describe the case where the cap insulating film CP is formed over the control gate electrode CG but, in the case where the cap insulating film CP is not formed, the entire control gate electrode CLG serves as the control gate electrode CG. Accordingly, in the case where the cap insulating film CP is not formed, the "control gate CLG" can be replaced with the "control gate electrode CG" in the following description.

The control gate CLG and the memory gate electrode MG are adjacent to each other with the insulating film MZ being interposed therebetween. The memory gate electrode MG is formed in a sidewall spacer shape over a side surface SM3 of the control gate CLG via the insulating film MZ. The insulating film MZ extends over two regions which are the region between the memory gate electrode MG and the semiconductor substrate SB (p-type well PW) and between the memory gate electrode MG and the control gate CLG.

The insulating film GF formed between the control gate CLG and the semiconductor substrate SB (p-type well PW), i.e., the insulating film GF under the control gate electrode CG functions as the gate insulating film of the control transistor. The insulating film GF can be formed of, e.g., a silicon dioxide film, a silicon oxynitride film, or the like.

The insulating film MZ extending over the region between the memory gate electrode MG and the semiconductor substrate SB (p-type well PW) and the region between the memory gate electrode MG and the control gate CLG can be regarded as the gate insulating film. The insulating film MZ located between the memory gate electrode MG and the semiconductor substrate SB (p-type well PW) (i.e., the insulating film MZ under the memory gate electrode MG) functions as the gate insulating film of the memory transistor. On the other hand, the insulating film MZ located between the memory gate electrode MG and the control gate CLG functions as an insulating film for providing insulation (electrical isolation) between the memory gate electrode MG and the control gate electrode CG.

The insulating film MZ is a multi-layer insulating film and made of a multi-layer film including an insulating film MZ1, an insulating film MZ2 formed over the insulating film MZ1, and an insulating film MZ3 formed over the insulating film MZ2. Here, the insulating film MZ1 is made of a silicon dioxide film (oxide film), the insulating film MZ2 is made of a silicon nitride film (nitride film), and the insulating film MZ3 is made of a silicon oxynitride film (oxynitride film).

In the insulating film MZ made of the multi-layer film including the insulating films MZ1, MZ2, and MZ3, the insulating film MZ1 can be regarded as a bottom insulating film formed under the insulating film MZ2 serving as a charge storage layer. The insulating film MZ3 can be regarded as a top insulating film formed over the insulating film MZ2 serving as the charge storage layer. Accordingly, the insulating film MZ has a structure in which, between the insulating film MZ1 serving as the bottom insulating film and the insulating film MZ3 serving as the top insulating film, the insulating film MZ2 is interposed.

In the insulating film MZ, the insulating film MZ2 is an insulating film having a charge storage function. That is, in the insulating film MZ, the insulating film MZ2 is an insulating film for storing charges and can function as the charge storage layer (charge storage portion). That is, the insulating film MZ2 is a trapping insulating film. Here, the trapping insulating film refers to an insulating film capable of storing charges. Thus, as the insulating film (charge storage layer) having a trap level, the insulating film MZ2 is used. Accordingly, the insulating film MZ can also be regarded as an insulating film having an internal charge storage portion (which is the insulating film MZ2 herein).

In the insulating film MZ, each of the insulating films MZ3 and MZ1 located over and under the insulating film MZ2 as the trapping insulating film can function as a charge block layer or charge confinement layer for confining charges to the trapping insulating film. By using a structure in which the insulating film MZ2 as the trapping insulating film is interposed between the insulating films MZ1 and MZ3 each functioning as the charge block layer (or charge confinement layer), charges can be stored in the insulating film MZ2.

The insulating film MZ functions as the gate insulating film of the memory transistor and has a charge retaining (charge storing) function. Accordingly, the insulating film MZ has a multi-layer structure including at least three layers so as to be able to function as the gate insulating film of the memory transistor which has the charge retaining function. The inner layer (which is the insulating film MZ2 herein) functioning as the charge storage portion has a potential barrier height lower than the potential barrier height of each of the outer layers (which are the insulating films MZ1 and MZ3) each functioning as the charge block layer. This can be achieved by forming the insulating film MZ1 of a silicon dioxide film, forming the insulating film MZ2 of a silicon nitride film, and forming the insulating film MZ3 of a silicon oxynitride film.

Each of the insulating films MZ3 and MZ1 needs to have a band gap larger than the band gap of the charge storage layer (which is the insulating film MZ2 herein) between the insulating films MZ3 and MZ1. By providing each of the insulating films MZ3 and MZ1 with a band gap larger than that of the insulating film MZ2, each of the insulating films MZ3 and MZ1 between which the insulating film MZ2 as the charge storage layer is interposed is allowed to function as the charge block layer (or charge confinement layer). Since each of a silicon dioxide film and a silicon oxynitride film has a band gap larger than the band gap of a silicon nitride film, it is possible to use the silicon nitride film as the insulating film MZ2, use the silicon dioxide film as the insulating film MZ1, and use the silicon oxynitride film as the insulating film MZ3.

The control gate electrode CG is made of a conductive film which is, e.g., a silicon film such as an n-type polysilicon film (doped polysilicon film). Specifically, the control gate electrode CG is made of a patterned silicon film. In the control gate CLG, the control gate electrode CG functions as a gate electrode and the cap insulating film CP made of an insulator does not function as the gate electrode.

The memory gate electrode MG is made of a silicon film such as, e.g., a polysilicon film. When an erase operation is performed by injecting holes (positive holes) from the memory gate electrode MG into the insulating film MZ2, as the silicon film forming the memory gate electrode MG, a doped polysilicon film into which a p-type impurity has been introduced or a non-doped (undoped) polysilicon film into which no impurity has intentionally been introduced is preferred. The memory gate electrode MG is formed in a sidewall spacer shape over one side surface SM3 of the control gate CLG via the insulating film MZ.

The memory gate electrode MG has a lower surface KM1 facing the semiconductor substrate SB, a side surface (side wall) SM1 adjacent to the control gate CLG via the insulating film MZ, and a side surface (side wall) SM2 opposite to the side surface SM1. The control gate CLG has a lower surface KM2 facing the semiconductor substrate SB, the side surface (side wall) adjacent to the memory gate electrode MG via the insulating film MZ, and a side surface (side wall) SM4 opposite to the side surface SM3.

Between the lower surface KM2 of the control gate CLG and the semiconductor substrate SB (p-type well PW), the insulating film GF is interposed. Between the lower surface KM1 of the memory gate electrode MG and the semiconductor substrate SB (p-type well PW) and between the side surface SM1 of the memory gate electrode MG and the side surface MS3 of the control gate CLG, the insulating film MZ is interposed.

In Embodiment 1, it is not that the insulating film MZ having the multi-layer structure including the insulating films MZ1, MZ2, and MZ3 is formed over the entire region between the lower surface KM1 of the memory gate electrode MG and the semiconductor substrate SB.

Specifically, between the lower surface KM1 of the memory gate electrode MG and the semiconductor substrate SB, an end portion T2a of the insulating film MZ2 and an end portion T3a of the insulating film MZ3 are not aligned with the side surface SM2 of the memory gate electrode MG but are retracted from the side surface SM2 of the memory gate electrode MG toward the side surface SM1. That is, between the lower surface KM1 of the memory gate electrode MG and the semiconductor substrate SB, the end portion (end surface) T2a of the insulating film MZ2 and the end portion (end surface) T3a of the insulating film MZ3 are located closer to the side surface SM1 of the memory gate electrode MG than the side surface SM2 thereof. In other words, between the lower surface KM1 of the memory gate electrode MG and the semiconductor substrate SB, the end portion T2a of the insulating film MZ2 and the end portion T3a of the insulating film MZ3 are located closer to the side surface SM1 than an end portion T6 of the lower surface KM1 of the memory gate electrode MG which is closer to the side surface SM2. In short, between the lower surface KM1 of the memory gate electrode MG and the semiconductor substrate SB, in a region closer to the side surface SM2 of the memory gate electrode MG, the insulating films MZ2 and MZ3 are not formed.

Note that the end portion T6 of the lower surface KM1 of the memory gate electrode MG is the end portion of the lower surface KM1 of the memory gate electrode MG which is closer to the side surface SM2 and also corresponds to the corner portion formed by the lower surface KM1 and the side surface SM2 of the memory gate electrode MG.

Between the lower surface KM1 of the memory gate electrode MG and the semiconductor substrate SB, the position of the end portion T2a of the insulating film MZ2 substantially corresponds to (is substantially aligned with) the position of the end portion T3a of the insulating film MZ3. Also, between the lower surface KM1 of the memory gate electrode MG and the semiconductor substrate SB, the position of an end portion (end surface) T1a of the insulating film MZ1 substantially corresponds to (is substantially aligned with) the end portion T6 of the lower surface KM1 of the memory gate electrode MG which is closer to the side surface SM2.

Between the lower surface KM1 of the memory gate electrode MG and the semiconductor substrate SB, the region where the insulating films MZ2 and MZ3 are not formed (placed) is not a void, but a silicon dioxide film OX1 is embedded in the region. Specifically, in the region surrounded by the lower surface KM1 of the memory gate electrode MG, the end portions T2a and T3a of the insulating films MZ2 and MZ3, and the upper surface of the insulating film MZ1, the silicon dioxide film OX1 is embedded. Thus, in the region between the lower surface KM1 of the memory gate electrode MG and the semiconductor substrate SB where the insulating film MZ is not formed (placed), the silicon dioxide film OX1 is embedded.

Thus, between the lower surface KM1 of the memory gate electrode MG and the semiconductor substrate SB, the insulating film MZ and the silicon dioxide film OX1 are interposed. The silicon dioxide film OX1 is adjacent to the end portions T2a and T3a of the insulating films MZ2 and MZ3. This allows a combination of the insulating film MZ and the silicon dioxide film OX1 between the memory gate electrode MG and the semiconductor substrate SB (p-type well PW) to function as the gate insulating film of the memory transistor.

Note that the respective end portions T1a, T2a, and T3a of the insulating films MZ1, MZ2, and MZ3 are located closer to the side surface SM2 than the corner portion formed by the lower surface KM1 and the side surface SM1 of the memory gate electrode MG. Accordingly, in a part of the space between the lower surface KM1 of the memory gate electrode MG and the semiconductor substrate SB, the insulating films MZ1, MZ2, and MZ3 are present and, in the vicinity of the corner portion formed by the lower surface KM1 and the side surface SM1 of the memory gate electrode MG, the insulating films MZ1, MZ2, and MZ3 are present.

Also, in Embodiment 1, it is not that the insulating film MZ having the multi-layer structure including the insulating films MZ1, MZ2, and MZ3 is formed over the entire region between the side surface SM1 of the memory gate electrode MG and the side surface SM3 of the control gate CLG.

Specifically, between the side surface SM1 of the memory gate electrode MG and the side surface SM3 of the control gate CLG, an end portion T2b of the insulating film MZ2 and an end portion T3b of the insulating film MZ3 are not aligned with the upper surface of the memory gate electrode MG and are downwardly recessed from the upper surface of the memory gate electrode MG. Note that a direction toward the lower surface of the semiconductor substrate SB is a downward direction. That is, between the side surface SM1 of the memory gate electrode MG and the side surface SM3 of the control gate CLG, the end portion (end surface) T2b of the insulating film MZ2 and the end portion (end surface) T3b of the insulating film MZ3 are located below the upper surface of the memory gate electrode MG. In other words, between the side surface SM1 of the memory gate electrode MG and the side surface SM3 of the control gate CLG, the end portion T2b of the insulating film MZ2 and the end portion T3b of the insulating film MZ3 are located below an upper end portion T7 of the side surface SM1 of the memory gate electrode MG. That is, between the side surface SM1 of the memory gate electrode MG and the side surface SM3 of the control gate CLG, in a region closer to the upper end portion T7, the insulating films MZ2 and MZ3 are not formed.

Between the side surface SM1 of the memory gate electrode MG and the side surface SM3 of the control gate CLG, the position of the end portion T2b of the insulating film MZ2 substantially corresponds to (is substantially aligned with) the position of the end portion T3b of the insulating film MZ3. Also, between the side surface SM1 of the memory gate electrode MG and the side surface SM3 of the control gate CLG, the position of the end portion (end surface) T1b of the insulating film MZ1 substantially corresponds to (is substantially aligned with) the upper end portion T7 of the side surface SM1 of the memory gate electrode MG.

Here, the end portions T1a and T1b of the insulating film MZ1 are the end portions (end surfaces) located opposite to each other in the insulating film MZ1. Also, the end portions T2a and T2b of the insulating film MZ2 are the end portions (end surfaces) located opposite to each other in the insulating film MZ2. Also, the end portions T3a and T3b of the insulating film MZ3 are the end portions (end surfaces) located opposite to each other in the insulating film MZ3.

Between the side surface SM1 of the memory gate electrode MG and the side surface SM3 of the control gate CLG, the region where the insulating films MZ2 and MZ3 are not formed (placed) is not a void, but a silicon dioxide film OX2 is embedded in the region. Specifically, in the region surrounded by the side surface SM1 of the memory gate electrode MG, the end portions T2b and T3b of the insulating films MZ2 and MZ3, and the side surface SM3 of the control gate CLG, the silicon dioxide film OX2 is embedded. Thus, in the region between the side surface SM1 of the memory gate electrode MG and the side surface SM3 of the control gate CLG where the insulating film MZ is not formed (placed), the silicon dioxide film OX2 is embedded.

Thus, between the side surface SM1 of the memory gate electrode MG and the side surface SM3 of the control gate CLG, the insulating film MZ and the silicon dioxide film OX2 are interposed. The silicon dioxide film OX2 is adjacent to the end portions T2b and T3b of the insulating films MZ2 and MZ3.

Each of the semiconductor regions MS and MD is the source or drain semiconductor region. That is, the semiconductor region MS functions as one of the source and drain regions and the semiconductor region MD functions as the other of the source and drain regions. Here, the semiconductor region MS functions as the source region of the memory cell MC and the semiconductor region MD functions as the drain region of the memory cell. Note that the source and drain regions mentioned herein correspond to source and drain regions during a read operation to the memory cell MC.

Each of the semiconductor regions MS and MD is made of a semiconductor region into which an n-type impurity has been introduced and has an LDD (lightly doped drain) structure. That is, the semiconductor region MS has an n$^-$-type semiconductor region EX1 (extension region) and an n$^+$-type semiconductor region SD1 each having an impurity concentration higher than that of the n$^-$-type semiconductor region EX1. Also, the semiconductor region MD has an n$^-$-type semiconductor region EX2 (extension region) and an n$^+$-type semiconductor region SD2 each having an impurity concentration higher than that of the n$^-$-type semiconductor region EX2. The n$^+$-type semiconductor region SD1 has a junction depth deeper than that of the n$^-$-type semiconductor region EX1 and an impurity concentration higher than that thereof. The n$^+$-type semiconductor region SD2 has a junction depth deeper than that of the n$^-$-type semiconductor region EX2 and an impurity concentration higher than that thereof.

The semiconductor region MS is formed at a position in the semiconductor substrate SB which is adjacent to the memory gate electrode MG in a gate length direction (gate length direction of the memory gate electrode MG). Also, the semiconductor region MD is formed at a position in the semiconductor substrate SB which is adjacent to the control gate CLG in a gate length direction (gate length direction of the control gate electrode CG).

Over the respective side surfaces of the memory gate electrode MG and the control gate CLG which are not adjacent to each other, sidewall spacers (sidewalls or sidewall insulating films) SW each made of an insulating film are formed. That is, over the side surface SM2 of the memory gate electrode MG and over the side surface SM4 of the control gate CLG, the sidewall spacers SW are formed.

The n$^-$-type semiconductor region EX1 is formed self-alignedly with the side surface SM2 of the memory gate electrode MG. The n$^+$-type semiconductor region SD1 is formed self-alignedly with the side surface (side surface opposite to the side surface in contact with the memory gate electrode MG) of the sidewall spacer SW over the side surface SM2 of the memory gate electrode MG. Accordingly, the lower-concentration n$^-$-type semiconductor region EX1 is formed under the sidewall spacer SW over the side surface SM2 of the memory gate electrode MG, while the higher-concentration n$^+$-type semiconductor region SD1 is formed outside the lower-concentration n$^-$-type semiconductor region EX1. Consequently, the lower-concentration n-type semiconductor region EX1 is formed so as to be adjacent to the channel region of the memory transistor, while the higher-concentration n$^+$-type semiconductor region SD1 is formed so as to be adjacent to the lower-concentration n$^-$-type semiconductor region EX1 and spaced apart from the channel region of the memory transistor by a distance corresponding to the n$^-$-type semiconductor region EX1.

The n$^-$-type semiconductor region EX2 is formed self-alignedly with the side surface SM4 of the control gate CLG. The n$^+$-type semiconductor region SD2 is formed self-alignedly with the side surface (side surface opposite to the side surface in contact with the control gate CLG) of the sidewall spacer SW over the side surface SM4 of the control gate CLG. Accordingly, the lower-concentration n$^-$-type semiconductor region EX2 is formed under the sidewall spacer SW over the side surface SM4 of the control gate CLG, while the higher-concentration n$^+$-type semiconductor region SD2 is formed outside the lower-concentration n$^-$-type semiconductor region EX2. Consequently, the lower-concentration n$^-$-type semiconductor region EX2 is formed so as to be adjacent to the channel region of the control transistor, while the higher-concentration n$^+$-type semiconductor region SD2 is formed so as to be adjacent to the lower-concentration n$^-$-type semiconductor region EX2 and spaced apart from the channel region of the control transistor by a distance corresponding to the n$^-$-type semiconductor region EX2.

In the surface-layer portion of the semiconductor substrate SB (p-type well PW) which is located under the memory gate electrode MG, the channel region of the memory transistor is formed. In the surface-layer portion of the semiconductor substrate SB (p-type well PW) which is located under the control gate electrode CG, the channel region of the control transistor is formed. In the channel formation region of the control transistor, a semiconductor region (p-type semiconductor region or n-type semiconductor region) for adjusting the threshold of the control transistor is formed as necessary. Also, in the channel formation region of the memory transistor, a semiconductor region (p-type semiconductor region or n-type semiconductor region) for adjusting the threshold of the memory transistor is formed as necessary.

In the respective upper portions of the n$^+$-type semiconductor regions SD1 and SD2 and the memory gate electrode MG, metal silicide layers SL have been formed using a salicide (Self Aligned Silicide) technique or the like. Each of the metal silicide layers SL is made of, e.g., a cobalt silicide layer, a nickel silicide layer, a platinum-added nickel silicide layer, or the like. The metal silicide layers SL allow reductions in diffusion resistances and contact resistances.

When the metal silicide layer SL is formed in the upper portion of the memory gate electrode MG, it is also possible to regard a combination of the silicon film included in the memory gate electrode MG and the metal silicide layer SL located thereover as the memory gate electrode MG.

Alternatively, it may also be possible that the metal silicide layers SL are formed in the upper portions of the n$^+$-type semiconductor regions SD1 and SD2, while the metal silicide layer SL is not formed in the upper portion of the memory gate electrode MG.

In the case where the control gate CLG is made of the multi-layer body including the control gate electrode CG and the cap insulating film CP as in Embodiment 1, the upper surface of the control gate electrode CG is covered with the cap insulating film CP except for contact portions (not shown herein) to which the plugs PG are to be coupled. Consequently, no equivalent to the metal silicide layer SL is formed over the control gate electrode CG. In another form, in the case where the cap insulating film CP is not formed, the cap insulating film CP is not formed over the control gate electrode CG. Accordingly, the metal silicide layer SL may also be formed in the upper portion of the control gate electrode CG.

When the metal silicide layers SL are not needed, the formation thereof can also be omitted.

Over the semiconductor substrate SB, the interlayer insulating film IL1 is formed as an insulating film so as to cover the control gate CLG, the memory gate electrode MG, and the sidewall spacers SW. The interlayer insulating film IL1 is formed of a single-layer silicon dioxide film, a multi-layer film including a silicon nitride film and a silicon dioxide film formed over the silicon nitride film to be thicker than the silicon nitride film, or the like. The upper surface of the interlayer insulating film IL1 has been planarized.

In the interlayer insulating film IL1, the contact holes (through holes) CT are formed. In the contact holes CT, the conductive plugs (contact plugs) PG are formed as coupling conductor portions.

The contact holes CT and the plugs PG embedded therein are formed over the n$^+$-type semiconductor regions SD1 and SD2, the control gate CLG, the memory gate electrode MG, and the like. At the bottom portions of the contact holes CT, parts of the main surface of the semiconductor substrate SB, e.g., parts of the n$^+$-type semiconductor regions SD1 and SD2 (metal silicide layers SL over the top surfaces thereof), a part of the contact portion (metal silicide layer SL over the top surface) of the control gate electrode CG, a part of the contact portion (metal silicide layer SL over the top surface) of the memory gate electrode MG, and the like are exposed. Then, to the exposed portions, the plugs PG are coupled. Note that FIG. 1 shows a cross section in which a part of the metal silicide layer SL over the top surface of the n$^+$-type semiconductor region SD2 is exposed at the bottom portion of the contact hole CT to be electrically coupled to the plug PG embedded in the contact hole CT.

Over the interlayer insulating film IL1 in which the plugs PG are embedded, the wires M1 are formed. The wires M1 are, e.g., damascene wires and embedded in wire trenches provided in the insulating film IL2 formed over the interlayer insulating film IL1. The wires M1 are electrically coupled to the source region (semiconductor region MS) of the memory transistor, the drain region (semiconductor regions MD) of the control transistor, the control gate electrode CG, the memory gate electrode MG, and the like via the plugs PG. Note that, in FIG. 1, as an example of the wires M1, the wire M1 electrically coupled to the drain region (semiconductor region MD) of the control transistor via the plug PG is shown.

The wires and the insulating films which are in layers located over the wires M1 are also shown, but the depiction and description thereof is omitted herein. The wires M1 and the wires in the layers located thereover are not limited to damascene wires (embedded wires). The wires M1 and the wires in the layers located thereover can also be formed by patterning a conductor film for wires. For example, tungsten wires, aluminum wires, or the like can also be used.

<About Operation of Semiconductor Device>

Next, a description will be given of an example of operations to the nonvolatile memory cell MC with reference to FIG. 4.

FIG. 4 is a table showing an example of conditions under which voltages are applied to the individual portions of a selected memory cell during "Write", "Erase", and "Read" operations. The table of FIG. 4 shows voltages (Vd, Vcg, Vmg, Vs, and Vb) applied to the individual portions of a memory cell (selected memory cell) as shown in FIGS. 1 and 3. Here, the voltage Vmg is applied to the memory gate electrode MG. The voltage Vs is applied to the semiconductor region MS (source region). The voltage Vcg is applied to the control gate electrode CG. The voltage Vd is applied to the semiconductor region MD (drain region). The base voltage Vb is applied to the p-type well PW. Note that what is shown in the table of FIG. 4 is a preferred example of the conditions for voltage application. The conditions for voltage application are not limited thereto and can variously be changed as necessary. In Embodiment 1, the injection of electrons into the charge storage portion (which is the insulating film MZ2 herein) of the insulating film MZ of the memory transistor is defined as the "Write" operation and the injection of holes (positive holes) into the charge storage portion of the insulating film MZ of the memory transistor is defined as the "Erase" operation.

As a write method, a write method (hot electron injection write method) referred to as a so-called SSI (Source Side Injection) method which performs a write operation by performing hot electron injection using source side injection can be used appropriately.

A write operation using the SSI method is performed by applying, e.g., voltages as shown in the "Write" row in FIG. 4 to the individual portions of the selected memory cell to which the write operation is to be performed and injecting electrons into the charge storage layer (which is the insulating film MZ2 herein) in the insulating film MZ of the selected memory cell. At this time, hot electrons are generated in the channel region (between the source and drain regions) under the space between the two gate electrodes (memory gate electrode MG and control gate electrode CG) and injected into the charge storage layer (which is the insulating film MZ2 herein) in the insulating film MZ under the memory gate electrode MG. Thus, in the SSI method, electrons are injected into the portion of the insulating film MZ which is closer to the control gate electrode CG. The injected hot electrons (electrons) are trapped by the trap level in the charge storage layer (which is the insulating film MZ2 herein) in the insulating film MZ, resulting in an increase in the threshold of the memory transistor. That is, the memory transistor is brought into a written state.

As an erase method, an erase method (tunneling erase method) referred to as a so-called FN (Fowler Nordheim) method which performs an erase operation using FN tunneling can be used appropriately.

An erase operation using the FN method is performed by applying, e.g., voltages (of which Vmg is a positive voltage and Vd, Vcg, Vs, and Vb are zero volts) as shown in the "Erase" row in FIG. 4 to the individual portions of the selected memory cell to which the erase operation is to be performed and causing tunneling of holes (positive holes) from the memory gate electrode MG in the selected memory cell and injection thereof into the charge storage layer (which is the insulating film MZ2 herein) in the insulating film MZ. At this time, the holes from the memory gate electrode MG tunnel through the insulating film MZ3 by the FN tunneling (FN tunnel effect) to be injected into the insulating film MZ and trapped by the trap level in the charge storage layer (which is the insulating film MZ2 herein) in the insulating film MZ, resulting in a reduction in the threshold voltage of the memory transistor (an erased state is achieved).

During a read operation, e.g., voltages as shown in the "Read" row in the table of FIG. 4 are applied to the individual portions of the selected memory cell to which the read operation is to be performed. By setting the voltage Vmg to be applied to the memory gate electrode MG during the read operation to a value between the threshold voltage of the memory transistor in the written state and the threshold voltage thereof in the erased state, the written state or the erased state can be determined.

There is also an erase operation (hot hole injection erase method) referred to as a so-called BTBT (Band-To-Band Tunneling) method which performs an erase operation by hot hole injection using a BTBT phenomenon. An erase operation using the BTBT method is performed by injecting holes (positive holes) generated by the BTBT (Band-To-Band Tunneling) from the semiconductor substrate (SB) into the charge storage layer (which is the insulating film MZ2 herein) in the insulating film MZ.

However, in Embodiment 1, not the BTBT method (BTBT erase method), but the FN method (tunneling erase method) is used preferably. The power consumed (power consumption) during the erase operation is smaller in the FN method (tunneling erase method) than in the BTBT method (BTBT erase method). In Embodiment 1, by using the FN method (tunneling erase method) as the erase method, i.e., by injecting holes from the memory gate electrode MG into the insulating film MZ2 of the insulating film MZ and thus performing an erase operation to the selected memory cell, the current consumed (power consumption) during the erase operation can be reduced.

<About Manufacturing Process of Semiconductor Device>

Next, a description will be given of a method of manufacturing the semiconductor device in Embodiment 1.

Figure 5:
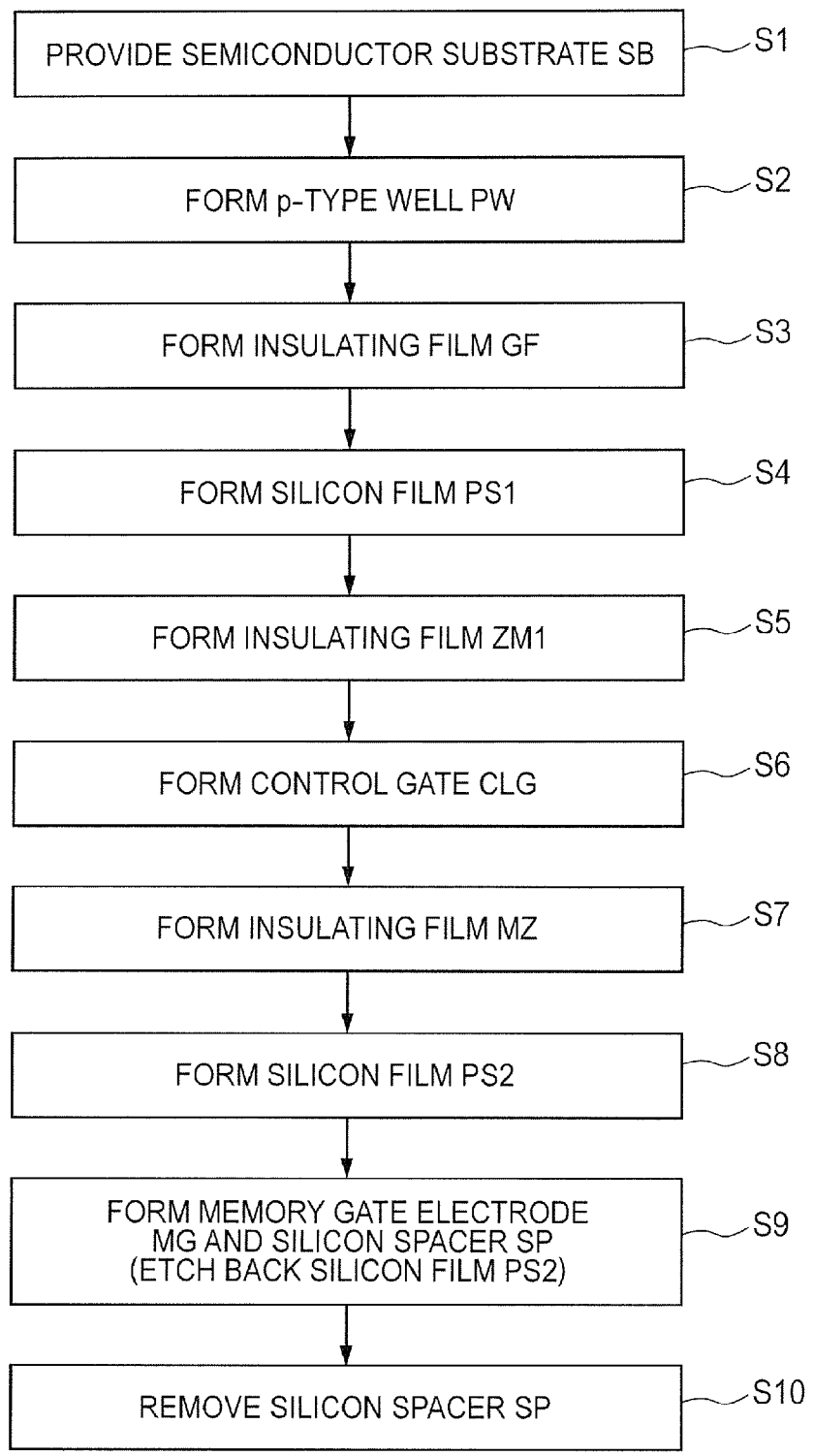
FIG. 5 is a process flow chart showing a part of the manufacturing process of the semiconductor device as the embodiment.
Figure 6:
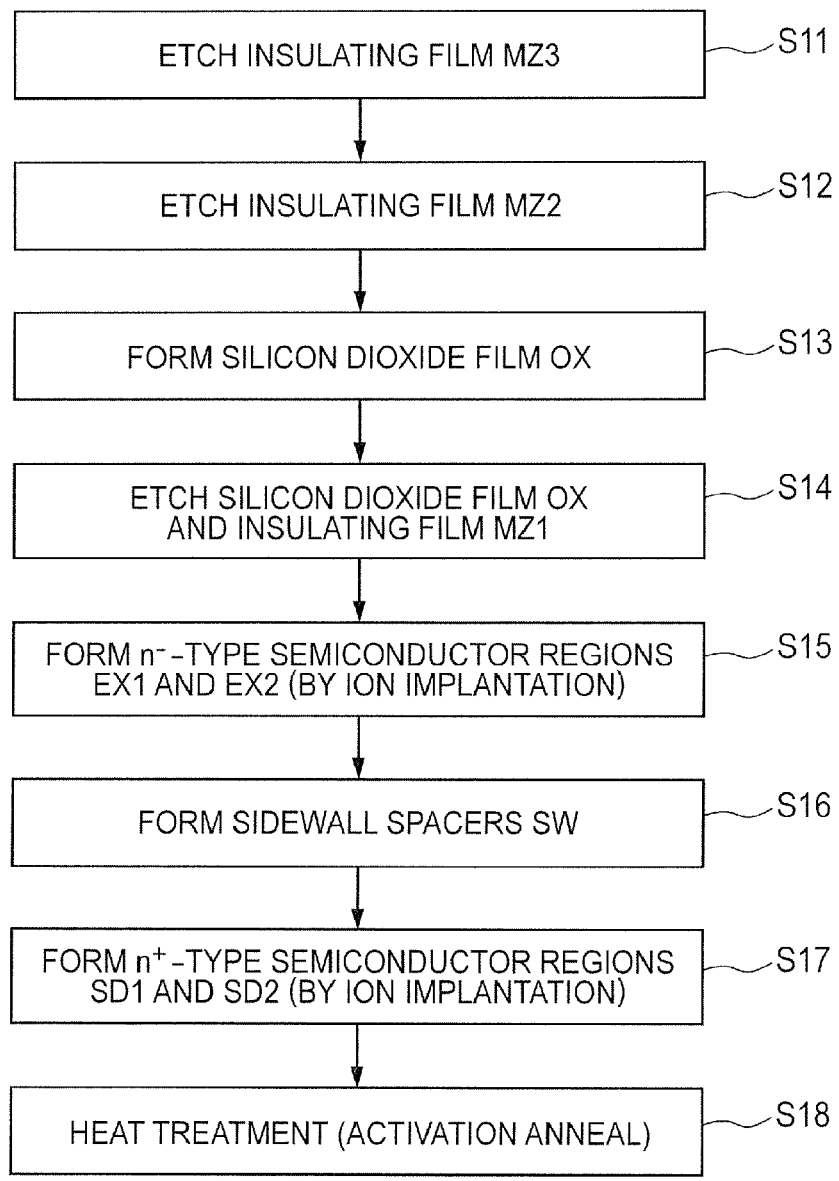
FIG. 6 is a process flow chart showing a part of the manufacturing process of the semiconductor device as the embodiment.

FIGS. 5 and 6 are process flow charts each showing a part of the manufacturing process of the semiconductor device in Embodiment 1. FIGS. 7 to 22 are main-portion cross-sectional views of the semiconductor device in Embodiment 1 during the manufacturing process thereof.

Figure 7:
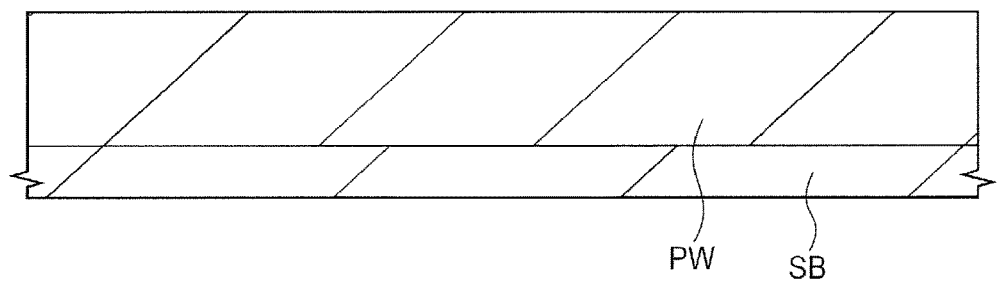
FIG. 7 is a main-portion cross-sectional view of the semiconductor device in the embodiment during the manufacturing process thereof.

As shown in FIG. 7, first, the semiconductor substrate (semiconductor wafer) SB made of, e.g., p-type monocrystalline silicon having a specific resistance of about 1 to 10 Ωcm or the like is provided (prepared) (Step S1 in FIG. 5). Then, in the main surface of the semiconductor substrate SB, an isolation region (which is not shown herein) defining (demarcating) the active region is formed. The isolation region can be formed by, e.g., an STI (Shallow Trench Isolation) method or the like.

Next, in the memory cell formation region of the semiconductor substrate SB, the p-type well PW is formed (Step S2 in FIG. 5). The p-type well PW can be formed by an ion implantation method and formed over a predetermined depth from the main surface of the semiconductor substrate SB.

Figure 8:
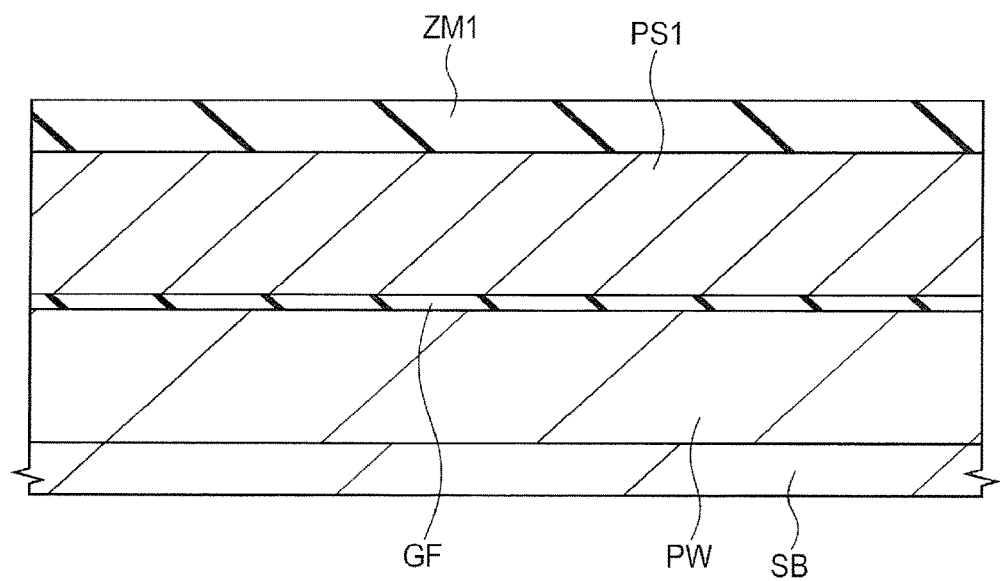
FIG. 8 is a main-portion cross-sectional view of the semiconductor device during the manufacturing process thereof, which is subsequent to FIG. 7.

Next, the top surface of the semiconductor substrate SB (p-type well PW) is cleaned by diluted hydrofluoric acid washing or the like. Then, as shown in FIG. 8, the insulating film GF for the gate insulating film of the control transistor is formed over the main surface of the semiconductor substrate SB (the top surface of the p-type well PW) (Step S3 in FIG. 5).

The insulating film GF is made of a silicon dioxide film or the like and can be formed using thermal oxidation or the like. At this time, as oxidation treatment, ISSG (In Situ Steam Generation) oxidation can also be used. The formed film thickness of the insulating film GF can be adjusted to, e.g., about 2 to 5 nm.

Next, over the entire main surface of the semiconductor substrate SB, i.e., over the insulating film GF, a silicon film PS1 is formed (deposited) as a conductor film for forming the control gate electrode CG (Step S4 in FIG. 5).

The silicon film PS1 is made of a polycrystalline silicon film and can be formed using a CVD (Chemical Vapor Deposition) method or the like. The film thickness (deposited film thickness) of the silicon film PS1 can be adjusted to, e.g., about 50 to 150 nm. It is also possible to deposit an amorphous silicon film as the silicon film PS1 and then change the silicon film PS1 made of the amorphous silicon film to the silicon film PS1 made of the polycrystalline silicon film by subsequent heat treatment. The silicon film PS1 can also be formed as a low-resistance semiconductor film (doped polysilicon film) by the introduction of an impurity during the film deposition, the ion implantation of an impurity after the film deposition, or the like.

Next, over the entire main surface of the semiconductor substrate SB, i.e., over the silicon film PS1, an insulating film ZM1 is formed (deposited) (Step S5 in FIG. 5).

The insulating film ZM1 is for forming the cap insulating film CP. The insulating film ZM1 is made of, e.g., a silicon nitride film or the like and can be formed using a CVD method or the like. The deposited film thickness of the insulating film ZM1 can be adjusted to, e.g., about 30 to 100 nm. By performing Steps S4 and S5, a state is reached in which a multi-layer film including the silicon film PS1 and the insulating film ZM1 over the silicon film PS1 is formed.

Figure 9:
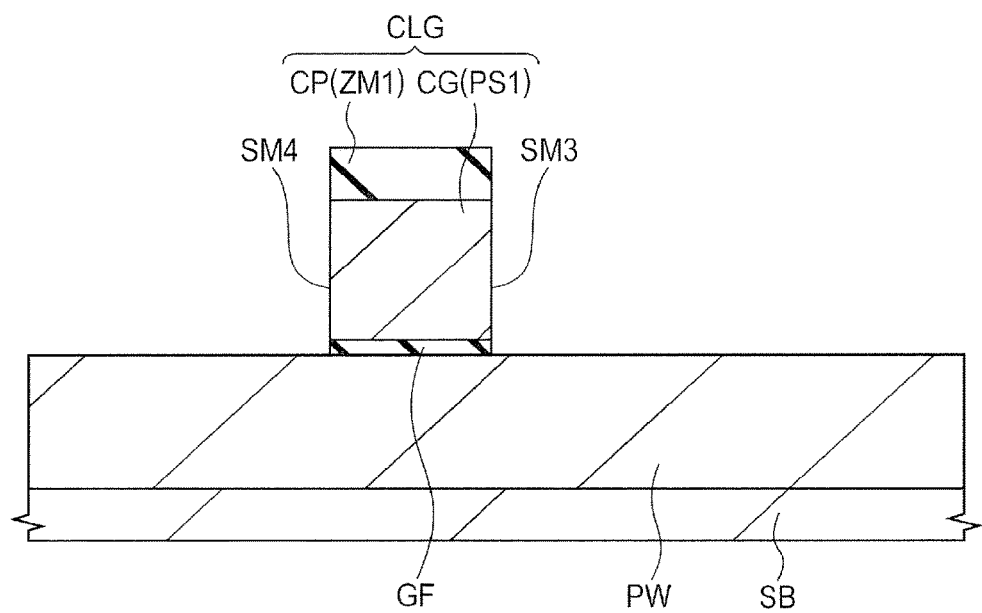
FIG. 9 is a main-portion cross-sectional view of the semiconductor device during the manufacturing process thereof, which is subsequent to FIG. 8.

Next, as shown in FIG. 9, the multi-layer film including the silicon film PS1 and the insulating film ZM1 over the silicon film PS1 is patterned using a photolithographic method and a dry etching method to form the control gate CLG made of the multi-layer body including the control gate electrode CG and the cap insulating film CP over the control gate electrode CG (Step S6 in FIG. 5).

The control gate electrode CG is made of the patterned silicon film PS1. The cap insulating film CP is made of the patterned insulating film ZM1. The control gate CLG includes the control gate electrode CG and the cap insulating film CP over the control gate electrode CG and is formed over the semiconductor substrate SB (p-type well PW) via the insulating film GF. Consequently, the control gate electrode CG is formed over the semiconductor substrate SB (p-type well PW) via the insulating film GF. The control gate electrode CG and the cap insulating film CP have substantially the same two-dimensional shapes in plan view and overlap each other in plan view.

In the region where the memory cell is formed, the insulating film GF except for the portion thereof covered with the control gate CLG, i.e., the insulating film GF except for the portion thereof serving as the gate insulating film may be removed by performing dry etching in Step S6 or performing wet etching after the dry etching.

Thus, by Steps S3, S4, S5, and S6, over the semiconductor substrate SB, the control gate CLG including the control gate electrode CG and the cap insulating film CP over the control gate electrode CG is formed over the semiconductor substrate SB via the insulating film GF.

It is also possible to omit Step S5 (step of forming the insulating film ZM1). In that case, in Step S6, the silicon film PS1 is patterned to form the control gate electrode CG, while no equivalent to the cap insulating film CP is formed.

Figure 10:
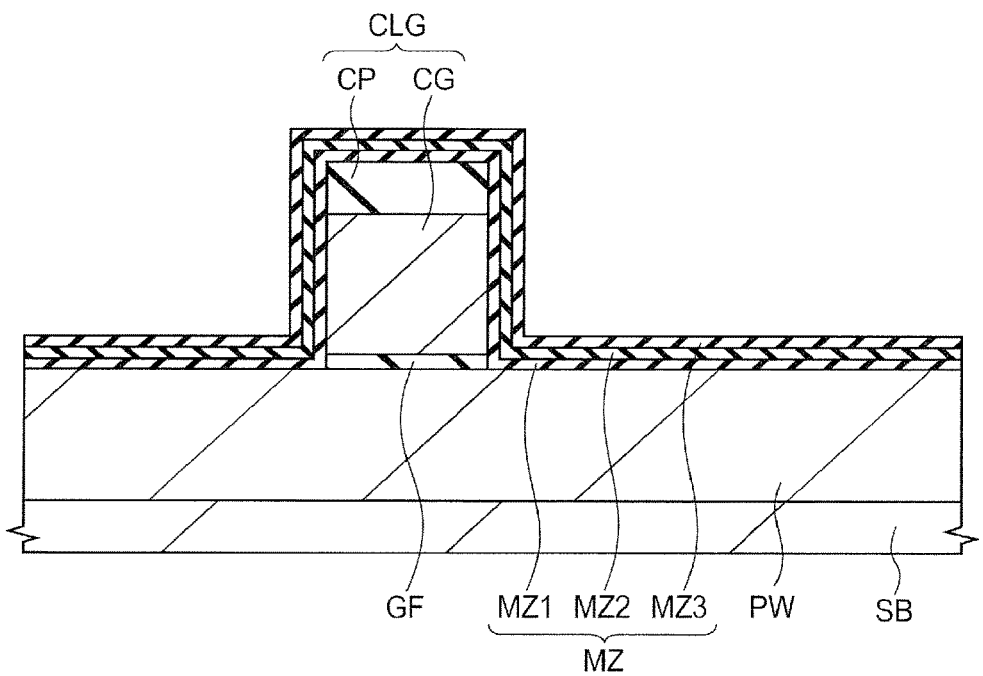
FIG. 10 is a main-portion cross-sectional view of the semiconductor device during the manufacturing process thereof, which is subsequent to FIG. 9.

Next, washing treatment is performed to perform cleaning treatment on the main surface of the semiconductor substrate SB. Then, as shown in FIG. 10, over the entire main surface of the semiconductor substrate SB, i.e., over the main surface (top surface) of the semiconductor substrate SB and over the surfaces (upper and side surfaces) of the control gate CLG, the insulating film MZ is formed (Step S7 in FIG. 5).

The insulating film MZ is for the gate insulating film of the memory transistor and has the internal charge storage layer. The insulating film MZ is made of the multi-layer film (multi-layer insulating film) including the insulating film MZ1, the insulating film MZ2 formed over the insulating film MZ1, and the insulating film MZ3.

Accordingly, the step of forming the insulating film MZ in Step S7 includes the step of forming the insulating film MZ1, the step of forming the insulating film MZ2, and the step of forming the insulating film MZ3. In Step S7, the step of forming the insulating film MZ1 is performed, the step of forming the insulating film MZ2 is performed, and then the step of forming the insulating film MZ3 is performed.

A description will be given of a specific example of the step of forming the insulating film MZ in Step S7. The step of forming the insulating film MZ in Step S7 can specifically be performed as follows.

That is, first, over the top surface of the semiconductor substrate SB, i.e., over the top surface of the p-type well PW1, the insulating film MZ1 is formed.

The insulating film MZ1 is made of the silicon dioxide film and can be formed by oxidation treatment (thermal oxidation treatment). At this time, for the oxidation treatment (thermal oxidation treatment), ISSG oxidation is more preferably used. The film thickness (formed film thickness) of the silicon dioxide film as the insulating film MZ1 can be adjusted to, e.g., about 3 to 6 nm. The silicon dioxide film as the insulating film MZ1 can also be formed by a CVD method.

However, the silicon dioxide film as the insulating film MZ1 is formed more preferably by oxidation treatment (thermal oxidation treatment) than by a CVD method and formed most preferably by ISSG oxidation. This improves the film quality of the formed silicon dioxide film (dense film is provided) and therefore allows a further improvement in the charge retention property of the insulating film MZ.

Then, over the insulating film MZ1, the insulating film MZ2 is formed. The insulating film MZ2 is made of a silicon nitride film and can be formed using a CVD method or the like. As gases for film deposition, e.g., a dichloro silane ($H_2SiCl_2$) gas can be used as a silicon source (silicon source gas) and an ammonia ($NH_3$) gas can be used as a nitrogen source (nitrogen source gas). The formed silicon nitride film (insulating film MZ2) has a large quantity of trap levels therein. The film thickness (formed film thickness) of the silicon nitride film as the insulating film MZ2 can be adjusted to, e.g., about 4 to 10 nm.

Then, over the insulating film MZ2, the insulating film MZ3 is formed. The insulating film MZ3 is made of a silicon oxynitride film and can be formed using a CVD method or the like. As gases for film deposition, e.g., a dichloro silane ($H_2SiCl_2$) gas can be used as a silicon source (silicon source gas), a dinitrogen monoxide ($N_2O$) gas can be used as an oxygen source (oxygen source gas), and an ammonia ($NH_3$) gas can be used as a nitrogen source (nitrogen source gas). The film thickness (formed film thickness) of the silicon oxynitride film can be adjusted to, e.g., about 5 to 15 nm. The refractive index (obtained using a He—Ne laser) of the silicon oxynitride film as the insulating film MZ3 can be adjusted to, e.g., about 1.5 to 1.7.

Thus, Step S7 is performed so that the insulating film MZ is formed over the semiconductor substrate SB so as to cover the control gate CLG.

Figure 11:
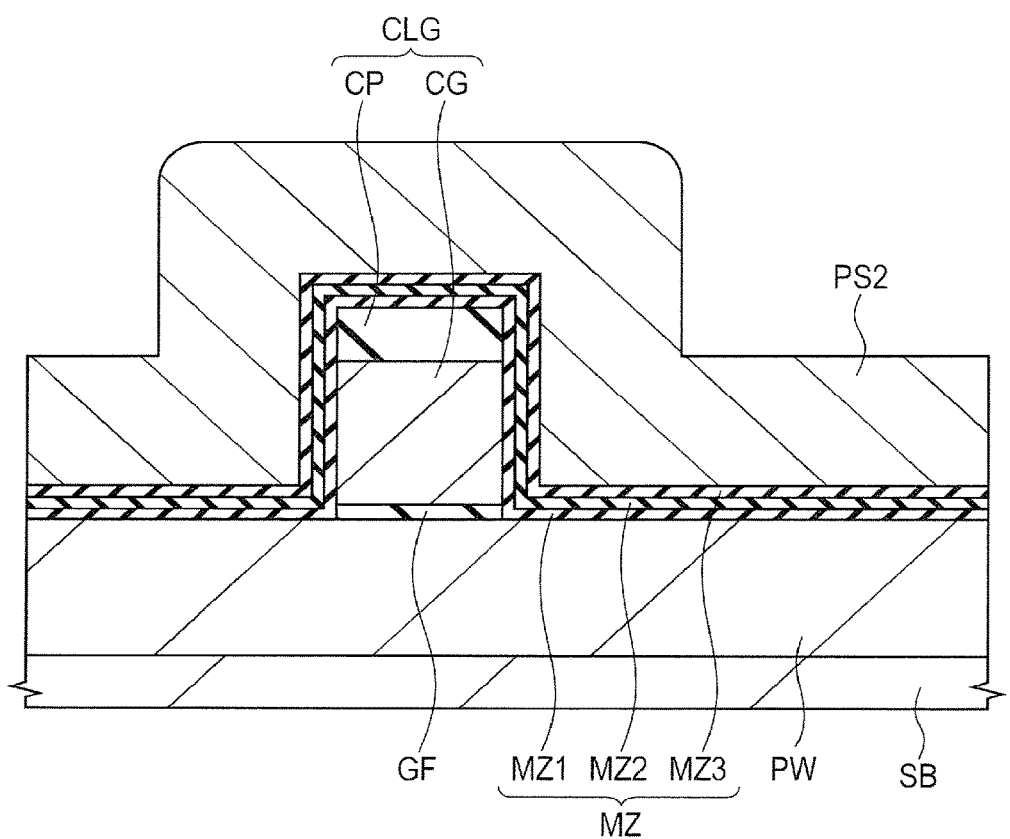
FIG. 11 is a main-portion cross-sectional view of the semiconductor device during the manufacturing process thereof, which is subsequent to FIG. 10.

Next, as shown in FIG. 11, over the entire main surface of the semiconductor substrate SB, i.e., over the insulating film MZ, a silicon film PS2 is formed (deposited) as a conductor film for forming the memory gate electrode MG so as to cover the control gate CLG (Step S8 in FIG. 5).

The silicon film PS2 is made of a polycrystalline silicon film and can be formed using a CVD method or the like. The film thickness (deposited film thickness) of the silicon film PS2 can be adjusted to, e.g., about 30 to 100 nm. It is also possible to deposit an amorphous silicon film as the silicon film PS2 and then change the silicon film PS2 made of the amorphous silicon film to the silicon film PS2 made of the polycrystalline silicon film by subsequent heat treatment. As the silicon film PS2, a doped polysilicon film into which a p-type impurity has been introduced or a non-doped (undoped) polysilicon film into which no impurity has intentionally been introduced is preferred. In the case of introducing a p-type impurity into the silicon film PS2, it is also possible to introduce a p-type impurity into the silicon film PS2 by ion implantation after the deposition of the silicon film PS2 or introduce a p-type impurity into the silicon film PS2 during the deposition of the silicon film PS2.

Next, using an anisotropic etching technique, the silicon film PS2 is etched back (subjected to etching, dry etching, or anisotropic etching) (Step S9 in FIG. 5).

Figure 12:
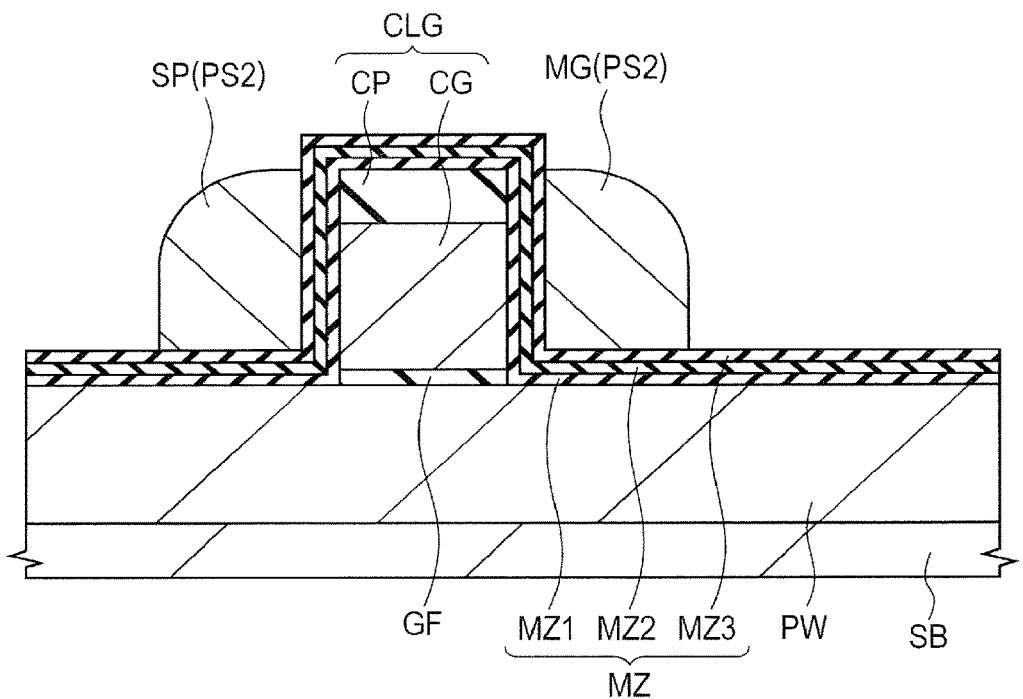
FIG. 12 is a main-portion cross-sectional view of the semiconductor device during the manufacturing process thereof, which is subsequent to FIG. 11.

In the etch-back step in Step S9, the silicon film PS2 is etched back by anisotropic etching over a thickness corresponding to the deposited film thickness of the silicon film PS2 to be left in sidewall spacer shapes over the both side walls of the control gate CLG via the insulating film MZ. Thus, as shown in FIG. 12, the memory gate electrode MG is formed of the silicon film PS2 left in the sidewall spacer shape over the side surface SM3 as one of the both side surfaces SM3 and SM4 of the control gate CLG via the insulating film MZ and the silicon spacer SP is formed of the silicon film PS2 left in the sidewall spacer shape over the other side surface SM4 via the insulating film MZ. The memory gate electrode MG is formed over the insulating film MZ so as to be adjacent to the control gate CLG via the insulating film MZ. When the memory gate electrode MG and the silicon spacer SP are formed by performing the step of etching back the silicon film PS2, the region of the insulating film MZ which is uncovered with the memory gate electrode MG and the silicon spacer SP is exposed.

Figure 13:
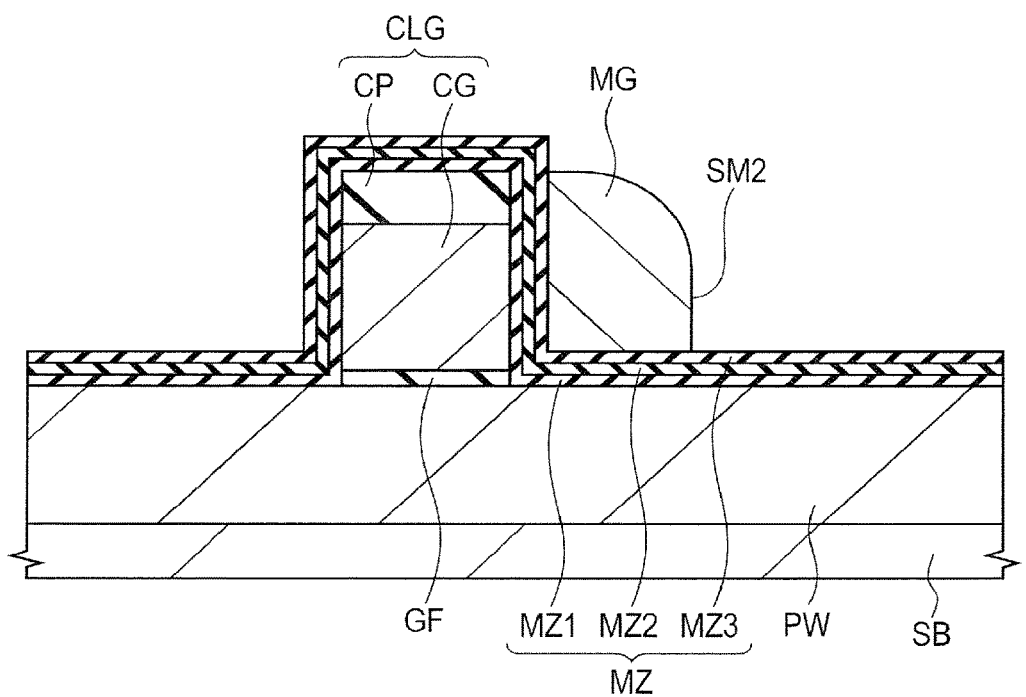
FIG. 13 is a main-portion cross-sectional view of the semiconductor device during the manufacturing process thereof, which is subsequent to FIG. 12.

Next, using a photolithographic technique, a photoresist pattern (not shown) which covers the memory gate electrode MG and exposes the silicon spacer SP is formed over the semiconductor substrate SB. Then, by dry etching using the photoresist pattern as an etching mask, the silicon spacer SP is removed (Step S10 in FIG. 5) and the photoresist pattern is subsequently removed. FIG. 13 shows this stage. By the etching step, as shown in FIG. 13, the silicon spacer SP is removed, while the memory gate electrode MG that has been covered with the photoresist pattern is not etched but remains.

Figure 14:
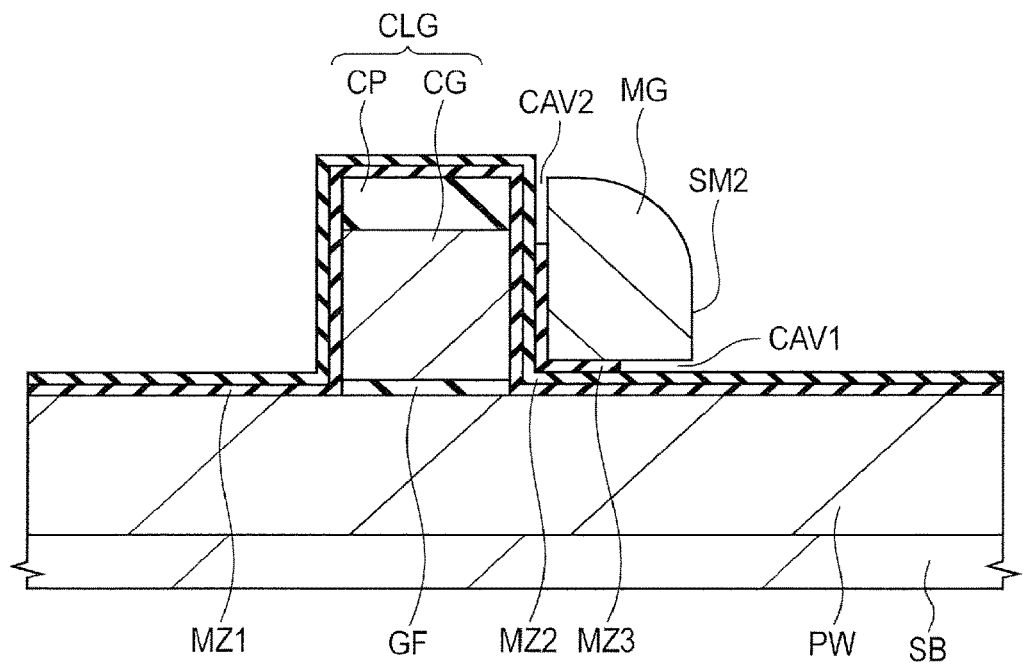
FIG. 14 is a main-portion cross-sectional view of the semiconductor device during the manufacturing process thereof, which is subsequent to FIG. 13.

Next, as shown in FIG. 14, of the insulating film MZ3 of the insulating film MZ, the exposed portion uncovered with the memory gate electrode MG is removed by etching (Step S11 in FIG. 6).

In the etching step in Step S11, even after the exposed portion of the insulating film MZ3 which is uncovered with the memory gate electrode MG is etched and removed, the etching is continued for a predetermined period of time. As a result, the upper portion of the insulating film MZ3 located between the memory gate electrode MG and the control gate CLG is etched and a part of the insulating film MZ3 located between the memory gate electrode MG and the semiconductor substrate SB (p-type well PW) is side-etched. Consequently, in the etching step in Step S11, not only the exposed portion of the insulating film MZ3 which is uncovered with the memory gate electrode MG, but also a part of the insulating film MZ3 located between the lower surface of the memory gate electrode MG and the semiconductor substrate SB (p-type well PW) is removed.

Accordingly, when the etching step in Step S11 is performed, between the lower surface of the memory gate electrode MG and the semiconductor substrate SB (p-type well PW), a state is provided in which the end portion (T3a) of the insulating film MZ3 is inwardly recessed from (closer to the side surface SM1 than) the side surface SM2 of the memory gate electrode MG. This provides a state in which a cavity (space or gap) CAV1 is formed under the memory gate electrode MG. This also provides a state in which, between the memory gate electrode MG and the control gate CLG, the end portion (T3b) of the insulating film MZ3 is downwardly recessed from the upper surface of the memory gate electrode MG. As a result, a state is provided in which a cavity (space or gap) CAV2 is formed between the memory gate electrode MG and the control gate CLG.

That is, immediately under the memory gate electrode MG, the portion resulting from the removal of the insulating film MZ3 becomes the cavity CAV1 and, between the memory gate electrode MG and the control gate CLG, the portion resulting from the removal of the insulating film MZ3 becomes the cavity CAV2. Note that, in the vicinity of the side surface MS2 of the memory gate electrode MG, the cavity CAV1 is open to the outside. Also, in the vicinity of the upper surface of the memory gate electrode MG, the cavity CAV2 is open to the outside. Thus, each of the cavities CAV1 and CAV2 is not a closed space, but an open space. At this stage, the upper surface of the cavity CAV1 is formed of the lower surface of the memory gate electrode MG, the lower surface of the cavity CAV1 is formed of the upper surface of the insulating film MZ2, and the side surface of the cavity CAV1 is formed of the end portion of the insulating film MZ3.

Between the lower surface of the memory gate electrode MG and the semiconductor substrate SB (p-type well PW), the position of the end portion (T3a) of the insulating film MZ3 can be controlled by adjusting the etching time in Step S11 or the like. For example, when the etching time in Step S11 is short, the amount of side etching of the portion of the insulating film MZ3 which is located under the memory gate electrode MG is small. Consequently, the position of the end portion (T3a) of the insulating film MZ3 is closer to the position of the side surface SM2 of the memory gate electrode MG. On the other hand, when the etching time in Step S11 is long, the amount of side etching of the portion of the insulating film MZ3 which is located under the memory gate electrode MG is large. Consequently, the position of the end portion (T3a) of the insulating film MZ3 is further away from the position of the side surface SM2 of the memory gate electrode MG.

In the etching step in Step S11, isotropic etching is performed and, preferably, wet etching is performed. At this time, it is preferable to use an etching solution which can selectively etch the insulating film MZ3. That is, it is preferable to use an etching solution with which the speed of etching the insulating film MZ3 is higher than the speeds of etching the memory gate electrode MG and the insulating film MZ2. In other words, it is preferable to use an etching solution with which the insulating film MZ3 is more likely to be etched and the memory gate electrode MG and the insulating film ZM2 are less likely to be etched than the insulating film MZ3. As the etching solution used in Step S11, e.g., a hydrofluoric acid or the like can be used appropriately.

Figure 15:
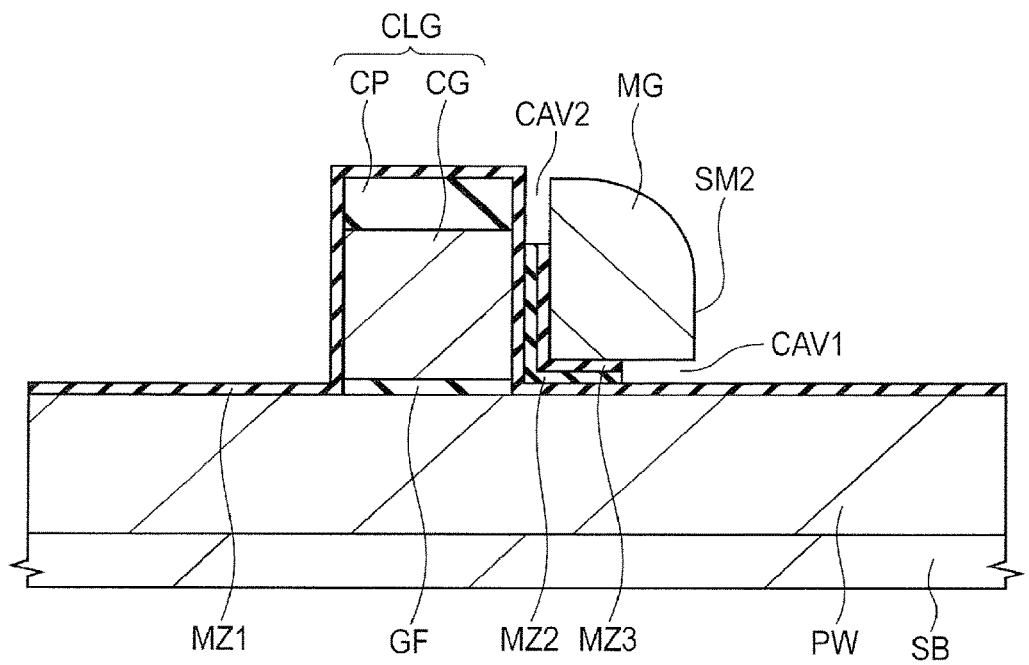
FIG. 15 is a main-portion cross-sectional view of the semiconductor device during the manufacturing process thereof, which is subsequent to FIG. 14.

Next, as shown in FIG. 15, of the insulating film MZ2 of the insulating film MZ, the exposed portion uncovered with the memory gate electrode MG is removed by etching (Step S12 in FIG. 6).

In the etching step in Step S12, not only the exposed portion of the insulating film MZ2 which is uncovered with the memory gate electrode MG is etched and removed, but also the insulating film MZ2 exposed in the cavities CAV1 and CAV2 is etched and removed. That is, in the etching step in Step S12, the exposed portion of the insulating film MZ2 which is uncovered with the insulating film MZ3 is etched and removed.

In the etching step in Step S12, isotropic etching is performed and, preferably, wet etching is performed. At this time, it is preferable to use an etching solution which allows the insulating film MZ2 to be selectively etched. That is, it is preferable to use an etching solution with which the speed of etching the insulating film MZ2 is higher than the speeds of etching the memory gate electrode MG and the insulating films MZ1 and MZ3. In other words, it is preferable to use an etching solution with which the insulating film MZ2 is more likely to be etched and the memory gate electrode MG and the insulating films MZ1 and MZ3 are less likely to be etched than the insulating film MZ2. As an example of the etching solution used in Step S12, a hot phosphoric acid or the like can be used appropriately.

In Step S12, an etching solution (which is an etchant when dry etching is performed) enters even the cavities CAV1 and CAV2. Consequently, the portions of the insulating film MZ2 which are uncovered with the insulating film MZ3 under the memory gate electrode MG and between the memory gate electrode MG and the control gate CLG and exposed in the cavities CAV1 and CAV2 are also etched and removed. In Step S12, unless the etching time is set excessively long, the portion of the insulating film MZ2 which is uncovered with the insulating film MZ3 under the memory gate electrode MG and exposed in the cavity CAV1 is etched and removed, while the portion of the insulating film MZ2 which is covered with the insulating film MZ3 is not etched and the position of the end portion (T2a) of the insulating film MZ2 is substantially the same as the position of the end portion (T3a) of the insulating film MZ3. Accordingly, when the etching step in Step S11 and the etching step in Step S12 are performed, a state is provided in which the respective end portions (T3a and T2a) of the insulating films MZ3 and MZ2 which are located between the memory gate electrode MG and the semiconductor substrate SB (p-type well PW) are located inwardly of (closer to the side surface SM1 than) the side surface SM2 of the memory gate electrode MG.

When Step S12 is performed, from immediately under the memory gate electrode MG, the insulating film MZ2 is removed to expand the cavity CAV1 and the entire region from which the insulating films MZ3 and MZ2 have been removed in Steps S11 and S12 becomes the cavity CAV1. Also, when Step S12 is performed, between the memory gate electrode MG and the control gate CLG, the insulating film MZ2 is removed to expand the cavity CAV2 and the entire region from which the insulating films MZ3 and MZ2 have been removed in Steps S11 and S12 becomes the cavity CAV2. At the stage where Step S12 is ended also, the cavity CAV1 is open to the outside in the vicinity of the side surface SM2 of the memory gate electrode MG, while the cavity CAV2 is open to the outside in the vicinity of the upper surface of the memory gate electrode MG. Thus, each of the cavities CAV1 and CAV2 is an open space, not a closed space. At the stage where Step S12 is ended, the upper surface of the cavity CAV1 is formed of the lower surface of the memory gate electrode MG, the lower surface of the cavity CAV1 is formed of the upper surface of the insulating film MZ1, and the side surfaces of the cavity CAV1 are formed of the end portions (T2a and T3a) of the insulating films MZ2 and MZ3.

Figure 16:
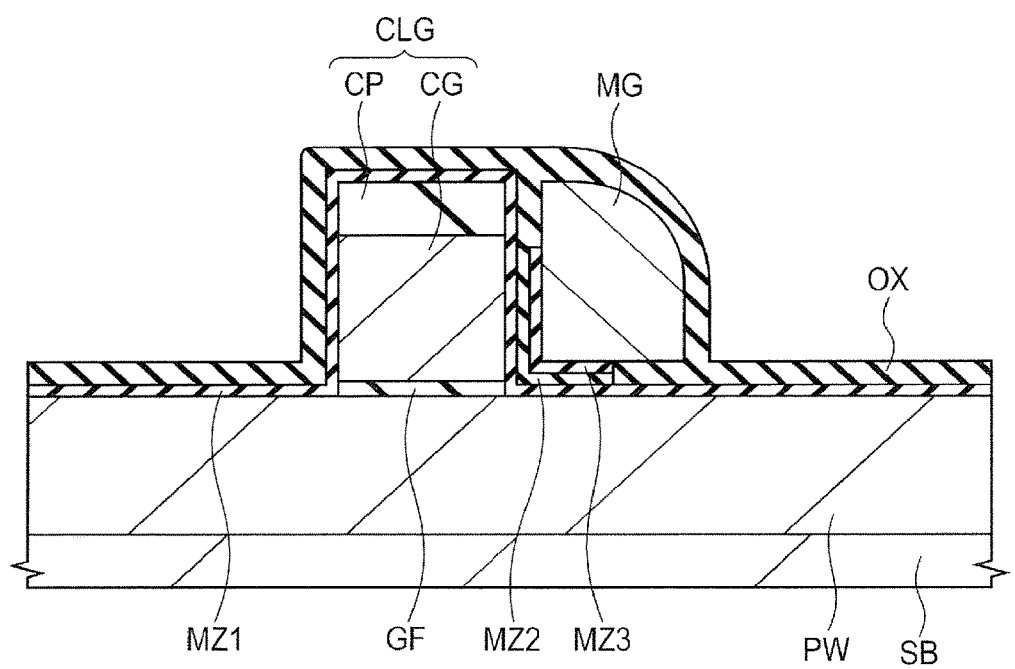
FIG. 16 is a main-portion cross-sectional view of the semiconductor device during the manufacturing process thereof, which is subsequent to FIG. 15.

Next, as shown in FIG. 16, over the main surface (entire main surface) of the semiconductor substrate SB, i.e., over the insulating film MZ1, a silicon dioxide film OX is formed as an insulating film so as to cover the control gate CLG and the memory gate electrode MG (Step S13 in FIG. 6).

Preferably, the silicon dioxide film can be formed by a CVD method. For example, a HTO (High Temperature Oxide) film formed by a CVD method using dichloro silane (SiH$_2$Cl$_2$) and nitrogen monoxide (N$_2$O) or the like as raw material gases can be used appropriately as the silicon dioxide film OX. The HTO film (high temperature oxide film) corresponds herein to a silicon dioxide film deposited at a high temperature of about 700 to 900° C. using a CVD method.

In Step S13, the silicon dioxide film OX is formed so as to be embedded in the cavity CAV1. Accordingly, it is preferable to form the silicon dioxide film OX using a CVD method which has excellent embeddability. From this viewpoint also, the HTO film can be used appropriately as the silicon dioxide film OX. Depending on the height of the cavity CAV1 (corresponding to the total of the thicknesses of the insulating films MZ2 and MZ3), the film thickness (deposited film thickness) of the silicon dioxide film OX can be set to, e.g., about 10 to 30 nm. Note that, to allow the silicon dioxide film OX to be embedded in the cavity CAV1, the film thickness (deposited film thickness) of the silicon dioxide film OX is set in accordance with the height (corresponding to the total of the thicknesses of the insulating films MZ2 and MZ3). When the height of the cavity CAV1 is large, the film thickness (deposited film thickness) of the silicon dioxide film OX is increased accordingly. When the silicon dioxide film OX is formed in Step S13, a state is achieved in which the silicon dioxide film OX is formed over the insulating film MZ1 and the exposed top surface of the memory gate electrode MG, while being embedded in the cavity CAV1 under the memory gate electrode MG and in the cavity CAV2 between the memory gate electrode MG and the control gate CLG.

Figure 17:
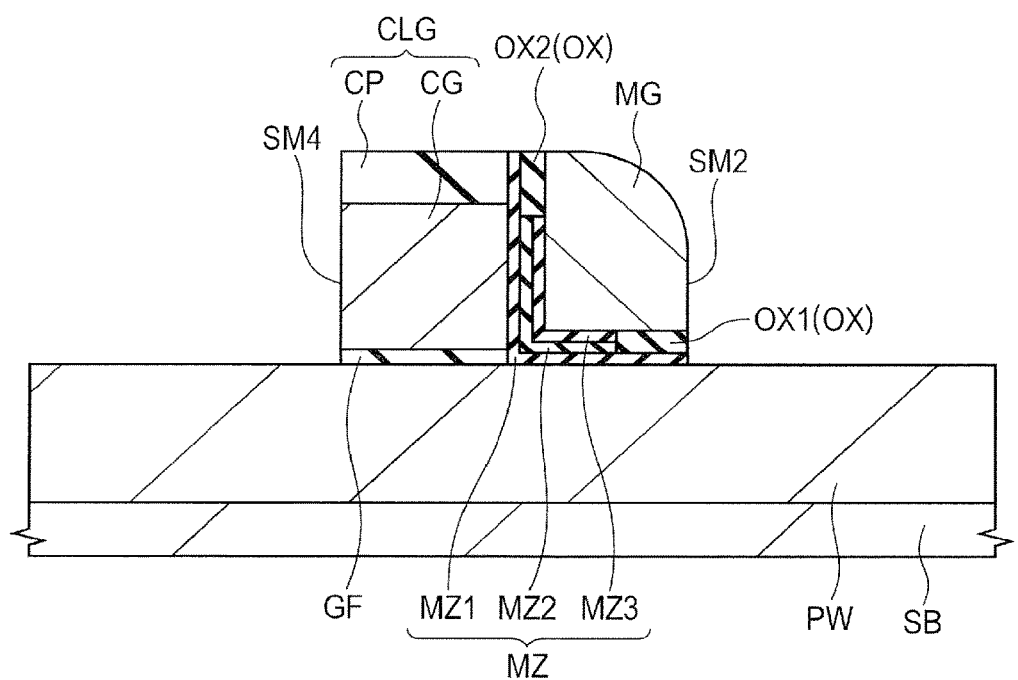
FIG. 17 is a main-portion cross-sectional view of the semiconductor device during the manufacturing process thereof, which is subsequent to FIG. 16.

Next, as shown in FIG. 17, the exposed portions of the silicon dioxide film OX and the insulating film MZ1 which are uncovered with the memory gate electrode MG are removed by etching (Step S14 in FIG. 6).

In the etching step in Step S14, isotropic etching is performed and, preferably, wet etching is performed. At this time, it is preferable to use an etching solution which can selectively etch the silicon dioxide film OX and the insulating film MZ1. That is, it is preferable to use an etching solution with which each of the speed of etching the silicon dioxide film OX and the speed of etching the insulating film MZ1 is higher than the speeds of etching the memory gate electrode MG and the semiconductor substrate SB. In other words, it is preferable to use an etching solution with which the silicon dioxide film OX and the insulating film MZ1 are more likely to be etched and the memory gate electrode MG and the semiconductor substrate SB are less likely to be etched than the silicon dioxide film OX and the insulating film MZ1. As the etching solution used in Step S14, e.g., a hydrofluoric acid or the like can be used appropriately.

Since each of the silicon dioxide film OX and the insulating film MZ1 is made of silicon dioxide, in Step S14, the silicon dioxide film OX and the insulating film MZ1 can be etched by the same etching step.

In the etching step in Step S14, the exposed portion of the silicon dioxide film OX which is uncovered with the memory gate electrode MG is etched and removed and the portion of the insulating film MZ1 which is exposed as a result of the removal of the silicon dioxide film OX is etched and removed. However, the portion of the silicon dioxide film OX which is embedded in the cavity CAV1 is not removed in Step S14 but remains.

That is, in Step S11 described above, the etching time is set such that the portion of the insulating film MZ3 which is located in the memory gate electrode MG and the semiconductor substrate SB is side-etched to a degree. However, in Step S14, the etching time is set such that the portions of the silicon dioxide film OX and the insulating film MZ1 which are located between the memory gate electrode MG and the semiconductor substrate SB are not significantly side-etched. This provides a state where, at the stage where the etching in Step S14 is ended, the silicon dioxide film OX is embedded in the cavity CAV1 and the silicon dioxide film OX embedded in the cavity CAV1 is present under the memory gate electrode MG. Under the silicon dioxide film OX embedded in the cavity CAV1, the insulating film MZ1 is left.

Note that, in Step S14, it is important to leave the portion of the silicon dioxide film OX which is embedded in the cavity CAV1. However, as a consequence, the portion of the silicon dioxide film OX which is embedded in the cavity CAV2 is also not removed but remains.

The remaining silicon dioxide film OX embedded in the cavity CAV1 between the memory gate electrode MG and the semiconductor substrate SB serves as the foregoing silicon dioxide film OX1. The remaining silicon dioxide film OX embedded in the cavity CAV2 between the memory gate electrode MG and the control gate CLG serves as the foregoing silicon dioxide film OX2. That is, the silicon dioxide film OX1 embedded in the cavity CAV1 and the silicon dioxide film OX2 embedded in the cavity CAV2 can be formed of the same film (i.e., the common silicon dioxide film OX).

Thus, when Steps S11, S12, S13, and S14 are performed, the exposed portion of the insulating film MZ which is uncovered with the memory gate electrode MG is removed, while a part of the insulating film MZ interposed between the memory gate electrode MG and the semiconductor substrate SB is removed. Consequently, a structure is obtained in which, in the region between the memory gate electrode MG and the semiconductor substrate SB from which the insulating film MZ has been removed, the silicon dioxide film OX (OX1) is embedded. That is, the structure is obtained in which, under the memory gate electrode MG and between the memory gate electrode MG and the control gate CLG, the insulating film MZ remains while, under the memory gate electrode MG, the end portions (T2a and T3a) of the insulating films MZ2 and MZ3 are located inwardly of (closer to the side surface SM1 than) the side surface SM2 of the memory gate electrode MG and, in the region where the insulating films MZ2 and MZ3 are not present, the silicon dioxide film OX (OX1) is embedded. Between the memory gate electrode MG and the control gate CLG also, parts of the insulating films MZ3 and MZ2 are removed so that a structure is obtained in which the silicon dioxide film OX (OX2) is embedded in the region from which the insulating films MZ3 and MZ2 have been removed.

Figure 18:
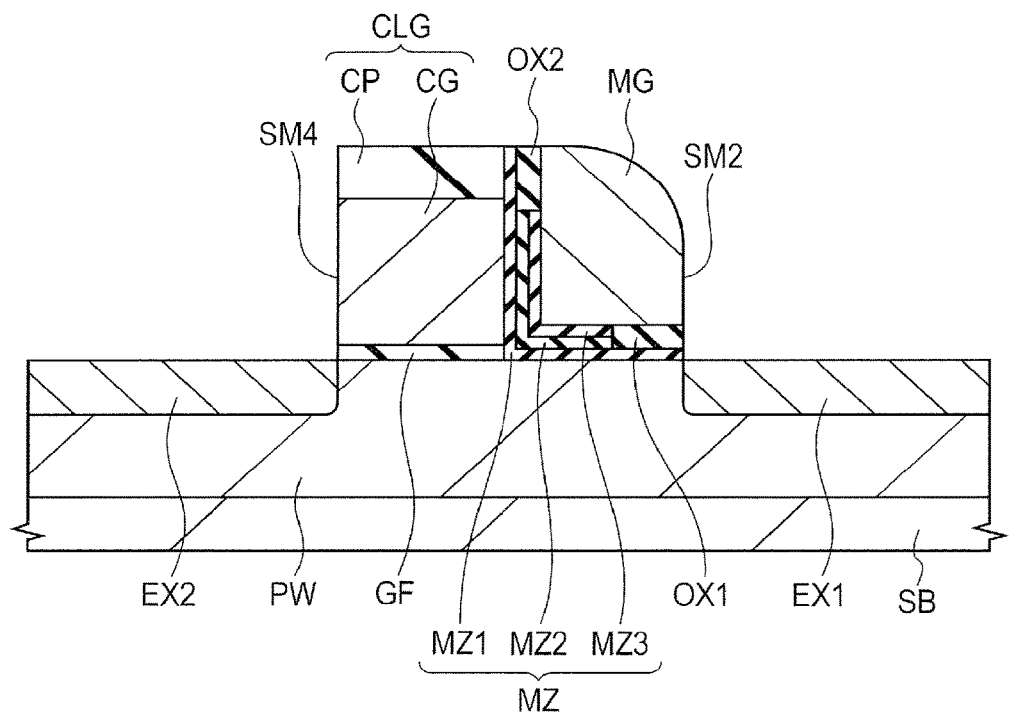
FIG. 18 is a main-portion cross-sectional view of the semiconductor device during the manufacturing process thereof, which is subsequent to FIG. 17.

Next, using an ion implantation method or the like, an n-type impurity is introduced into the semiconductor substrate SB (p-type well PW) using the control gate CLG and the memory gate electrode MG as a mask (ion implantation inhibiting mask) to form the n$^-$-type semiconductor regions EX1 and EX2, as shown in FIG. 18 (Step S15 in FIG. 6).

At this time, the n$^-$-type semiconductor region EX1 is formed by self-alignment with the side surface SM2 of the memory gate electrode MG. On the other hand, the n$^-$-type semiconductor region EX2 is formed by self-alignment with the side surface SM4 of the control gate CLG. The n$^-$-type semiconductor regions EX1 and EX2 can be formed by the same ion implantation step but can also be formed by different ion implantation steps. To suppress a short channel effect, it is also possible to further form a pocket implantation region or a halo implantation region so as to surround the n$^-$-type semiconductor regions EX1 and EX2.

Figure 19:
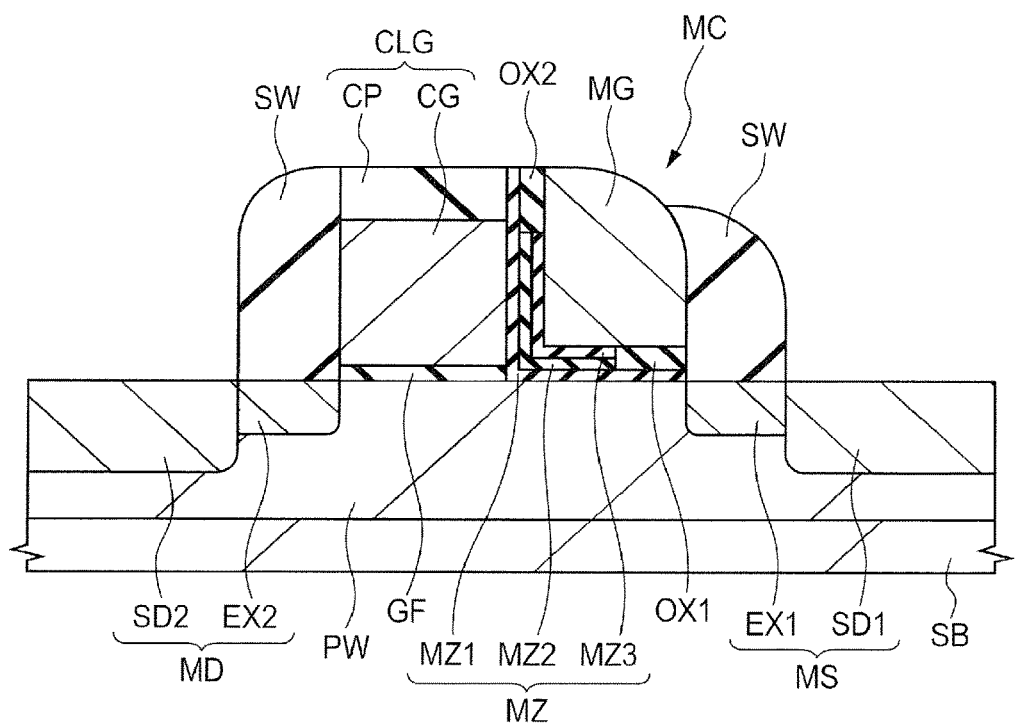
FIG. 19 is a main-portion cross-sectional view of the semiconductor device during the manufacturing process thereof, which is subsequent to FIG. 18.

Next, as shown in FIG. 19, over the side surfaces SM4 and SM2 of the control gate CLG and the memory gate electrode MG, the sidewall spacers SW each made of an insulating film are formed as the side-wall insulating films (Step S16 in FIG. 6).

To form the sidewall spacers SW, first, over the entire main surface of the semiconductor substrate SB, an insulating film for forming the sidewall spacers SW is formed so as to cover the control gate CLG and the memory gate electrode MG. As the insulating film for forming the sidewall spacers SW, a silicon dioxide film is preferred and can be formed using a CVD method or the like. The film thickness of the insulating film for forming the sidewall spacers SW can be adjusted to, e.g., about 40 to 100 nm. Then, by etching back the insulating film for forming the sidewall spacers SW using an anisotropic etching technique, the sidewall spacers SW can be formed. The sidewall spacers SW are formed over the side surface SM4 of the control gate CLG which is opposite to the side surface thereof adjacent to the memory gate electrode MG via the insulating film MZ and over the side surface SM2 of the memory gate electrode MG which is opposite to the side surface thereof adjacent to the control gate CLG via the insulating film MZ.

Next, using an ion implantation method or the like, an n-type impurity is introduced into the semiconductor substrate SB (p-type well PW) using the control gate CLG, the memory gate electrode MG, and the sidewall spacers SW over the respective side surfaces thereof as a mask (ion implantation inhibiting mask) to form the n$^+$-type semiconductor regions SD1 and SD2 (Step S17 in FIG. 6).

At this time, the n$^+$-type semiconductor region SD1 is formed by self-alignment with the sidewall spacer SW over the side surface SM2 of the memory gate electrode MG and the n$^+$-type semiconductor region SD2 is formed by self-alignment with the sidewall spacer SW over the side surface SM4 of the control gate CLG. In this manner, an LDD structure is formed. The n$^+$-type semiconductor regions SD1 and SD2 can be formed by the same ion implantation step, but can also be formed by different ion implantation steps.

Thus, the n$^-$-type semiconductor region EX1 and the n$^+$-type semiconductor region SD1 having an impurity concentration higher than that of the n$^-$-type semiconductor region EX1 form the n-type semiconductor region MS which functions as the source region of the memory transistor, and the n$^-$-type semiconductor region EX2 and the n$^+$-type semiconductor region SD2 having an impurity concentration higher than that of the n-type semiconductor region EX2 form the n-type semiconductor region MD which functions as the drain region of the control transistor.

Next, activation anneal as heat treatment for activating the impurities introduced into the source and drain semiconductor regions (n$^-$-type semiconductor regions EX1 and EX2 and n$^+$-type semiconductor regions SD1 and SD2) and the like is performed (Step S18 in FIG. 6).

In this manner, the memory cell MC of the nonvolatile memory is formed.

Figure 20:
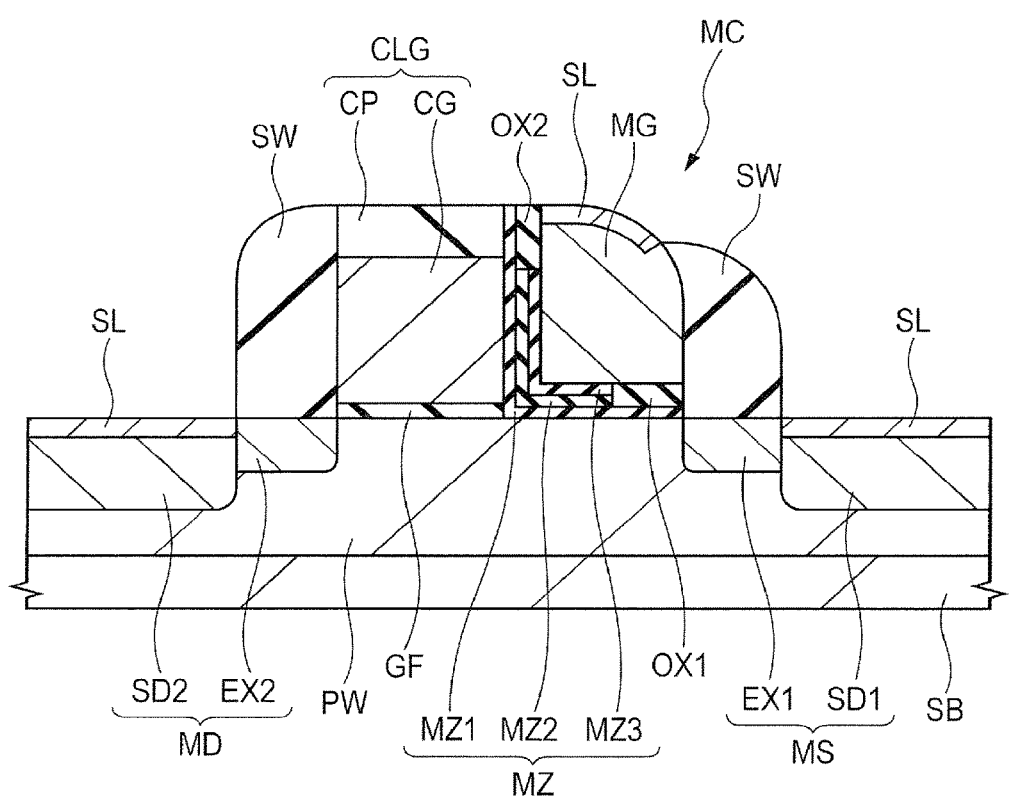
FIG. 20 is a main-portion cross-sectional view of the semiconductor device during the manufacturing process thereof, which is subsequent to FIG. 19.

Next, by performing a salicide process, as shown in FIG. 20, the metal silicide layers SL are formed. The metal silicide layers SL can be formed in the respective upper portions of the n$^+$-type semiconductor regions SD1 and SD2 and the memory gate electrode MG. The metal silicide layers SL can be formed as follows.

Over the entire main surface of the semiconductor substrate SB including the respective upper surfaces of the type semiconductor regions SD1 and SD2 and the memory gate electrode MG, a metal film is formed so as to cover the control gate CLG, the memory gate electrode MG, and the sidewall spacers SW. The metal film is made of, e.g., a cobalt (Co) film, a nickel (Ni), film, a nickel-platinum alloy film, or the like. Then, by performing heat treatment on the semiconductor substrate SB, the respective upper-layer portions of the n$^+$-type semiconductor regions SD1 and SD2 and the memory gate electrode MG are caused to react with the metal film. As a result, as shown in FIG. 20, the metal silicide layers SL each as a silicon-metal reaction layer are formed in the respective upper portions of the n$^+$-type semiconductor regions SD1 and SD2 and the memory gate electrode MG. Then, the unreacted metal film is removed. FIG. 20 shows a cross-sectional view at this stage. After the unreacted metal film is removed, heat treatment can further be performed.

Figure 21:
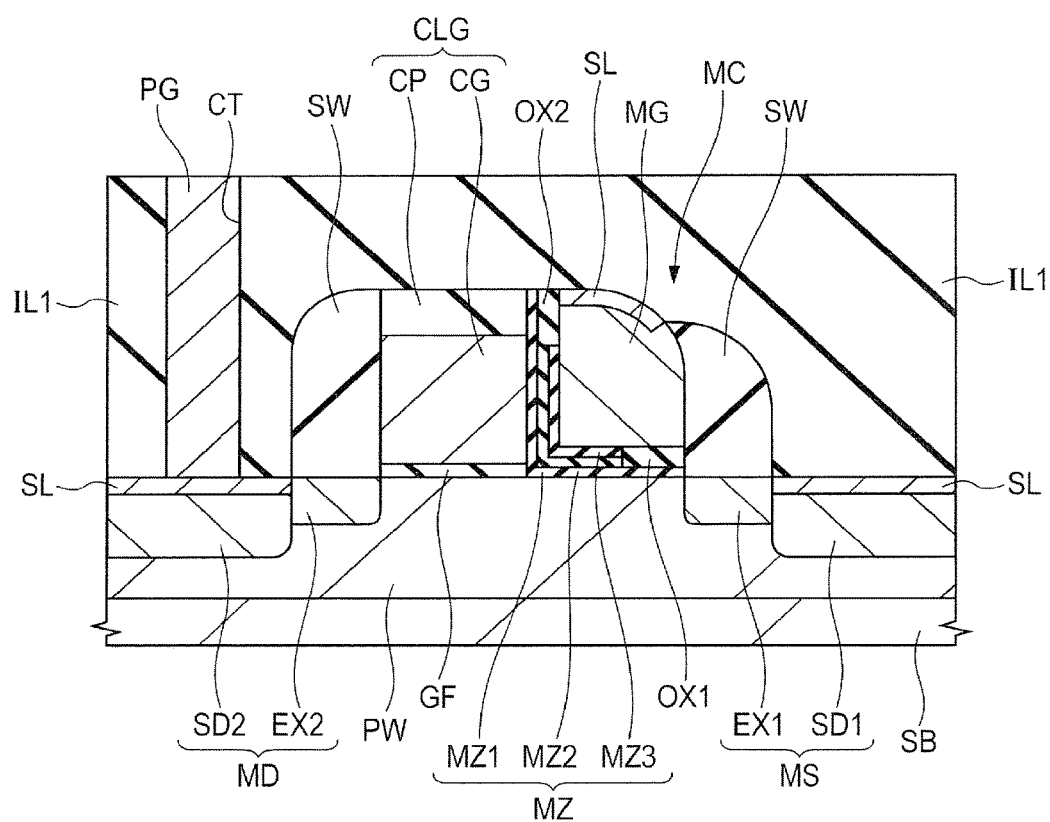
FIG. 21 is a main-portion cross-sectional view of the semiconductor device during the manufacturing process thereof, which is subsequent to FIG. 20.

Next, as shown in FIG. 21, over the entire main surface of the semiconductor substrate SB, the interlayer insulating film IL1 as the insulating film is formed so as to cover the control gate CLG, the memory gate electrode MG, and the sidewall spacers SW. After the formation of the interlayer insulating film IL1, the upper surface of the interlayer insulating film IL1 is planarized as necessary using a CMP (Chemical Mechanical Polishing) method or the like.

Next, using a photoresist pattern (not shown) formed over the interlayer insulating film IL1 using a photolithographic method as an etching mask, the interlayer insulating film IL1 is dry-etched to be formed with the contact holes CT.

Next, in the contact holes CT, the conductive plugs PG each made of tungsten (W) or the like are formed as the coupling conductor portions.

To form the plugs PG, a barrier conductor film is formed over, e.g., the interlayer insulating film IL1 including the bottom portions and side walls of the contact holes CT. The barrier conductor film is made of, e.g., a titanium film, a titanium nitride film, or a multi-layer film thereof. Then, over the barrier conductor film, a main conductor film made of a tungsten film or the like is formed so as to be embedded in the contact holes CT. Then, by removing the unneeded main conductor film and the unneeded barrier conductor film which are located over the interlayer insulating film IL1 by a CMP method, an etch-back method, or the like, the plugs PG can be formed. Note that, for simpler illustration, in FIGS. 1 and 21 described above, the barrier conductor film and the main conductor film each included in the plugs PG are shown integrally.

Next, over the interlayer insulating film IL1 in which the plugs PG are embedded, the wires M1 as first-layer wires are formed.

Figure 22:
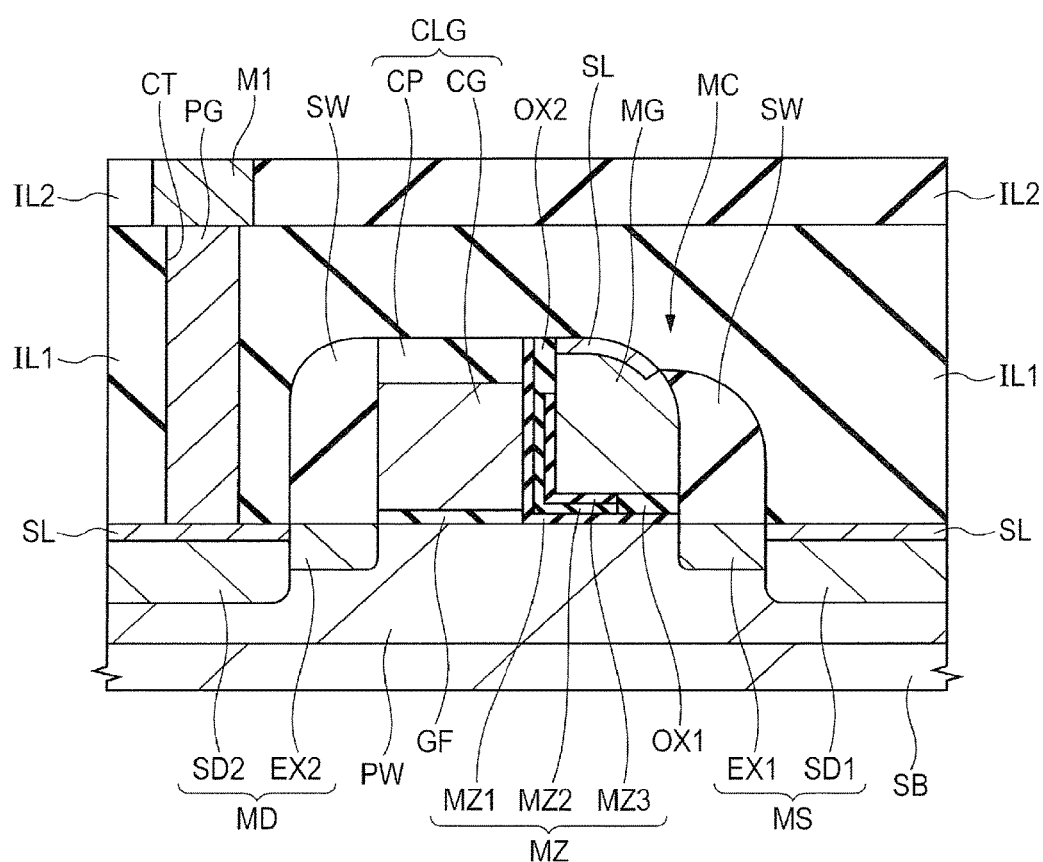
FIG. 22 is a main-portion cross-sectional view of the semiconductor device during the manufacturing process thereof, which is subsequent to FIG. 21.

First, as shown in FIG. 22, over the interlayer insulating film IL1 in which the plugs PG are embedded, the insulating film IL2 is formed. The insulating film IL2 can also be formed of a multi-layer film including a plurality of insulating films. Then, by dry etching using a photoresist pattern (not shown) as an etching mask, wire trenches are formed in the predetermined regions of the insulating film IL2. Then, over the insulating film IL2 including the bottom portions and side walls of the wire trenches, a barrier conductor film is formed. The barrier conductor film is made of, e.g., a titanium nitride film, a tantalum film, a tantalum nitride film, or the like. Then, by a CVD method, a sputtering method, or the like, a copper seed layer is formed over the barrier conductor film. Then, using an electrolytic plating method or the like, a copper plating film is formed over the seed layer to be embedded in the wire trenches. Then, the main conductor film (copper plating film and seed layer) and the barrier conductor film are removed by a CMP method from the region other than the wire trenches to form the first-layer wires M1 using copper embedded in the wire trenches as a main conductive material. In FIGS. 1 and 22 described above, for simpler illustration, the barrier conductor film, the seed layer, and the copper plating film are shown integrally as each of the wires M1.

Then, by a dual damascene method or the like, wires in the second and subsequent layers are formed, but the depiction and description thereof is omitted herein. The wires M1 and the wires in the layers located thereover are not limited to the damascene wires, but can also be formed by patterning a conductor film for wires. For example, the wires M1 and the wires in the layers located thereover can also be, e.g., tungsten wires, aluminum wires, or the like.

In this manner, the semiconductor device in Embodiment 1 is manufactured.

<About Studied Example>

Figure 23:
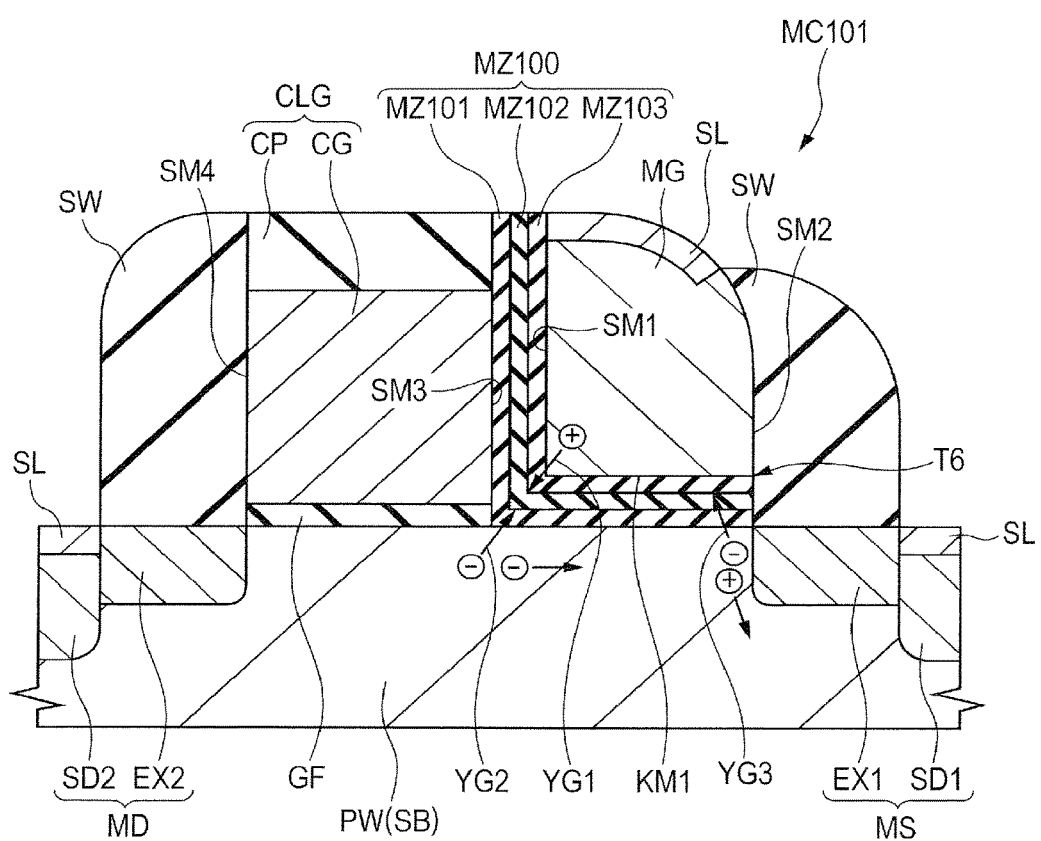
FIG. 23 is a main-portion cross-sectional view of a semiconductor device in a studied example.

FIG. 23 is a partially enlarged cross-sectional view showing a memory cell MC101 in the studied example studied by the present inventors, which shows a region equivalent to FIG. 2 described above.

In the memory cell MC101 in the studied example shown in FIG. 23, over the entire region between the lower surface of the memory gate electrode MG and the semiconductor substrate SB and the entire region between the side surface SM1 of the memory gate electrode MG and the side surface SM3 of the control gate CLG, an insulating film MZ100 having a multi-layer structure including insulating films MZ101, MZ102, and MZ103 is formed continuously. As a result, between the lower surface KM1 of the memory gate electrode MG and the semiconductor substrate SB, the positions of the respective end portions (end surfaces) of the insulating films MZ101, MZ102, and MZ103 correspond to (are aligned with) the side surface SM2 of the memory gate electrode MG. Also, between the side surface SM1 of the memory gate electrode MG and the side surface SM3 of the control gate CLG, the positions of the respective end portions (end surfaces) of the insulating films MZ101, MZ102, and MZ103 correspond to (are aligned with) the upper surface of the memory gate electrode MG. Accordingly, in the memory cell MC101 in the studied example shown in FIG. 23, no equivalent to the foregoing silicon dioxide films OX1 and OX2 is formed.

The insulating film MZ100 is made of the multi-layer film including the insulating film MZ101, the insulating film MZ102 over the insulating film MZ101, and the insulating film MZ103 over the insulating film MZ102. The insulating film MZ101 is made of a silicon dioxide film. The insulating film MZ102 is made of a silicon nitride film. The insulating film MZ103 is made of a silicon oxynitride film. The insulating films MZ101, MZ102, and MZ103 are equivalent to the respective insulating films MZ1, MZ2, and MZ3 in Embodiment 1. The insulating film MZ102 functions as a charge storage layer. Each of the insulating films MZ101 and MZ103 functions as a charge block layer.

The configuration of the memory cell MZ101 shown in FIG. 23 is otherwise substantially the same as that of the memory cell MC in FIGS. 1 and 2 described above so that a repeated description thereof is omitted herein.

In the memory cells MC and MC101 of the nonvolatile memories, data is written by injecting charges (which are electrons herein) into the insulating films MZ2 and MZ102 as the charge storage layers in the insulating films MZ and MZ100 and data is erased by injecting charges (which are holes herein) each having the polarity opposite to that of each of the charges injected during the data writing into the insulating films MZ2 and MZ102. At this time, it is desirable that, in the insulating films MZ2 and MZ102, the position to which the electrons are injected during the write operation corresponds to the position to which the holes are injected during the erase operation as perfectly as possible. This is because, when the position to which the electrons are injected during the write operation is displaced from the position to which the holes are injected during the erase operation in the insulating films MZ2 and MZ102, various problems occur to degrade the performance of the semiconductor devices having the nonvolatile memories.

That is, when the position to which the electrons are injected during the write operation is displaced from the position to which the holes are injected during the erase operation in the insulating films MZ2 and MZ102, a difference is produced between the distribution of the electrons injected during the write operation and the distribution of the holes injected during the erase operation. This causes a phenomenon in which, when the write operation and the erase operation are repeated a large number of times, the threshold voltage in an erased state gradually shifts to result in the deterioration of resistance to data rewriting (the number of times data rewriting can be performed). This leads to the degradation of the performance of the semiconductor devices having the nonvolatile memories.

However, in the case of the memory cell MC101 in the studied example shown in FIG. 23, in the insulating film MZ102 of the insulating film MZ, the position to which electrons are injected during the write operation tends to be displaced from the position to which the holes are injected during the erase operation.

For example, in the present embodiment, the FN method is used as the erase method. In this case, a positive voltage higher than that of the semiconductor substrate SB (p-type well PW) is applied to the memory gate electrode MG to inject holes by FN tunneling from the memory gate electrode MG into the insulating film MZ102 of the insulating film MZ100. At this time, in the memory gate electrode MG, an electric field is concentrated on the corner portion formed by the lower surface KM1 and the side surface SM1. Consequently, as shown by an arrow YG1 in FIG. 23, holes are injected from the corner portion into the insulating film MZ102 in the insulating film MZ100.

Also, in the present embodiment, the SSI method is used as the write method. In this case, voltages as shown in, e.g., the "Write" row in FIG. 4 described above are applied. As a result, hot electrons are generated in the channel region (substrate region) under the region between the memory gate electrode MG and the control gate electrode CG. The hot electrons pass through the insulating film MZ101 of the insulating film MZ100 to be injected into the insulating film MZ102. Accordingly, in the write operation using the SSI method, the injection of hot electrons from the semiconductor substrate SB into the insulating film MZ102 tends to occur in the path shown by an arrow YG2 in FIG. 23, i.e., at a position under the memory gate electrode MG which is close to the control gate electrode CG for the following reason.

That is, in the write operation using the SSI method, the positive voltage Vs higher than each of the voltage Vb of the p-type well PW and the voltage Vd of the semiconductor region MD is applied to the semiconductor region MS, and the positive voltage Vmg higher than the voltage Vs is applied to the memory gate electrode MG. Accordingly, during the write operation, the positive voltage is applied not only to the memory gate electrode MG, but also to the semiconductor region MS. When the voltage (Vmg) applied to the memory gate electrode MG is sufficiently higher than the voltage (Vs) applied to the semiconductor region MS, the path of hot electron injection from the semiconductor substrate SB into the insulating film MZ102 is substantially limited to the path shown by the arrow YG2 in FIG. 23.

However, as the voltage (Vs) applied to the semiconductor region MS is increased, the injection of hot electrons from the semiconductor substrate SB into the insulating film MZ102 occurs not only in the path shown by the arrow YG2 in FIG. 23, but also in the path shown by an arrow YG3 in FIG. 23. This is because, when the voltage (Vs) applied to the semiconductor region MS is increased during the write operation, electrons accelerated by an electric field between the semiconductor regions MD and MS and a crystal lattice interact with each other in the end portion (end portion of the n⁻-type semiconductor region EX1 which is closer to the channel region) of the semiconductor region MS. Consequently, of the electrons and holes generated thereby, the electrons are likely to be injected into the insulating film MZ102 along the path shown by the arrow YG3 in FIG. 23. That is, in the path shown by the arrow YG3 in FIG. 23, the injection of hot electrons from the semiconductor substrate SB into the insulating film MZ102 occurs at a position under the memory gate electrode MG which is close to the semiconductor region MS. Consequently, the electrons injected into the insulating film MZ102 under the memory gate electrode MG along the path shown by the arrow YG2 in FIG. 23 are stored at a position close to the control gate electrode CG and the electrons injected along the path shown by the arrow YG3 in FIG. 23 are stored at a position close to the semiconductor region MS.

In the insulating film MZ102, the position to which electrons are injected along the path shown by the arrow YG2 in FIG. 23 during the write operation substantially corresponds to the position to which holes are injected along the path shown by the arrow YG1 in FIG. 23 during the erase operation. Consequently, the electrons injected along the path shown by the arrow YG2 in FIG. 23 into the insulating film MZ102 during the write operation can be cancelled out with the holes injected along the path shown by the arrow YG1 in FIG. 23 during the erase operation. Accordingly, when electrons are not injected into the insulating film MZ102 along the path shown by the arrow YG3 in FIG. 23 during the write operation, the difference between the distribution of the electrons injected during the write operation and the distribution of the holes injected during the erase operation decreases in the insulating film MZ102.

However, in an actual situation, in the write operation using the SSI method, the injection of the electrons into the insulating film MZ102 occurs not only in the path shown by the arrow YG2 in FIG. 23, but also in the path shown by the arrow YG3 in FIG. 23, as described above. This undesirably produces a difference between the distribution of the electrons injected during the write operation and the distribution of the holes injected during the erase operation in the insulating film MZ102.

It is also considered to lower the voltage (Vs) applied to the semiconductor region MS during the SSI write operation and thus inhibit the injection of the electrons into the insulating film MZ102 along the path shown by the arrow YG3 in FIG. 23. However, the lowering of the voltage (Vs) applied to the semiconductor region MS may reduce the write speed and therefore it is difficult to use the approach of sufficiently lowering the voltage (Vs) applied to the semiconductor region MS.

That is, since a positive voltage is applied to the memory gate electrode MG during each of the write operation using the SSI method and the erase operation using the FN method, the non-selected bits having the common memory gate voltage (Vmg) as that of the selected bit are disturbed by a weak erase operation during the write operation. Consequently, the threshold voltages of the non-selected bits may drop. To prevent this, it is desirable to minimize the voltage (Vmg) applied to the memory gate electrode MG during the write operation. However, this reduces the write operation speed and therefore it is necessary to set the voltage (Vs) applied to the semiconductor region MS rather high.

Thus, by merely controlling the operating voltages during the write operation and the erase operation, it is difficult to prevent electrons from being injected into the insulating film MZ102 not only along the path shown by the arrow YG2 in FIG. 23, but also along the path shown by the arrow YG3 in FIG. 23 during the write operation using the SSI method, as described above. Consequently, a difference is produced between the distribution of the electrons injected during the write operation and the distribution of the holes injected during the erase operation in the insulating film MZ102. This causes the deterioration of the resistance to data rewriting (the number of times data rewriting can be performed) to result in the degradation of the performance of the semiconductor device including the nonvolatile memory.

<About Main Characteristic Features and Effects>

The semiconductor device in Embodiment 1 includes the memory cells MC of the nonvolatile memory. The semiconductor device in Embodiment 1 includes the semiconductor substrate SB, the control gate electrode CG (first gate electrode) formed over the semiconductor substrate SB via the insulating film GF (first insulating film) and the memory gate electrode MG (second gate electrode) formed over the semiconductor substrate SB via the insulating film MZ (multi-layer insulating film) to be adjacent to the control gate electrode CG via the insulating film MZ. The insulating film MZ includes the insulating film MZ1 (first silicon dioxide film), the insulating film MZ2 (first silicon nitride film) over the insulating film MZ1, and the insulating film MZ3 (first insulating film) over the insulating film MZ2. The insulating film MZ1 is made of a silicon dioxide film. The insulating film MZ2 is made of a silicon nitride film and has the charge storing function. The insulating film MZ3 includes a silicon oxynitride film. In the case of Embodiment 1, the insulating film MZ3 is made of the silicon oxynitride film. The memory gate electrode MG has the lower surface KM1 facing the semiconductor substrate SB, the side surface SM1 (first side surface) adjacent to the control gate CLG via the insulating film MZ, and the side surface SM2 (second side surface) opposite to the side surface SM1. Between the lower surface KM1 of the memory gate electrode MG and the semiconductor substrate SB, the end portion T2a (first end portion) of the insulating film MZ2 and the end portion T3a (second end portion) of the insulating film MZ3 are located closer to the side surface SM1 than the end portion T6 (third end portion) of the lower surface KM1 of the memory gate electrode MG which is closer to the side surface SM2. Between the lower surface KM1 of the memory gate electrode MG and the semiconductor substrate SB, in the region where the insulating film MZ is not formed, the silicon dioxide film OX1 (second silicon dioxide film) is embedded.

One of the main characteristic features of Embodiment 1 is that, between the lower surface KM1 of the memory gate electrode MG and the semiconductor substrate SB, the end portion T2a of the insulating film MZ2 and the end portion T3a of the insulating film MZ3 are located closer to the side surface SM1 than the end portion T6 of the lower surface KM1 of the memory gate electrode MG. Between the lower surface KM1 of the memory gate electrode MG and the semiconductor substrate SB, in the region where the insulating film MZ is not formed, the silicon dioxide film OX1 is embedded. Note that the end portion T6 of the lower surface KM1 of the memory gate electrode MG corresponds also to the corner portion formed by the lower surface KM1 of the memory gate electrode MG and the side surface SM2.

As has been described with reference to the foregoing studied example, in Embodiment 1 also, the positive voltage higher than that of the semiconductor substrate (p-type well PW) is applied to the memory gate electrode MG during the erase operation. Thus, holes are injected from the memory gate electrode MG into the insulating film MZ2 by FN tunneling. At this time, in the memory gate electrode MG, an electric field is concentrated on the corner portion formed by the lower surface KM1 and the side surface SM1 so that the holes are injected into the insulating film MZ2 from the corner portion. That is, in the case of Embodiment 1 also, holes are injected from the memory gate electrode MG into the insulating film MZ2 along the path shown by the arrow YG1 in FIG. 23 described above.

As a result, when the injection of the electrons into the charge storage layer (which corresponds to the insulating film MZ102 in the case of the studied example and corresponds to the insulating film MZ2 in the case of Embodiment 1) occurs not only in the path shown by the arrow YG2, but also in the path shown by the arrow YG3 during the write operation as in the studied example in FIG. 23 described above, a difference is produced between the distribution of the electrons injected during the write operation and the distribution of the holes injected during the erase operation. This causes the deterioration of the resistance to data rewriting (the number of times data rewriting can be performed) or the like to result in the degradation of the performance of the semiconductor device having the nonvolatile memory.

By contrast, in Embodiment 1, even between the lower surface KM1 of the memory gate electrode MG and the semiconductor substrate SB, the end portion T2a of the insulating film MZ2 is located closer to the side surface SM1 than the end portion T6 of the lower surface KM1 of the memory gate electrode MG. Consequently, between the lower surface KM1 of the memory gate electrode MG and the semiconductor substrate SB, the insulating film MZ2 as the charge storage layer no longer exists in the region closer to the semiconductor region MS. Therefore, during the write operation, it is possible to inhibit or prevent electrons from being injected from the semiconductor substrate SB into the insulating film MZ2 at a position closer to the semiconductor region MS. That is, in Embodiment 1, during the write operation, it is possible to inhibit or prevent electrons from being injected from the semiconductor substrate SB into the charge storage layer (corresponding to the insulating film MZ2) along the path shown by the arrow YG3 in FIG. 23 described above.

Therefore, in the present embodiment, it is possible to inhibit or prevent the phenomenon in which, during the write operation, electrons are injected from the semiconductor substrate SB into the insulating film MZ2 along the path shown by the arrow YG2 in FIG. 23 described above and electrons are injected from the semiconductor substrate SB into the insulating film MZ2 along the path shown by the arrow YG3 in FIG. 23 described above. During the erase operation, holes are injected from the memory gate electrode MG into the insulating film MZ2 along the path shown by the arrow YG1 in FIG. 23 described above. In the charge storage layer (corresponding to the insulating film MZ2), the position to which electrons are injected along the path shown by the arrow YG2 in FIG. 23 during the write operation substantially corresponds to the position to which holes are injected along the path shown by the arrow YG1 in FIG. 23 during the erase operation. Consequently, in the charge storage layer (corresponding to the insulating film MZ2), the electrons injected along the path shown by the arrow YG2 in FIG. 23 during the write operation can be cancelled out with the holes injected along the path shown by the arrow YG1 in FIG. 23 during the erase operation.

Thus, in the present embodiment, it is possible to more reliably inhibit or prevent the displacement of the position to which electrons are injected during the write operation from the position to which holes are injected during the erase operation in the charge storage layer (corresponding to the insulating films MZ102 and MZ2) and reduce the difference between the distribution of the electrons injected during the write operation and the distribution of the holes injected during the erase operation. This reduces the likelihood of the occurrence of the phenomenon in which, when the write operation and the erase operation are repeated a large number of times, the threshold voltage in the erased state gradually shifts and thus allows an improvement in resistance to data rewriting (the number of times data rewriting can be performed). Therefore, it is possible to improve the performance of the semiconductor device including the nonvolatile memory.

In the present embodiment, as the insulating film MZ3, the silicon oxynitride film is used. This is because, in the case where a silicon oxynitride film is the insulating film MZ3 as in Embodiment 1, holes are more easily caused to tunnel through the insulating film MZ3 and injected from the memory gate electrode MG into the insulating film MZ2 during the erase operation than in the case where a silicon dioxide film is used as the insulating film MZ3, unlike in Embodiment 1.

That is, in terms of allowing easy injection of charges from the memory gate electrode MG into the charge storage layer (which is the insulating film MZ2 herein) during the erase operation, the energy barrier of the charge block layer (which is the insulating film MZ3 herein) closer to the memory gate electrode MG is preferably low. Accordingly, the band gap of the charge block layer (which is the insulating film MZ3 herein) closer to the memory gate electrode MG is preferably small. The band gap of silicon oxynitride is larger than the band gap of silicon nitride and smaller than the band gap of silicon dioxide. Accordingly, in the present embodiment, the silicon oxynitride film is used as the insulating film MZ3 to allow easier injection of holes from the memory gate electrode MG into the insulating film MZ2 during the erase operation and thus improve an erase property.

However, when a silicon oxynitride film, not a silicon dioxide film, is used as the insulating film MZ3, the insulating film MZ3 may also have a charge storing function. Accordingly, when the position of the end portion T3a of the insulating film MZ3 corresponds to (is aligned with) the end portion T6 of the lower surface KM1 of the memory gate electrode MG between the lower surface KM1 of the memory gate electrode MG and the semiconductor substrate SB unlike in Embodiment 1, electrons may be injected from the semiconductor substrate SB into the insulating film MZ3 along the path shown by the arrow YG3 in FIG. 23 described above to be stored at a position in the insulating film MZ3 which is close to the semiconductor region MS. Since holes are injected along the path shown by the arrow YG1 in FIG. 23 described above during the erase operation, the holes cannot be injected to a position in the insulating film MZ3 which is close to the semiconductor region MS and therefore cannot cancel out the electrons. This may cause fluctuations in the threshold voltage of the memory transistor in the erased state to degrade the performance of the semiconductor device.

By contrast, in Embodiment 1, between the lower surface KM1 of the memory gate electrode MG and the semiconductor substrate SB, not only the end portion T2a of the insulating film MZ2, but also the end portion T3a of the insulating film MZ3 is also located closer to the side surface SM1 than the end portion T6 of the lower surface KM1 of the memory gate electrode MG. Between the lower surface KM1 of the memory gate electrode MG and the semiconductor substrate SB, in the region where the insulating film MZ is not formed, the silicon dioxide film OX1 is embedded.

This provides a state in which, between the lower surface KM1 of the memory gate electrode MG and the semiconductor substrate SB, in the region closer to the semiconductor region MS, not only the insulating film MZ2 (silicon nitride film) as the charge storage layer, but also the insulating film MZ3 made of the silicon oxynitride film in which charges may be stored no long exists and the silicon dioxide film OX1 exists instead of the insulating films MZ2 and MZ3. As a result, it is possible to not only inhibit or prevent electrons from being injected from the semiconductor substrate SB into the insulating film MZ2 at a position close to the semiconductor region MS during the write operation, but also inhibit or prevent electrons from being injected into the insulating film MZ3. That is, in Embodiment 1, it is possible to inhibit or prevent not only the phenomenon in which electrons are injected from the semiconductor substrate SB into the insulating film MZ2 along the path shown by the arrow YG3 in FIG. 23 described above during the write operation, but also the phenomenon in which electrons are injected from the semiconductor substrate SB into the insulating film MZ3 along the path shown by the arrow YG3 in FIG. 23 described above. Between the lower surface KM1 of the memory gate electrode MG and the semiconductor substrate SB, in the region closer to the semiconductor region MS, the silicon dioxide film OX1 exists. However, since charges are far less likely to be stored in a silicon dioxide film than in a silicon nitride film or a silicon oxynitride film, there is substantially no concern that electrons are injected from the semiconductor substrate SB into the silicon dioxide film OX1 along the path shown by the arrow YG3 in FIG. 23 described above during the write operation.

Thus, in Embodiment 1, for an improved erase property, the silicon oxynitride film is used as the insulating film MZ3. Since charges are more likely to be stored in the silicon oxynitride film than in a silicon dioxide film, in the region between the memory gate electrode MG and the semiconductor substrate SB which is closer to the semiconductor region MS, not only the insulating film MZ2, but also the insulating film MZ3 is not provided and the silicon dioxide film OX1 is embedded instead. As a result, even when a silicon oxynitride is used as the insulating film MZ3 for the improved erase property, it is possible to inhibit or prevent charges from being stored in the region of the insulating film located between the memory gate electrode MG and the semiconductor substrate SB which is closer to the semiconductor region MS. Accordingly, in the insulating film located between the memory gate electrode MG and the semiconductor substrate SB, it is easier to achieve correspondence between the position to which electrons are injected during the write operation and the position to which holes are injected during the erase operation. This can reduce the difference between the distribution of the electrons injected during the write operation and the distribution of the holes injected during the erase operation. Consequently, the phenomenon in which, when the write operation and the erase operation are repeated a large number of times, the threshold voltage in the erased state gradually shifts is less likely to occur. This can improve the resistance to data rewriting (the number of times data rewriting can be performed) and thus improve the performance of the semiconductor device having the nonvolatile memory.

It is preferable that, in the gate length direction of the memory gate electrode MG, a distance L1 from the end portion T6 of the lower surface KM1 of the memory gate electrode MG to the end portion T2a of the insulating film MZ2 is not less than 5 nm. Note that the distance L1 is a distance in the gate length direction of the memory gate electrode MG and shown in FIG. 2. The distance L1 can also be regarded as a dimension (dimension in the gate length direction) of the region of the memory gate electrode MG which does not overlap the insulating film MZ2 in plan view.

By setting the distance L1 to 5 nm or more, it is possible to more reliably inhibit or prevent the phenomenon in which electrons are injected from the semiconductor substrate SB into the insulating film MZ2 along the path shown by the arrow YG3 in FIG. 23 described above. Accordingly, it is possible to more reliably reduce the difference between the distribution of the electrons injected during the write operation and the distribution of the holes injected during the erase operation. This can more reliably improve the resistance to data rewriting (the number of times data rewriting can be performed). Therefore, the performance of the semiconductor device having the nonvolatile memory can more reliably be improved.

Note that, in Embodiment 1, in the gate length direction of the memory gate electrode MG, the position of the end portion T2a of the insulating film MZ2 substantially corresponds to (is substantially aligned with) the position of the end portion T3a of the insulating film MZ3. Accordingly, when the distance L1 from the end portion T6 of the lower surface KM1 of the memory gate electrode MG to the end portion T2a of the insulating film MZ2 is set to 5 nm or more, the distance from the end portion T6 of the lower surface KM1 of the memory gate electrode MG to the end portion T3a of the insulating film MZ3 consequently becomes 5 nm or more.

It is also preferable that, in the gate length direction of the memory gate electrode MG, a length (dimension) L2 of the portion of the insulating film MZ2 which is located between the lower surface KM1 of the memory gate electrode MG and the semiconductor substrate SB is set to about 15 to 30 nm. This allows electrons to be reliably injected from the semiconductor substrate SB into the insulating film MZ2 along the path shown by the arrow YG2 in FIG. 23 described above during the write operation. This also allows holes to be reliably injected from the memory gate electrode MG into the insulating film MZ2 along the path shown by the arrow YG1 in FIG. 23 described above during the erase operation. Note that the length L2 is a dimension in the gate length direction of the memory gate electrode MG and shown in FIG. 2. The length L2 can also be regarded as a dimension (dimension in the gate length direction of the memory gate electrode MG) of the region of the memory gate electrode MG which overlaps the insulating film MZ2 in plan view. The sum of the distance L1 and the length L2 corresponds to the gate length of the memory gate electrode MG. The length L2 is smaller than the gate length (L1+L2) of the memory gate electrode MG.

(Embodiment 2)

Figure 24:
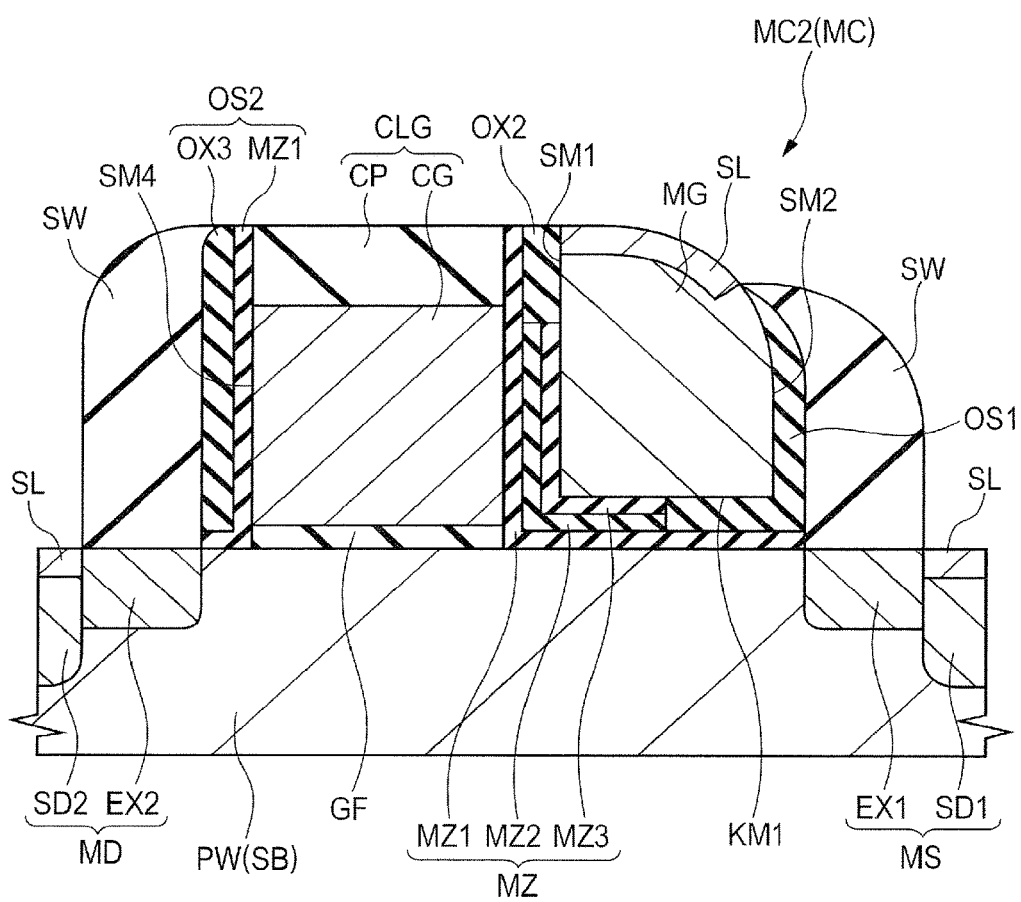
FIG. 24 is a main-portion cross-sectional view of a semiconductor device as another embodiment.
Figure 25:
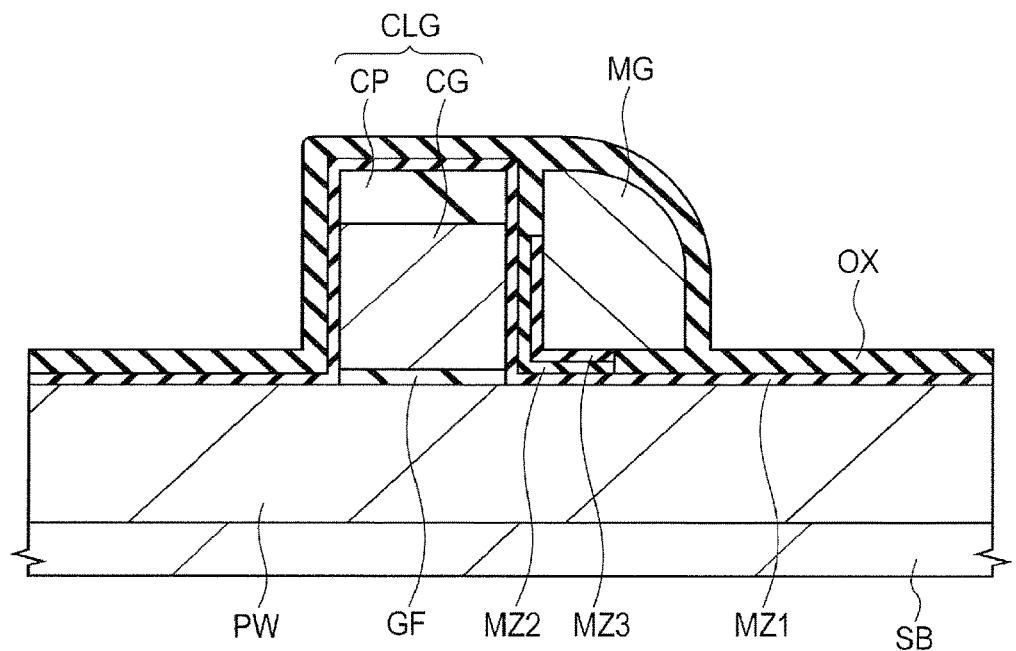
FIG. 25 is a main-portion cross-sectional view of the semiconductor device in the other embodiment during the manufacturing process thereof.

FIG. 24 is a main-portion cross-sectional view of a semiconductor device in Embodiment 2. FIG. 24 corresponds to FIG. 2 described above and showing Embodiment 1 described above, which shows a partially enlarged cross-sectional view of the memory cell MC. The memory cell MC in Embodiment 2 will be hereinafter referred as a memory cell MC2.

The memory cell MC2 in Embodiment 2 is different from the memory cell MC in Embodiment 1 described above in the following point.

As shown in FIG. 24, in the memory cell MC2 in Embodiment 2, over the side surface SM2 of the memory gate electrode MG, the sidewall spacer SW is formed via an offset spacer (side-wall insulating film) OS1 and, over the side surface SM4 of the control gate CLG, the sidewall spacer SW is formed via an offset spacer (side-wall insulating film) 052. That is, in the memory cell MC2 in Embodiment 2, between the side surface SM2 of the memory gate electrode MG and the sidewall spacer SW, the offset spacer OS1 is interposed and, between the side surface SM4 of the control gate CLG and the sidewall spacer SW, the offset spacer OS2 is interposed. Each of the offset spacers OS1 and OS2 can be regarded as a side-wall insulating film.

In Embodiment 2, an equivalent to the silicon dioxide film OX1 in Embodiment 1 described above is configured of a part of the offset spacer OS1. That is, in Embodiment 1 described above, between the lower surface KM1 of the memory gate electrode MG and the semiconductor substrate SB, in the region where the insulating film MZ is not formed (located), the silicon dioxide film OX1 is embedded. By contrast, in Embodiment 2, between the lower surface KM1 of the memory gate electrode MG and the semiconductor substrate SB, in the region where the insulating film MZ is not formed (placed), a part of the offset spacer OS1 is embedded.

The offset spacer OS1 is formed of a silicon dioxide film. Accordingly, Embodiment 2 is the same as Embodiment 1 described above in that, between the lower surface KM1 of the memory gate electrode MG and the semiconductor substrate SB, in the region where the insulating film MZ is not formed (placed), the silicon dioxide film is embedded. Embodiment 2 is different from Embodiment 1 described above in that the silicon dioxide film is a part of the offset spacer OS1.

That is, Embodiment 2 has the offset spacer OS1 (first side-wall insulating film) formed over the side surface SM2 of the memory gate electrode MG. Between the lower surface KM1 of the memory gate electrode MG and the semiconductor substrate SB, the silicon dioxide film (portion equivalent to the foregoing silicon dioxide film OX1) embedded in the region where the insulating film MZ is not formed is formed integrally with the offset spacer OS1. Accordingly, in Embodiment 2, the offset spacer OS1 formed integrally with the foregoing silicon dioxide film OX1 in Embodiment 1 described above is formed over the side surface SM2 of the memory gate electrode MG.

The offset spacer OS2 is made of a multi-layer film including a silicon dioxide film in the same layer as that of the insulating film MZ1 and a silicon dioxide film OX3 in the same layer as that of the offset spacer OS1. The films included in the offset spacer OS2 differ depending on the manufacturing method.

The offset spacer OS1 is formed before the n⁻-type semiconductor region EX1 is formed by ion implantation. The offset spacer OS2 is formed before the n⁻-type semiconductor region EX2 is formed by ion implantation. Consequently, the n⁻-type semiconductor region EX1 is formed by self-alignment with the side surface (side surface opposite to the side surface in contact with the memory gate electrode MG) of the offset spacer OS1. The n⁻-type semiconductor region EX2 is formed by self-alignment with the side surface (side surface opposite to the side surface in contact with the control gate CLG) of the offset spacer OS2.

The configuration of the memory cell MC2 in Embodiment 2 is otherwise substantially the same as that of the memory cell MC in Embodiment 1 described above so that a repeated description thereof is omitted herein.

Next, a description will be given of the manufacturing process of the semiconductor device in Embodiment 2 with reference to FIGS. 25 to 28. FIGS. 25 to 28 are main-portion cross-sectional views of the semiconductor device in Embodiment 2 during the manufacturing process thereof.

The manufacturing process of the semiconductor device in Embodiment 2 is the same as in Embodiment 1 described above until the structure in FIG. 16 described above is obtained by performing Step S13 (step of forming the silicon dioxide film OX) described above. Accordingly, a repeated description thereof is omitted herein and a description will be given of the process steps subsequent thereto.

Figure 26:
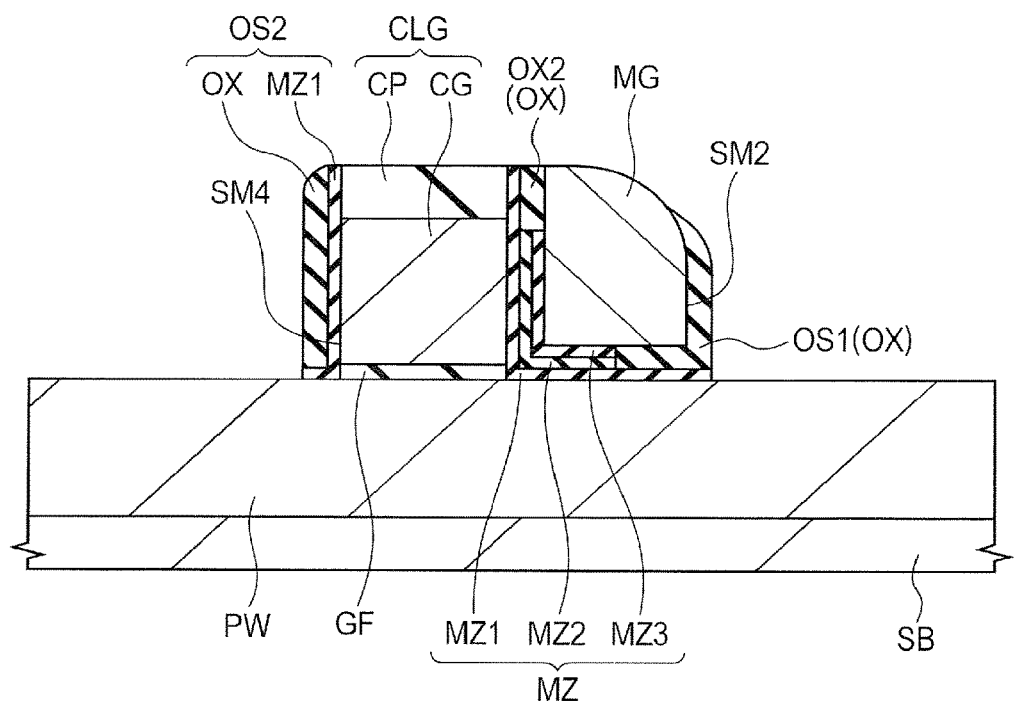
FIG. 26 is a main-portion cross-sectional view of the semiconductor device during the manufacturing process thereof, which is subsequent to FIG. 25.

In Embodiment 2 also, in the same manner as in Embodiment 1 described above, the manufacturing process is performed up to Step S13 (step of forming the silicon dioxide film OX) described above to provide the structure in FIG. 25 equivalent to FIG. 16 described above. Then, as shown in FIG. 26, the silicon dioxide film OX and the insulating film MZ1 are anisotropically etched.

That is, in Embodiment 1 described above, in Step S14 described above, the silicon dioxide film OX and the insulating film MZ1 are isotropically etched. By contrast, in the case of Embodiment 2, in the step equivalent to Step S14 described above, the silicon dioxide film OX and the insulating film MZ1 are anisotropically etched.

As a result, in Embodiment 2, the silicon dioxide film OX and the insulating film MZ1 are etched by anisotropic etching. Consequently, over the side surface SM2 of the memory gate electrode MG, the silicon dioxide film OX remains to form the offset spacer OS1 and, over the side surface SM4 of the control gate CLG, the insulating film MZ1 and the silicon dioxide film OX remain to form the offset spacer OS2. Since the silicon dioxide film OX is formed so as to be embedded in the cavities CAV1 and CAV2, the silicon dioxide film OX remains in the cavities CAV1 and CAV2 to provide a state where a part of the silicon dioxide film included in the offset spacer OS1 is embedded in the cavity CAV1. Under the silicon dioxide film included in the offset spacer OS1, the insulating film MZ1 remains. The silicon dioxide film OX also remains in the cavity CAV2 to be able to form the silicon dioxide film OX2 embedded in the cavity CAV2. From the other region, the silicon dioxide film OX is removed by anisotropic etching.

Thus, in the case of Embodiment 2, the silicon dioxide film OX serves also as an insulating film for forming the offset spacers OS1 and OS2.

The subsequent process steps are basically the same as in Embodiment 1 described above.

Figure 27:
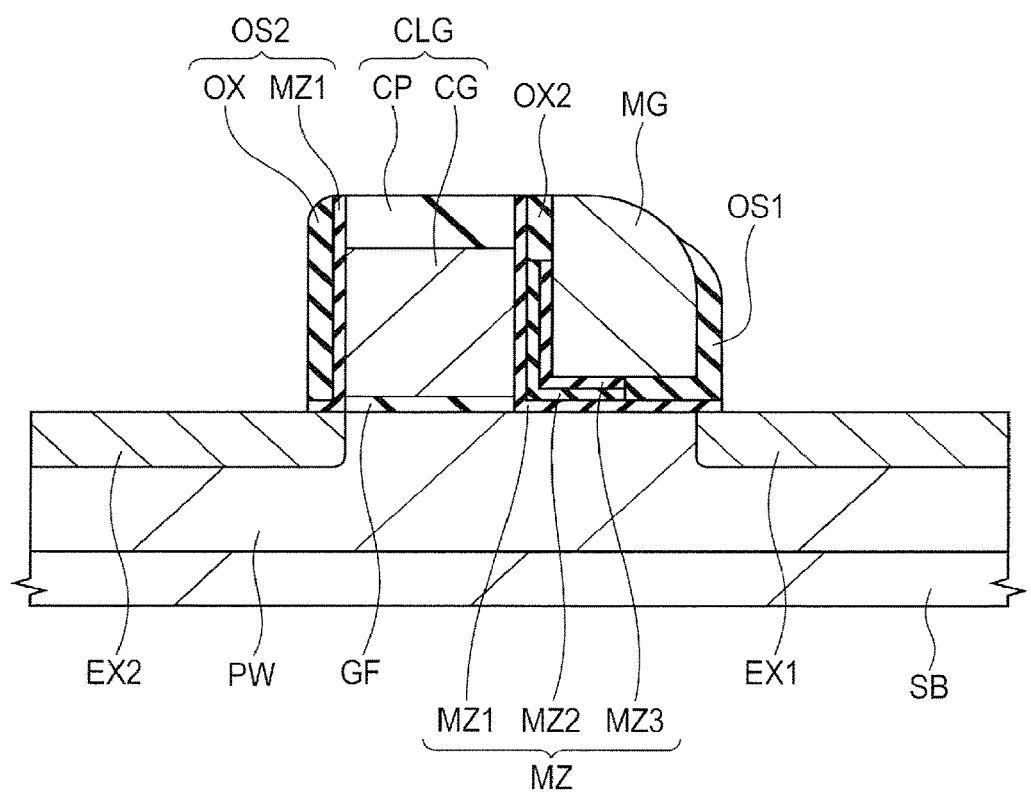
FIG. 27 is a main-portion cross-sectional view of the semiconductor device during the manufacturing process thereof, which is subsequent to FIG. 26.

That is, in Embodiment 2 also, Step S15 described above is performed to form the n$^-$-type semiconductor regions EX1 and EX2, as shown in FIG. 27.

At this time, using the control gate CLG, the memory gate electrode MG, and the offset spacers OS1 and OS2 over the respective side surfaces thereof as a mask, an n-type impurity is introduced into the semiconductor substrate SB (p-type well PW) using an ion implantation method to form the n$^-$-type semiconductor regions EX1 and EX2. Accordingly, the n$^-$-type semiconductor region EX1 is formed by self-alignment with the offset spacer OS1 over the side surface SM2 of the memory gate electrode MG, while the n$^-$-type semiconductor region EX2 is formed by self-alignment with the offset spacer OS2 over the side surface SM4 of the control gate CLG. The n$^-$-type semiconductor regions EX1 and EX2 can be formed by the same ion implantation step, but can also be formed by different ion implantation steps. To suppress a short-channel effect, a pocket implantation region or a halo implantation method can also be further formed so as to surround the n$^-$-type semiconductor regions EX1 and EX2.

Figure 28:
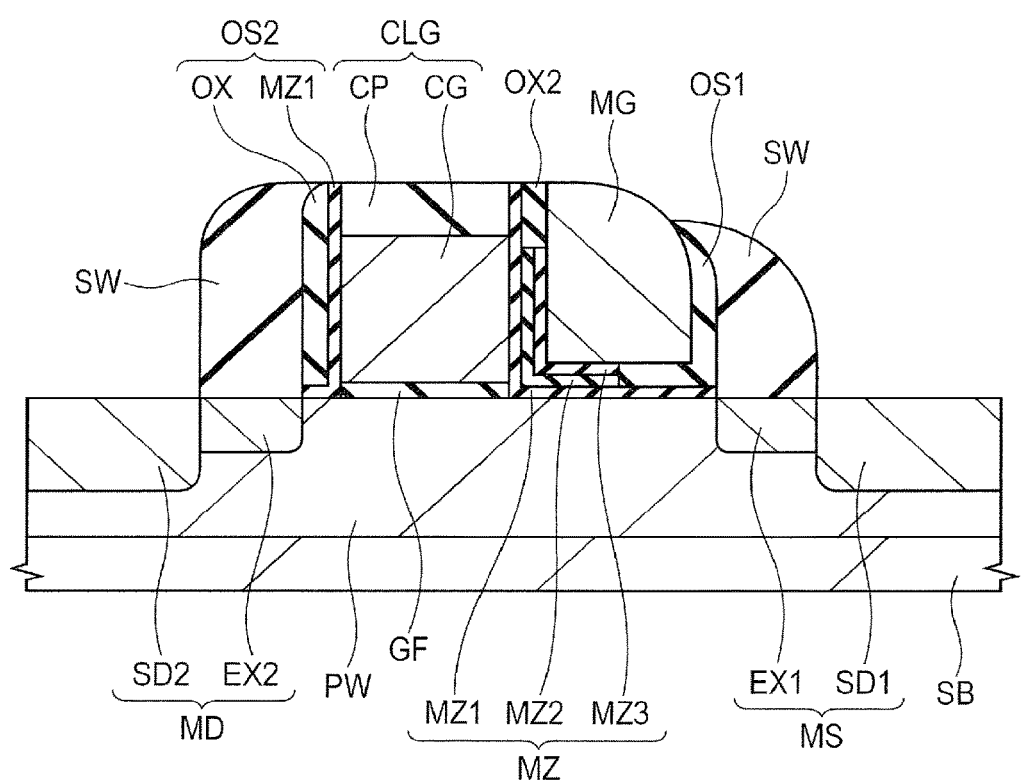
FIG. 28 is a main-portion cross-sectional view of the semiconductor device during the manufacturing process thereof, which is subsequent to FIG. 27.

Next, in Embodiment 2 also, Step S16 described above is performed to form the sidewall spacers SW, as shown in FIG. 28.

In Embodiment 2 also, the method of forming the sidewall spacers SW is the same as in Embodiment 1 described above. However, in Embodiment 2, over the side surface SM2 of the memory gate electrode MG, the sidewall spacer SW is formed via the offset spacer OS1 and, over the side surface SM4 of the control gate CLG, the sidewall spacer SW is formed via the offset spacer OS2.

Next, in Embodiment 2 also, Step S17 described above is performed to form the n$^+$-type semiconductor regions SD1 and SD2, as shown in FIG. 28.

At this time, using the control gate CLG, the memory gate electrode MG, the offset spacers OS1 and OS2 over the respective side surfaces thereof, and the sidewall spacers SW as a mask, an n-type impurity is introduced into the semiconductor substrate SB (p-type well PW) using an ion implantation method to form the n$^+$-type semiconductor regions SD1 and SD2.

Accordingly, the n$^+$-type semiconductor region SD1 is formed by self-alignment with the sidewall spacer SW formed over the side surface SM2 of the memory gate electrode MG via the offset spacer OS1, while the n$^+$-type semiconductor region SD2 is formed by self-alignment with the sidewall spacer SW formed over the side surface SM4 of the control gate CLG via the offset spacer OS2. Thus, LDD structures are formed. The n$^+$-type semiconductor regions SD1 and SD2 can be formed by the same ion implantation step, but can also be formed by different ion implantation steps.

Then, the activation anneal in Step S18 described above and the process steps subsequent thereto are performed, but the depiction and repeated description thereof is omitted herein.

In Embodiment 2, in addition to the effects obtained in Embodiment 1 described above, the following effect can further be obtained.

That is, in Embodiment 2, the silicon dioxide film (equivalent to the silicon dioxide film OX1 in Embodiment 1 described above) to be embedded in the region where the insulating film MZ is not formed between the lower surface KM1 of the memory gate electrode MG and the semiconductor substrate SB can be formed simultaneously when the offset spacer OS1 is formed. This can reduce the number of steps in the manufacturing process of the semiconductor device and also reduce the manufacturing cost of the semiconductor device.

On the other hand, in the case of Embodiment 1 described above, the silicon dioxide film OX does not serve as the insulating film for forming the offset spacers OS1 and OS2. Accordingly, the formed film thickness of the silicon dioxide film OX need not be set to a film thickness appropriate for the offset spacer and can be set to a film thickness appropriate to embed the silicon dioxide film OX in the cavity CAV1. This allows easier formation of the silicon dioxide film OX to be embedded in the cavity CAV1.

(Embodiment 3)

Figure 29:
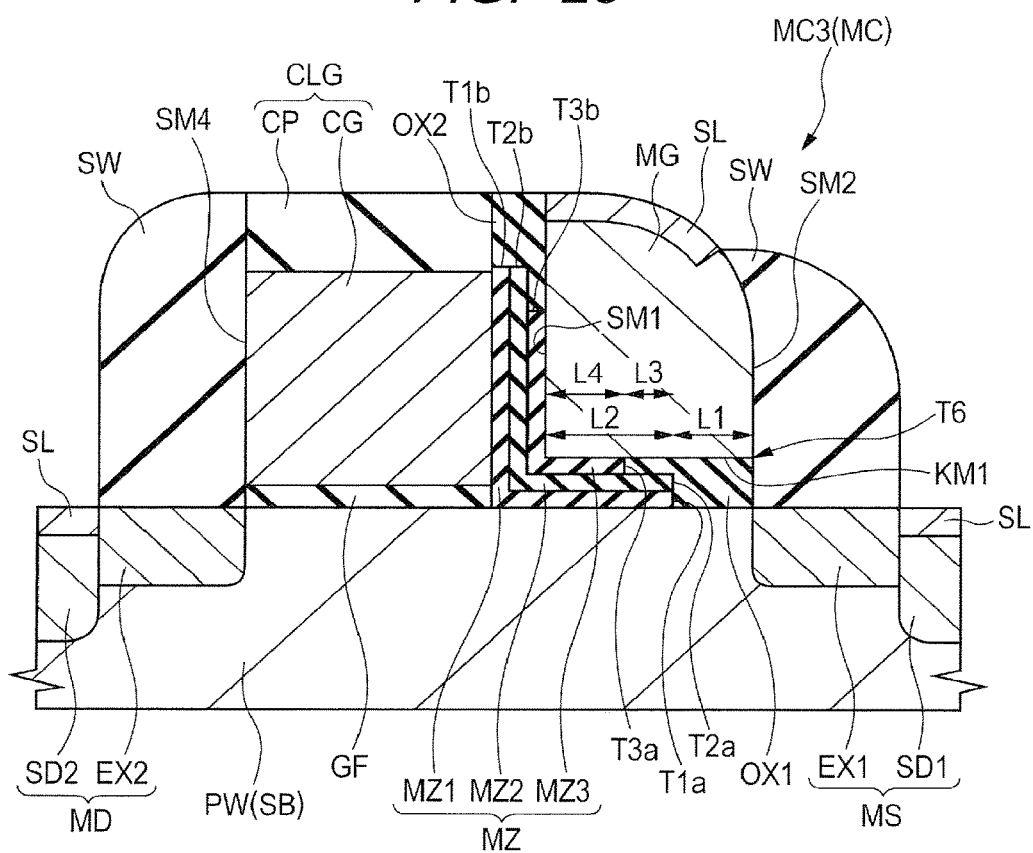
FIG. 29 is a main-portion cross-sectional view of a semiconductor device as still another embodiment.
Figure 30:
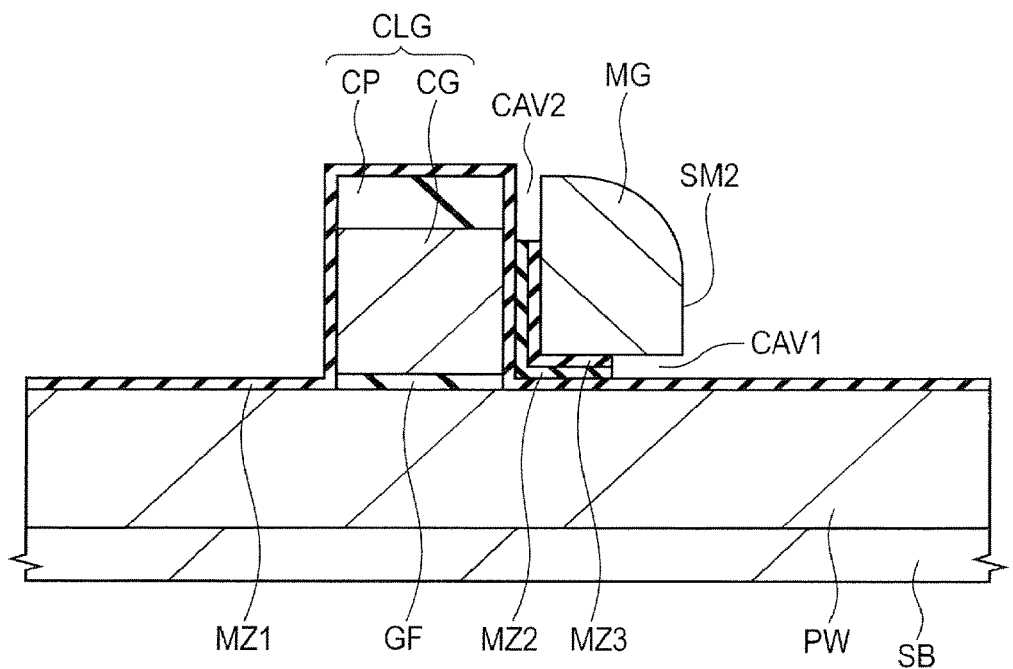
FIG. 30 is a main-portion cross-sectional view of the semiconductor device in the still other embodiment during the manufacturing process thereof.

FIG. 29 is a main-portion cross-sectional view of a semiconductor device in Embodiment 3. FIG. 29 corresponds to FIG. 2 described above and showing Embodiment 1 described above, which shows a partially enlarged cross-sectional view of the memory cell MC. The memory cell MC in Embodiment 3 will be hereinafter referred to as a memory cell MC3.

A description will be given of the memory cell MC3 in Embodiment 3 with a focus on the difference from the memory cell MC in Embodiment 1 described above.

The memory cell MC3 in Embodiment 3 is the same as the memory cell MC in Embodiment 1 described above in that, between the lower surface KM1 of the memory gate electrode MG and the semiconductor substrate SB, the end portion T2a of the insulating film MZ2 and the end portion T3a of the insulating film MZ3 are located closer to the side surface SM1 than the end portion T6 of the lower surface KM1 of the memory gate electrode MG. The memory cell MC3 in Embodiment 3 is also the same as the memory cell MC in Embodiment 1 described above in that, between the lower surface KM1 of the memory gate electrode MG and the semiconductor substrate SB, the silicon dioxide film OX1 is embedded in the region where the insulating film MZ is not formed.

However, in the memory cell MC in Embodiment 1 described above, between the lower surface KM1 of the memory gate electrode MG and the semiconductor substrate SB, the position of the end portion T2a of the insulating film MZ substantially corresponds to (is substantially aligned with) the position of the end portion T3a of the insulating film MZ3. By contrast, in the memory cell MC3 in Embodiment 3, between the lower surface KM1 of the memory gate electrode MG and the semiconductor substrate SB, the end portion T3a of the insulating film MZ3 is located closer to the side surface SM1 than the end portion T2a of the insulating film MZ2. Accordingly, in the memory cell MC in Embodiment 1 described above, the silicon dioxide film OX1 does not overlap the insulating film MZ2 between the lower surface KM1 of the memory gate electrode MG and the semiconductor substrate SB. However, in the memory cell MC3 in Embodiment 3, between the lower surface KM1 of the memory gate electrode MG and the semiconductor substrate SB, the silicon dioxide film OX1 overlaps a part of the insulating film MZ2.

Also, in the memory cell MC3 in Embodiment 3, between the lower surface KM1 of the memory gate electrode MG and the semiconductor substrate SB, not only the end portions T2a and T3a of the insulating films MZ2 and MZ3, but also the end portion T1a of the insulating film MZ1 is located closer to the side surface SM1 than the end portion T6 of the lower surface KM1 of the memory gate electrode MG. Here, between the lower surface KM1 of the memory gate electrode MG and the semiconductor substrate SB, the position of the end portion T1a of the insulating film MZ1 substantially corresponds to (is substantially aligned with) the position of the end portion T2a of the insulating film MZ2.

Consequently, in the memory cell MC3 in Embodiment 3, between the lower surface KM1 of the memory gate electrode MG and the semiconductor substrate SB, the insulating film MZ and the silicon dioxide film OX1 are interposed. The silicon dioxide film OX1 is adjacent to the end portions T1a, T2a, and T3a of the insulating films MZ1, MZ2, and MZ3. The upper surface of the portion of the insulating film MZ2 which is uncovered with the insulating film MZ3 is covered with the silicon dioxide film OX1.

Note that, in the memory cell MC3 in Embodiment 3 also, the respective end portions T1a, T2a, and T3a of the insulating films MZ1, MZ2, and MZ3 are located closer to the side surface SM2 than the corner portion formed by the lower surface KM1 and the side surface SM1 of the memory gate electrode MG. Consequently, in a part of the space between the lower surface KM1 of the memory gate electrode MG and the semiconductor substrate SB, the insulating films MZ1, MZ2, and MZ3 are present. In the vicinity of the corner portion formed by the lower surface KM1 and the side surface SM1 of the memory gate electrode MG, the insulating films MZ1, MZ2, and MZ3 are present.

Also, in the memory cell MC3 in Embodiment 3, between the memory gate electrode MG and the control gate CLG, the end portion T3b of the insulating film MZ3 is located below the end portion T2b of the insulating film MZ2. In addition, between the memory gate electrode MG and the control gate CLG, the position of the end portion T1b of the insulating film MZ1 substantially corresponds to (is substantially aligned with) the position of the end portion T2b of the insulating film MZ2. Between the memory gate electrode MG and the control gate CLG, the silicon dioxide film OX2 is embedded in the region where the insulating film MZ is not formed. Consequently, the silicon dioxide film OX2 is adjacent to the end portions T1b, T2b, and T3b of the insulating films MZ1, MZ2, and MZ3 and the top surface of the portion of the insulating film MZ2 which is uncovered with the insulating film MZ3 is covered with the silicon dioxide film OX2.

The configuration of the memory cell MC3 in Embodiment 3 is otherwise substantially the same as that of the memory cell MC in Embodiment 1 described above so that a repeated description thereof is omitted herein.

Next, a description will be given of the manufacturing process of the semiconductor device in Embodiment 3 with reference to FIGS. 30 to 33. FIGS. 30 to 33 are main-portion cross-sectional views of the semiconductor device in Embodiment 3 during the manufacturing process thereof.

The manufacturing process of the semiconductor device in Embodiment 3 is the same as in Embodiment 1 described above until the structure in FIG. 15 described above is obtained by performing Step S12 (step of etching the insulating film MZ2) described above. Accordingly, a repeated description thereof is omitted herein and a description will be given of the process steps subsequent thereto.

Figure 31:
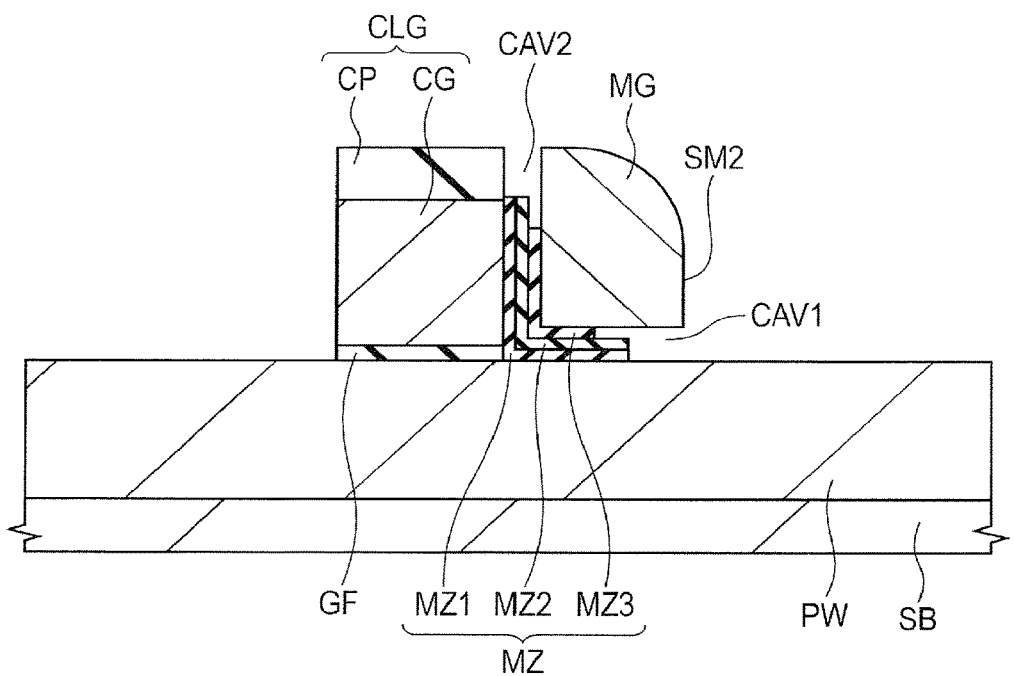
FIG. 31 is a main-portion cross-sectional view of the semiconductor device during the manufacturing process thereof, which is subsequent to FIG. 30.

In Embodiment 3 also, in the same manner as in Embodiment 1 described above, the manufacturing process is performed up to Step S12 (step of etching the insulating film MZ2) described above to provide the structure in FIG. 30 equivalent to FIG. 15 described above. Then, as shown in FIG. 31, the insulating film MZ1 is etched. The etching step will be hereinafter referred to as the etching step in FIG. 31.

In the etching step in FIG. 31, not only the exposed portion of the insulating film MZ1 which is uncovered with the memory gate electrode MG is etched and removed, but also the insulating film MZ1 exposed in the cavities CAV1 and CAV2 is etched and removed. That is, in the etching step in FIG. 31, the exposed portion of the insulating film MZ1 which is uncovered with the insulating film MZ2 is etched and removed.

In the etching step in FIG. 31, isotropic etching is performed and, preferably, wet etching is performed. At this time, it is preferable to use an etching solution which allows the insulating film MZ1 to be selectively etched. That is, it is preferable to use an etching solution with which the speed of etching the insulating film MZ1 is higher than the speeds of etching the memory gate electrode MG and the insulating film MZ2. In other words, it is preferable to use an etching solution with which the insulating film MZ1 is more likely to be etched and the memory gate electrode MG and the insulating film MZ2 are less likely to be etched. As an example of the etching solution used in FIG. 31, a hydrofluoric acid or the like can be used appropriately.

In the etching step in FIG. 31, the etching solution (which is an etchant in the case of dry etching) also enters the cavities CAV1 and CAV2. Consequently, under the memory gate electrode MG and between the memory gate electrode MG and the control gate CLG, the exposed portion of the insulating film MZ1 which is uncovered with the insulating film MZ2 and exposed in the cavities CAV1 and CAV2 is also etched and removed. Accordingly, the position of the end portion of the insulating film MZ1 is substantially the same as the position of the end portion of the insulating film MZ2.

However, in the etching step in FIG. 31, not only the insulating film MZ1 made of the silicon dioxide film, but also the insulating film MZ3 made of the silicon oxynitride film is etched (side-etched). That is, when a silicon dioxide film is etched using a hydrofluoric acid or the like, a silicon nitride film is scarcely etched, but a silicon oxynitride film may be etched to a degree. Accordingly, when the insulating film MZ1 made of the silicon dioxide film is etched, the insulating film MZ2 made of the silicon nitride film is scarcely etched. However, since the end portion of the insulating film MZ3 made of the silicon oxynitride film is exposed to the etching solution, the etching of the insulating film MZ3 proceeds from the end portion thereof to provide a state where the end portion of the insulating film MZ3 is retracted from the end portion of the insulating film MZ2.

This provides a structure as shown in FIG. 29 described above in which, between the lower surface KM1 of the memory gate electrode MG and the semiconductor substrate SB, the end portion T3a of the insulating film MZ3 is located closer to the side surface SM1 than the end portion T2a of the insulating film MZ2. This also provides a structure in which, between the memory gate electrode MG and the control gate CLG, the end portion T3b of the insulating film MZ3 is located below the end portion T2b of the insulating film MZ2.

Consequently, when the etching step in Step S11, the etching step in Step S12, and the etching step in FIG. 31 are performed, a state is achieved in which the respective end portions (T3a, T2a, and T1a) of the insulating films MZ3, MZ2, and MZ1 which are located between the memory gate electrode MG and the semiconductor substrate SB (p-type well PW) are located inwardly of (closer to the side surface SM1 than) the side surface SM2 of the memory gate electrode MG. This provides a state where, between the memory gate electrode MG and the semiconductor substrate SB, the end portion T3a of the insulating film MZ3 is located inwardly of (closer to the side surface SM1 than) the end portion T2a of the insulating film MZ2.

When the etching step in FIG. 31 is performed, the insulating films MZ1 and MZ3 are removed from immediately under the memory gate electrode MG. This expands the cavity CAV1, and the entire region from which the insulating films MZ3, MZ2, and MZ1 have been removed in Steps S11 and S12 and in the etching step in FIG. 31 becomes the cavity CAV1. Also, when the etching step in FIG. 31 is performed, between the memory gate electrode MG and the control gate CLG, the insulating films MZ1 and MZ3 are removed. This expands the cavity CAV2, and the entire region from which the insulating films MZ3, MZ2, and MZ1 have been removed in Steps S11 and S12 and in the etching step in FIG. 31 becomes the cavity CAV2.

In Embodiment 3 also, the subsequent process steps are basically the same as in Embodiment 1 described above.

Figure 32:
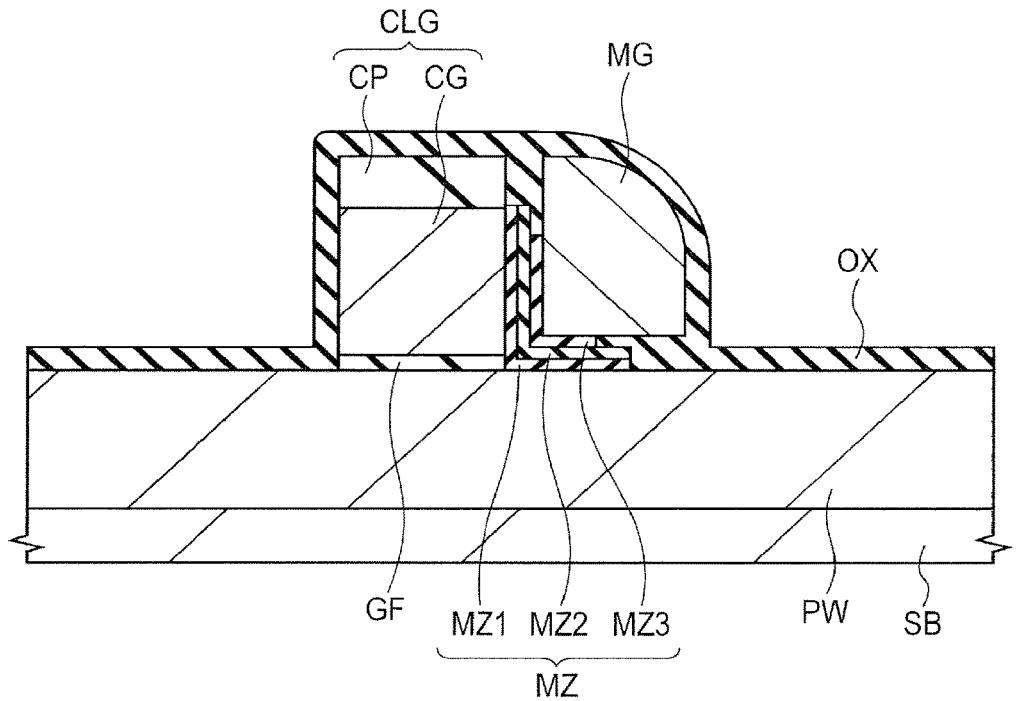
FIG. 32 is a main-portion cross-sectional view of the semiconductor device during the manufacturing process thereof, which is subsequent to FIG. 31.

That is, in Embodiment 3 also, Step S13 described above is performed to form the silicon dioxide film OX as an insulating film over the main surface (entire main surface) of the semiconductor substrate SB so as to cover the control gate CLG and the memory gate electrode MG, as shown in FIG. 32.

A method of forming the silicon dioxide film OX and the like are the same as in Embodiment 1 described above. In the same manner in Embodiment 1 described above, in Embodiment 3 also, in Step S13, the silicon dioxide film OX is formed so as to be embedded in the cavity CAV1. At the same time, the silicon dioxide film OX is also embedded in the cavity CAV2.

Figure 33:
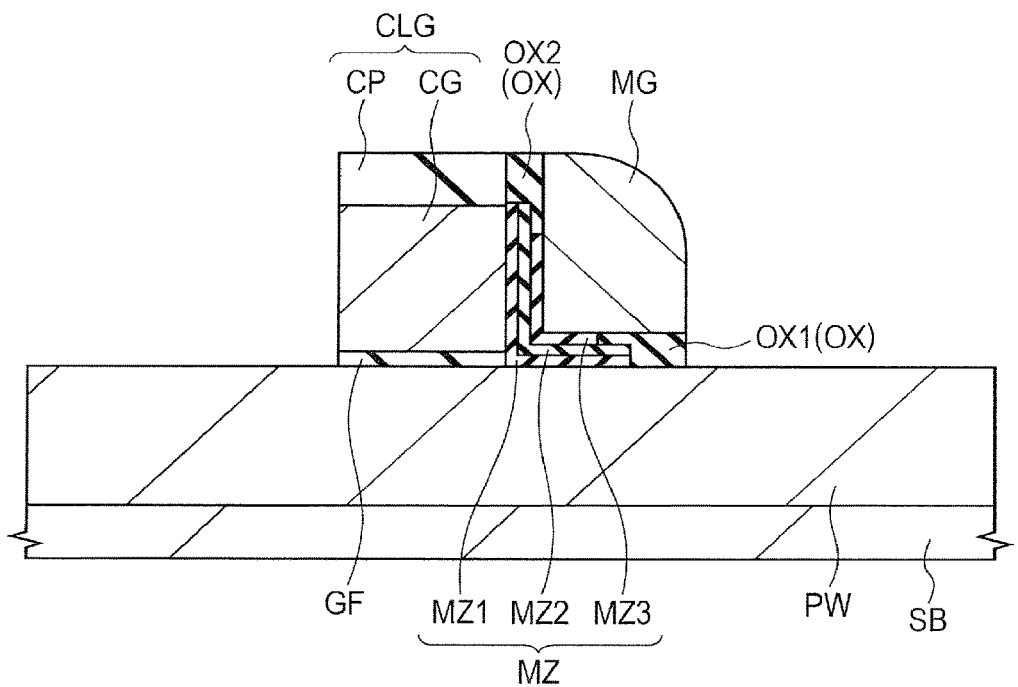
FIG. 33 is a main-portion cross-sectional view of the semiconductor device during the manufacturing process thereof, which is subsequent to FIG. 32.

Next, in Embodiment 3 also, Step S14 described above is performed to remove the exposed portion of the silicon dioxide film OX which is uncovered with the memory gate electrode MG by etching, as shown in FIG. 33.

Note that, in the case of Embodiment 3, the portion of the insulating film MZ1 which was uncovered with the memory gate electrode MG has already been removed in the etching step in FIG. 31. Consequently, in the etching in Step S14, even when the silicon dioxide film OX is etched, the insulating film MZ1 is not exposed and therefore need not be etched.

In the etching step in Step S14, the exposed portion of the silicon dioxide film OX which is uncovered with the memory gate electrode MG is etched and removed, while the portion of the silicon dioxide film OX which is embedded in the cavities CAV1 and CAV2 is not removed but remains. The remaining silicon dioxide film OX embedded in the cavity CAV1 between the memory gate electrode MG and the semiconductor substrate SB serves as the silicon dioxide film OX1. The remaining silicon dioxide film OX embedded in the cavity CAV2 between the memory gate electrode MG and the control gate CLG serves as the silicon dioxide film OX2.

Then, the step of forming the n$^-$-type semiconductor regions EX1 and EX2 in Step S15 described above and the process steps subsequent thereto are performed. However, the depiction and repeated description thereof is omitted herein.

In Embodiment 3, in addition to the effect obtained in Embodiment 1 described above, the following effect can further be obtained.

That is, in Embodiment 3, between the lower surface KM1 of the memory gate electrode MG and the semiconductor substrate SB, the end portion T3a of the insulating film MZ3 is located closer to the side surface SM1 than the end portion T2a of the insulating film MZ2. This provides a state where, between the lower surface KM1 of the memory gate electrode MG and the semiconductor substrate SB, the silicon dioxide film OX1 overlaps a part of the insulating film MZ2. As a result, it is possible to allow a further improvement in the performance of the semiconductor device having the nonvolatile memory, such as an improvement in the charge retaining property of the memory cell. The following is a description thereof.

As the insulating film MZ3, a silicon oxynitride film is used. This is because, as described above, in the case of using the silicon oxynitride film as the insulating film MZ3, electrons are more easily caused to tunnel through the insulating film MZ3 and injected from the memory gate electrode MG into the insulating film MZ2 during the erase operation than in the case of using the silicon dioxide film as the insulating film MZ3.

However, in terms of improving the charge retaining property (retention property) of the memory cell, it is desirable that the energy barrier in the charge block layer located closer to the memory gate electrode MG is high. Therefore, it is desirable that the band gap of the charge block layer located closer to the gate electrode is big. This is because, when the energy barrier in the charge block layer located closer to the memory gate electrode MG is low, a phenomenon in which the charges retained in the charge storage layer move into the memory gate electrode MG is likely to occur to degrade the charge retaining property of the memory cell.

Accordingly, it is desirable to lower the energy barrier in the charge block layer to a degree in a path for hole injection from the memory gate electrode MG into the charge storage layer during the erase operation. However, in the region which does not serve as a path for hole injection, the energy barrier in the charge block layer need not be lowered in consideration of hole injection. When the energy barrier in the charge block layer is low, a concern arises that the charge retaining property may deteriorate.

As described above, during the erase operation, holes are injected from the memory gate electrode MG into the charge storage layer along the path shown by the arrow YG1 in FIG. 23 described above. That is, the holes are injected from the corner portion formed by the lower surface KM1 and the side surface SM1 of the memory gate electrode MG into the charge storage layer (insulating film MZ2) by tunneling through the charge block layer interposed between the memory gate electrode MG and the charge storage layer (insulating film MZ2). Consequently, in the vicinity of the corner portion formed by the lower surface KM1 and the side surface SM1 of the memory gate electrode MG, the charge block layer serves as a path for hole injection during the erase operation. Accordingly, it is desirable that the energy barrier in the charge block layer is lower and the charge block layer is made of a silicon oxynitride film. However, in a region away from the corner portion formed by the lower surface KM1 and the side surface SM1 of the memory gate electrode MG, the charge block layer does not serve as a path for hole injection during the erase operation. Accordingly, the energy barrier in the charge block layer is higher and therefore the charge block layer is made of a silicon dioxide film. On the other hand, when the area of the insulating film MZ2 as the charge storage layer is excessively small, the quantity of charges that can be stored therein is small. Therefore, it is desirable to ensure a sufficiently large area for the insulating film MZ2.

Accordingly, in Embodiment 3, between the lower surface KM1 of the memory gate electrode MG and the semiconductor substrate SB, the end portion T3a of the insulating film MZ3 is located closer to the side surface SM1 (i.e., closer to the corner portion formed by the lower surface KM1 and the side surface SM1 of the memory gate electrode MG) than the end portion T2a of the insulating film MZ2. In other words, the end portion T2a of the insulating film MZ2 is located closer to the side surface SM2 (i.e., further away from the corner portion formed by the lower surface KM1 and the side surface SM1 of the memory gate electrode MG) than the end portion T3a of the insulating film MZ3.

Since the end portion T2a of the insulating film MZ2 as the charge storage layer is located closer to the side surface SM2 than the end portion T3a of the insulating film MZ3, between the lower surface KM1 of the memory gate electrode MG and the semiconductor substrate SB, a sufficiently large area can be ensured for the insulating film MZ2 as the charge storage layer. This can increase the quantity of charges that can be stored in the insulating film MZ2 and thus improve the performance of the nonvolatile memory. For example, it is possible to increase the difference between the threshold voltages of the memory transistor in the written state and in the erased state.

Since the end portion T3a of the insulating film MZ3 is located closer to the side surface SM1 than the end portion T2a of the insulating film MZ2, a state is achieved in which, between the lower surface KM1 of the memory gate electrode MG and the semiconductor substrate SB, the silicon dioxide film OX1 overlaps a part of the insulating film MZ2. As a result, in the region where the silicon dioxide film OX1 overlaps the insulating film MZ2, the silicon dioxide film OX1 functions as the charge block layer. The silicon dioxide film OX1 has a band gap larger than that of the silicon oxynitride film (insulating film MZ3) and therefore has an energy barrier higher than that thereof. Accordingly, in the region where the silicon dioxide film OX1 overlaps the insulating film MZ2, it is possible to inhibit or prevent the occurrence of a phenomenon in which the charges retained in the insulating film MZ2 as the charge storage layer move through the silicon dioxide film OX1 into the memory gate electrode MG. This can improve the charge retaining property of the memory cell.

Also, in the region where the insulating film MZ3 overlaps the insulating film MZ2, the insulating film MZ3 made of a silicon oxynitride film functions as the charge block layer. The insulating film MZ3 made of the silicon oxynitride film has a band gap smaller than that of the silicon dioxide film (OX1) and therefore has an energy barrier lower than that thereof. Accordingly, holes are more easily injected from the corner portion formed by the lower surface KM1 and the side surface SM1 of the memory gate electrode MG into the insulating film MZ2 by tunneling through the insulating film MZ3. This can improve the erase property.

That is, for the charge storage layer (insulating film MZ2), a sufficiently large area is ensured to increase the quantity of charges that can be stored therein. On the other hand, of the charge block layer interposed between the charge storage layer and the memory gate electrode MG, the portion which serves as a path for hole injection during the erase operation is formed of the silicon oxynitride film (insulating film MZ3) to have a lower energy barrier and the portion which does not serve as a path for hole injection during the erase operation is formed of the silicon dioxide film (OX1) to have a lower energy barrier. This can be achieved by locating the end portion T3a of the insulating film MZ3 closer to the side surface SM1 than the end portion T2a of the insulating film MZ2 between the lower surface KM1 of the memory gate electrode MG and the semiconductor substrate SB and thus providing a state in which the silicon dioxide film OX1 overlaps a part of the insulating film MZ2, as achieved in Embodiment 3. As a result, it is possible to further improve the performance of the semiconductor device having the nonvolatile memory.

The silicon dioxide film (OX1) is less likely to deteriorate than the silicon oxynitride film (insulating film MZ3). Accordingly, in Embodiment 3, between the lower surface KM1 of the memory gate electrode MG and the semiconductor substrate SB, the end portion T3a of the insulating film MZ3 is located closer to the side surface SM1 than the end portion T2a of the insulating film MZ2. By thus reducing the dimension (corresponding to a length L4 described later) of the insulating film MZ3 and accordingly increasing the dimension of the silicon dioxide film OX1, the effect of suppressing the degradation of the insulating film MZ3 can also be obtained.

In Embodiment 3 also, in the same manner as in Embodiment 1 described above, in the gate length direction of the memory gate electrode MG, the distance L1 from the end portion T6 of the lower surface KM1 of the memory gate electrode MG to the end portion T2a of the insulating film MZ2 is preferably not less than 5 nm.

Also, in Embodiment 3, in the gate length direction of the memory gate electrode MG, the length (dimension) L2 of the portion of the insulating film MZ2 which is located between the lower surface KM1 of the memory gate electrode MG and the semiconductor substrate SB is preferably set to about 15 to 30 nm. This allows electrons to be reliably injected from the semiconductor substrate SB into the insulating film MZ2 along the path shown by the arrow YG2 in FIG. 23 described above during the write operation. This also allows holes to be reliably injected from the memory gate electrode MG into the insulating film MZ2 along the path shown by the arrow YG1 in FIG. 23 described above during the erase operation. In addition, it is also possible to reliably ensure a sufficient quantity of charges that can be stored in the insulating film MZ2.

In the gate length direction of the memory gate electrode MG, a distance L3 from the end portion T1a of the insulating film MZ3 to the end portion T2a of the insulating film MZ2 is preferably not less than 5 nm. Note that the distance L3 is a distance in the gate length direction of the memory gate electrode MG and shown in FIG. 29. The distance L3 can also be regarded as the dimension of the portion of the insulating film MZ2 which is uncovered with the insulating film MZ3 in the gate length of the memory gate electrode MG. By setting the distance L3 to 5 nm or more, it is possible to set the dimension (dimension in the gate length direction) of the portion of the insulating film MZ2 which is covered with the silicon dioxide film OX1 to 5 nm or more and therefore reliably improve the charge retaining property of the memory cell.

In the gate length direction of the memory gate electrode MG, the length (dimension) L4 of the portion of the insulating film MZ3 which is located between the lower surface KM1 of the memory gate electrode MG and the semiconductor substrate SB is preferably set to about 10 to 20 nm. This allows the charge block layer in a path for hole injection during the erase operation to be configured of the insulating film MZ3 made of the silicon oxynitride film and can thus reliably improve the erase property. Note that the length L4 is a dimension in the gate length direction of the memory gate electrode MG and shown in FIG. 29. The length L4 can also be regarded as the dimension (dimension in the gate length direction of the memory gate electrode MG) of the region of the memory gate electrode MG which overlaps the insulating film MZ3 in plan view. The sum (L1+L2) of the distance L1 and the length L2 corresponds to the gate length of the memory gate electrode MG. The sum (L1+L3+L4) of the distances L1 and L3 and the length L4 also corresponds to the gate length of the memory gate electrode MG. Each of the lengths L2 and L4 is smaller than the gate length of the memory gate electrode MG.

Between the lengths L2 and L4 and the distance L3, the relationship given by L2=L3+L4 is established. In Embodiment 1 described above, the lengths L4 and L2 are substantially the same (i.e., L4=L2 and L3=0 are satisfied). By contrast, in the case of Embodiment 3, the length L4 is smaller than the length L2 (i.e., L4<L2, L3>0 are satisfied).

On the other hand, in the case of Embodiment 1 described above, between the lower surface KM1 of the memory gate electrode MG and the semiconductor substrate SB, the position of the end portion T2a of the insulating film MZ2 substantially corresponds to (is substantially aligned with) the position of the end portion T3a of the insulating film MZ3. As a result, between the lower surface KM1 of the memory gate electrode MG and the semiconductor substrate SB, the entire upper surface of the insulating film MZ2 is covered with the insulating film MZ3 and the silicon dioxide film OX1 is barely in contact with the upper surface of the insulating film MZ2. In this case, after the insulating film MZ is formed in Step S7, the top surface (upper surface) of the portion of the insulating film MZ2 which is to serve as the charge storage layer can retain the state covered with the insulating film MZ3. Therefore, it is possible to inhibit or prevent the insulating film MZ2 which is to serve as the charge storage layer from being damaged by a cleaning step or the like. This can enhance the reliability of the insulating film MZ2 as the charge storage layer and thus improve the reliability of the semiconductor device including the nonvolatile memory.

(Embodiment 4)

Figure 34:
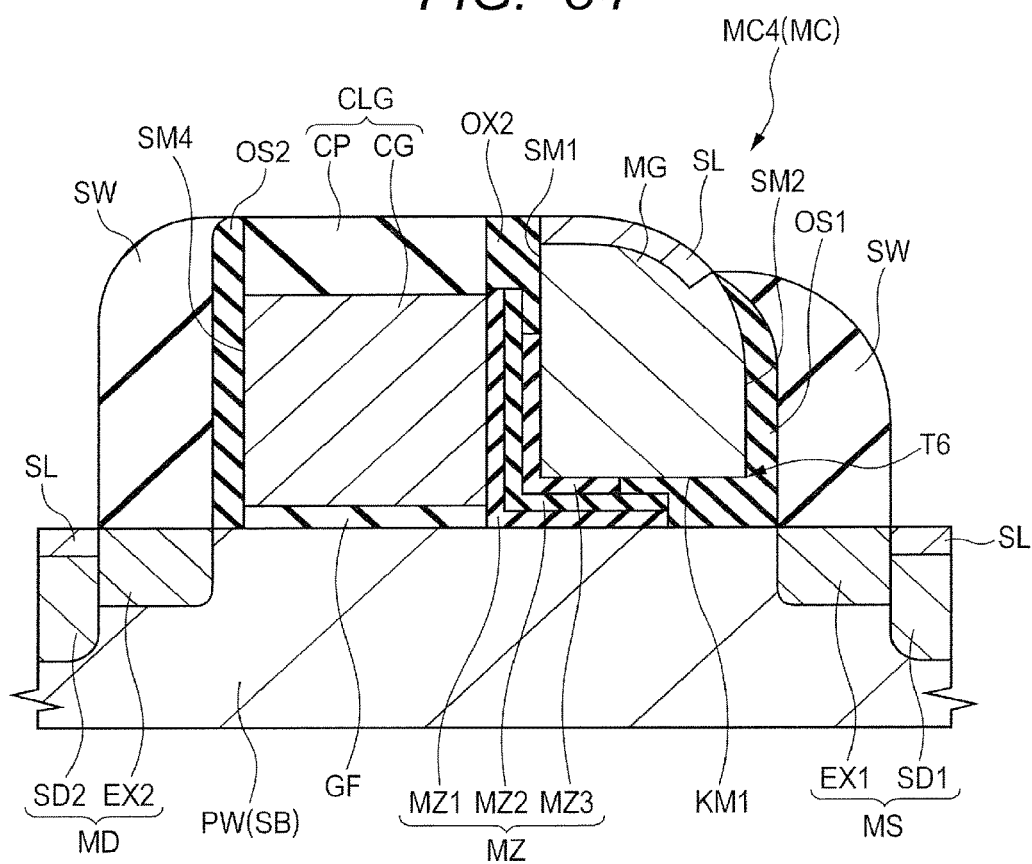
FIG. 34 is a main-portion cross-sectional view of a semiconductor device as yet another embodiment.

FIG. 34 is a main-portion cross-sectional view of a semiconductor device in Embodiment 4. FIG. 34 corresponds to FIG. 2 described above and showing Embodiment 1 described above, which shows a partially enlarged cross-sectional view of the memory cell MC. The memory cell MC in Embodiment 4 will be hereinafter referred to as a memory cell MC4.

Embodiment 4 results from the application of the technical idea of Embodiment 2 described above to the memory cell MC3 in Embodiment 3 described above. Accordingly, the difference between the memory cell MC in Embodiment 1 described above and the memory cell MC2 in Embodiment 2 described above corresponds to the difference between the memory cell MC3 in Embodiment 3 described above and the memory cell MC4 in Embodiment 4. From another viewpoint, the difference between the memory cell MC in Embodiment 1 described above and the memory cell MC3 in Embodiment 3 described above corresponds to the difference between the memory cell MC2 in Embodiment 2 described above and the memory cell MC4 in Embodiment 4.

To put is briefly, the memory cell MC4 in Embodiment 4 is different from the memory cell MC3 in Embodiment 3 described above in the following point.

As shown in FIG. 34, in the memory cell MC4 in Embodiment 4, in the same manner as in Embodiment 2 described above, the sidewall spacer SW is formed over the side surface SM2 of the memory gate electrode MG via the offset spacer OS1 and the sidewall spacer SW is formed over the side surface SM4 of the control gate CLG via the offset spacer OS2.

In Embodiment 4 also, in the same manner as in Embodiment 2 described above, an equivalent to the silicon dioxide film OX1 in Embodiment 3 described above is configured of a part of the offset spacer OS1. That is, in Embodiment 4, between the lower surface KM1 of the memory gate electrode MG and the semiconductor substrate SB, in the region where the insulating film MZ has not been formed (placed), a part of the offset spacer OS1 is embedded. In the same manner as in Embodiment 2 described above, in Embodiment 4 also, the offset spacer OS1 is formed of a silicon dioxide film. Accordingly, between the lower surface KM1 of the memory gate electrode MG and the semiconductor substrate SB, the silicon dioxide film (portion thereof equivalent to the foregoing silicon dioxide film OX1) embedded in the region where the insulating film MZ is not formed is formed integrally with the offset spacer OS1.

The film included in the offset spacer OS1 differs depending on the manufacturing method. In Embodiment 4, the offset spacer OS2 is made of a silicon dioxide film in the same layer as that of the offset spacer OS1.

In the same manner as in Embodiment 2 described above, in Embodiment 4 also, the $n^-$-type semiconductor region EX1 is formed by self-alignment with the side surface (side surface opposite to the side surface in contact with the memory gate electrode MG) of the offset spacer OS1 and the $n^-$-type semiconductor region EX2 is formed by self-alignment with the side surface (side surface opposite to the side surface in contact with the control gate CLG) of the offset spacer OS2.

The configuration of the memory cell MC4 in Embodiment 4 is otherwise substantially the same as that of the memory cell MC3 in Embodiment 3 described above.

Figure 35:
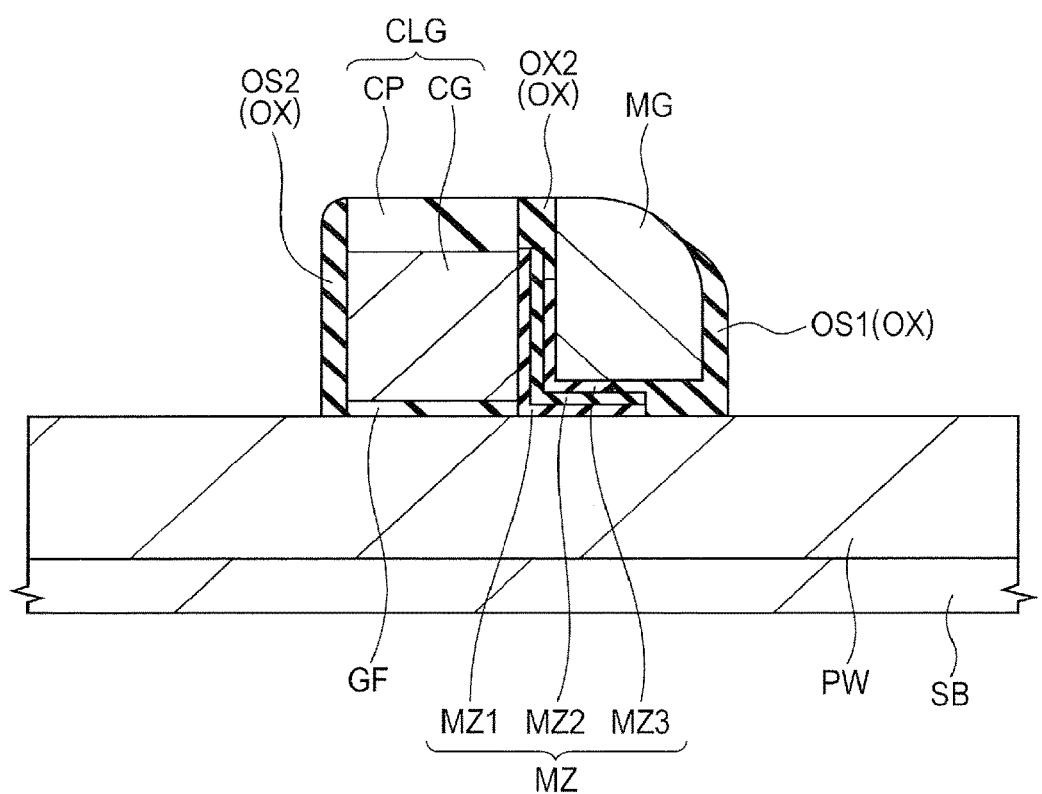
FIG. 35 is a main-portion cross-sectional view of the semiconductor device in the yet other embodiment during the manufacturing process thereof.

Next, a description will be given of the manufacturing process of the semiconductor device in Embodiment 4 with reference to FIG. 35. FIG. 35 is a main-portion cross-sectional view of the semiconductor device in Embodiment 4 during the manufacturing process thereof.

The manufacturing process of the semiconductor device in Embodiment 4 is the same as in Embodiment 3 described above until the structure in FIG. 32 described above is obtained by performing the step of forming the silicon dioxide film OX. Accordingly, a repeated description thereof is omitted herein and a description will be given of the process steps subsequent thereto.

In Embodiment 4 also, in the same manner as in Embodiment 3 described above, the manufacturing process is performed up to the step of forming the silicon dioxide film OX to provide the structure in FIG. 32 described above. Then, as shown in FIG. 35, the silicon dioxide film OX and the insulating film MZ1 are anisotropically etched.

Thus, in Embodiment 4, the silicon dioxide film OX is etched back by anisotropic etching. As a result, the silicon dioxide film OX remains over the side surface SM2 of the memory gate electrode MG to form the offset spacer OS1, while the insulating film MZ1 and the silicon dioxide film OX remain over the side surface SM4 of the control gate CLG to form the offset spacer OS2. Since the silicon dioxide film OX has been formed so as to be embedded in the cavities CAV1 and CAV2, the silicon dioxide film OX1 remains in the cavities CAV1 and CAV2 to provide a state in which a part of the silicon dioxide film included in the offset spacer OS1 is embedded in the cavity CAV1. The silicon dioxide film OX also remains in the cavity CAV2 to be able to form the silicon dioxide film OX2 embedded in the cavity CAV2. The silicon dioxide film OX is removed from the other region by anisotropic etching.

The subsequent process steps are basically the same as in Embodiment 3 described above. Step S15 (step of forming the n⁻-type semiconductor regions EX1 and EX2) described above and the process steps subsequent thereto are performed, but the depiction and repeated description thereof is omitted herein.

In Embodiment 4, the equivalent to the silicon dioxide film OX1 in Embodiment 3 described above can be formed simultaneously when the offset spacer OS1 is formed. As a result, in addition to the effect obtained in embodiment 3 described above, the effect of being able to reduce the number of the steps in the manufacturing process of the semiconductor device can further be obtained.

On the other hand, in the case of Embodiment 3 described above, the silicon dioxide film OX does not serve also as the insulating film for forming the offset spacers OS1 and OS2. Accordingly, the formed film thickness of the silicon dioxide film OX need not be set to a film thickness appropriate for the offset spacers and can be set to a film thickness appropriate to embed the silicon dioxide film OX in the cavity CAV1. This allows easy formation of the silicon dioxide film OX to be embedded in the cavity CAV1.

(Embodiment 5)

Figure 36:
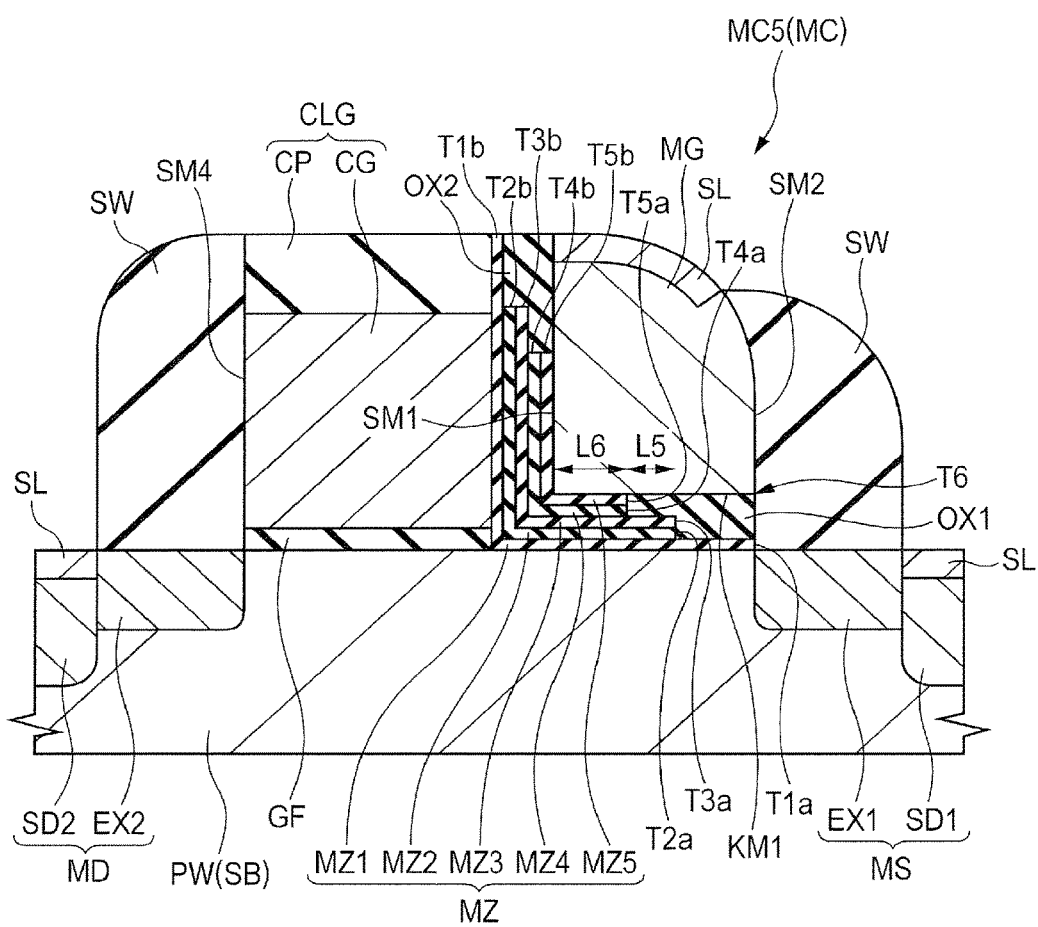
FIG. 36 is a main-portion cross-sectional view of a semiconductor device as still another embodiment.

FIG. 36 is a main-portion cross-sectional view of a semiconductor device in Embodiment 5. FIG. 36 corresponds to FIG. 2 described above in Embodiment 1 described above and shows a partially enlarged cross-sectional view of the memory cell MC. The memory cell MC in Embodiment 5 will be hereinafter referred to as a memory cell MC5.

A description will be given of the memory cell MC5 in Embodiment 5 with a focus on the difference from the memory cell MC in Embodiment 1 described above.

In the memory cell MC in Embodiment 1 described above, the insulating film MZ is formed of a multi-layer film including the insulating films MZ1, MZ2, and MZ3. By contrast, in the memory cell MC5 in Embodiment 5, the insulating film MZ is made of a multi-layer film including the insulating film MZ1, the insulating film MZ2 formed over the insulating film MZ1, the insulating film MZ3 formed over the insulating film MZ2, an insulating film MZ4 formed over the insulating film MZ3, and an insulating film MZ5 formed over the insulating film MZ4.

In the same manner as in Embodiment 1 described above, in Embodiment 5 also, the insulating film MZ1 is made of a silicon dioxide film (oxide film), the insulating film MZ2 is made of a silicon nitride film (nitride film), and the insulating film MZ3 is made of a silicon oxynitride film (oxynitride film). Also, the insulating film MZ4 is made of a silicon nitride film (nitride film) and the insulating film MZ5 is made of a silicon dioxide film (oxide film). In the same manner as in Embodiment 1 described above, in Embodiment 5 also, in the insulating film MZ, the insulating film MZ2 functions as a charge storage film and the insulating film MZ1 functions as a charge block layer between the charge storage film (insulating film MZ2) and the semiconductor substrate SB. In Embodiment 1 described above, the insulating film MZ3 functions as the charge block layer between the charge storage film (insulating film MZ2) and the memory gate electrode MG. On the other hand, in Embodiment 5, the multi-layer film including the insulating films MZ3, MZ4, and MZ5 functions as a charge block layer between the charge storage film (insulating film MZ2) and the memory gate electrode MG.

Note that, in the insulating film MZ made of the multi-layer insulating film, the insulating film functioning as the charge block layer between the memory gate electrode MG and the charge storage layer (insulating film MZ2) is hereinafter referred to as a top insulating film. In Embodiments 1 to 4 described above, the top insulating film is the single-layer insulating film MZ3 while, in Embodiment 5, the top insulating film is configured of the multi-layer insulating film including the plurality of insulating films. In Embodiment 5, the description has been given of the case where the top insulating film is configured of the multi-layer film including three layers (insulating films MZ3, MZ4, and MZ5). However, in another form, there may also be a case where the top insulating film is configured of a multi-layer film including two layers or a multi-layer film including four or more layers. For example, there may also be a case where the insulating film MZ5 is omitted in the memory cell MC5 in Embodiment 5. Alternatively, there may also be a case where, in the memory cell MC5 in Embodiment 5, over the insulating film MZ5, i.e., between the insulating film MZ5 and the memory gate electrode MG, another insulating film is further formed.

In the case where, as in Embodiments 1 to 4 described above, the single-layer insulating film (MZ3) is used as a top insulating film, a silicon oxynitride film is used as the insulating film (MZ3). This is for allowing holes to be easily injected from the memory gate electrode MG into the charge storage film (insulating film MZ2) by tunneling through the top insulating film during the erase operation, as described above.

When the multi-layer film including the plurality of insulating films is used as the top insulating film, the multi-layer film includes a silicon oxynitride film and more preferably includes a silicon oxynitride film adjacent to the charge storage film (insulating film MZ2). This allows holes to be easily injected from the memory gate electrode MG into the charge storage film (insulating film MZ2) by tunneling through the multi-layer film during the erase operation. Accordingly, in the case of Embodiment 5, the top insulating film includes a silicon oxynitride film (insulating film MZ3) adjacent to the charge storage film (insulating film MZ2).

Also, in the memory cell MC5 in Embodiment 5, between the lower surface KM1 of the memory gate electrode MG and the semiconductor substrate SB, the end portion T2a of the insulating film MZ2, the end portion T3a of the insulating film MZ3, an end portion T4a of the insulating film MZ4, and an end portion T5a of the insulating film MZ5 are located closer to the side surface SM1 than the end portion T6 of the lower surface KM1 of the memory gate electrode MG. In addition, between the lower surface KM1 of the memory gate electrode MG and the semiconductor substrate SB, in the region where the insulating film MZ is not formed, the silicon dioxide film OX1 is embedded.

It follows therefore that, in each of Embodiments 1 to 5, between the lower surface KM1 of the memory gate electrode MG and the semiconductor substrate SB, the insulating film MZ and the silicon dioxide film OX1 are interposed. It also follows that, in each of Embodiments 1 to 5, in the insulating film MZ between the lower surface KM1 of the memory gate electrode MG and the semiconductor substrate SB, the end portion of the charge storage film and the end portion of the top insulating film are located closer to the side surface SM1 than the end portion T6 of the lower surface KM1 of the memory gate electrode MG.

In the same manner as in Embodiment 1 described above, in Embodiment 5 also, between the lower surface KM1 of the memory gate electrode MG and the semiconductor substrate SB, the position of the end portion T2a of the insulating film MZ2 substantially corresponds to (is substantially aligned with) the position of the end portion T3a of the insulating film MZ3. As a result, between the lower surface KM1 of the memory gate electrode MG and the semiconductor substrate SB, the entire upper surface of the insulating film MZ2 is covered with the insulating film MZ3.

In Embodiment 5, between the lower surface KM1 of the memory gate electrode MG and the semiconductor substrate SB, the end portion T4a of the insulating film MZ4 is located closer to the side surface SM1 than the end portions T2a and T3a of the insulating films MZ2 and MZ3. Also, between the lower surface KM1 of the memory gate electrode MG and the semiconductor substrate SB, the position of the end portion T4a of the insulating film MZ4 substantially corresponds to (is substantially aligned with) the position of the end portion T5a of the insulating film MZ5. Accordingly, the end portion T5a of the insulating film MZ5 is located closer to the side surface SM1 than the end portions T2a and T3a of the insulating films MZ2 and MZ3.

Thus, in Embodiment 5, between the lower surface KM1 of the memory gate electrode MG and the semiconductor substrate SB, the silicon dioxide film OX1 is embedded even in the region over the insulating film MZ3 where the insulating films MZ4 and MZ5 are not formed. This provides a state where the silicon dioxide film OX1 is present over a part of the insulating film MZ2. Consequently, in Embodiment 5, between the lower surface KM1 of the memory gate electrode MG and the semiconductor substrate SB, the silicon dioxide film OX1 overlaps a part of the insulating film MZ2. However, in Embodiment 5, it is preferable that the silicon dioxide film OX1 is not in contact with the upper surface of the insulating film MZ2 and the insulating film MZ3 is interposed between the silicon dioxide film OX1 and the upper surface of the insulating film MZ2. On the other hand, in Embodiment 3 described above, the portion of the silicon dioxide film OX1 which is overlapped by the insulating film MZ2 is in contact with the upper surface of the insulating film MZ2.

Also, in Embodiment 5, between the lower surface KM1 of the memory gate electrode MG and the semiconductor substrate SB, the position of the end portion T1a of the insulating film MZ1 substantially corresponds to (is substantially aligned with) the end portion T6 of the lower surface KM1 of the memory gate electrode MG. However, in another form, there may also be a case where the end portion T1a of the insulating film MZ1 is located closer to the side surface SM1 than the end portion T6 of the lower surface KM1 of the memory gate electrode MG.

In the memory cell MC5 in Embodiment 5 also, the respective end portions T1a, T2a, and T3a of the insulating films MZ1, MZ2, and MZ3 are located closer to the side surface SM2 than the corner portion formed by the lower surface KM1 and the side surface SM1 of the memory gate electrode MG. Consequently, in a part of the space between the lower surface KM1 of the memory gate electrode MG and the semiconductor substrate SB, the insulating films MZ1, MZ2, MZ3, MZ4, and MZ5 are present and, in the vicinity of the corner portion formed by the lower surface KM1 and the side surface SM1 of the memory gate electrode MG, the insulating films MZ1, MZ2, MZ3, MZ4, and MZ5 are present.

In the memory cell MC5 in Embodiment 5, between the memory gate electrode MG and the control gate CLG, the respective end portions T2b, T3b, T4b, and T5b of the insulating films MZ2, MZ3, MZ4, and MZ5 are located below the upper surface of the memory gate electrode MG. Also, between the memory gate electrode MG and the control gate CLG, the position of the end portion T2b of the insulating film MZ2 substantially corresponds to (is substantially aligned with) the position of the end portion T3b of the insulating film MZ3, the end portion T4b of the insulating film MZ4 is located below the end portion T3b of the insulating film MZ3, and the position of the end portion T4b of the insulating film MZ4 substantially corresponds to (is substantially aligned with) the position of the end portion T5b of the insulating film MZ5.

Between the memory gate electrode MG and the control gate CLG, in the region where the insulating film MZ is not formed, the silicon dioxide film OX2 is embedded. As a result, in Embodiment 5 also, between the memory gate electrode MG and the control gate CLG, the insulating film MZ and the silicon dioxide film OX are interposed.

Note that the end portions T4a and T4b of the insulating film MZ4 are end portions (end surfaces) located opposite to each other in the insulating film MZ4 and the end portions T5a and T5b of the insulating film MZ5 are end portions (end surfaces) located opposite to each other in the insulating film MZ5.

The configuration of the memory cell MC5 in Embodiment 5 is otherwise substantially the same as that of the memory cell MC in Embodiment 1 described above so that a repeated description thereof is omitted herein.

In Embodiment 5 also, the foregoing distance L1 and the foregoing length L2 can be set to be about the same as in Embodiment 1 described above. In the gate length direction of the memory gate electrode MG, a distance L5 from the end portion T3a of the insulating film MZ3 to the end portion T4a of the insulating film MZ4 can be set to, e.g., about 5 to 10 nm. Also, in the gate length direction of the memory gate electrode MG, a length (dimension) L6 of each of the respective portions of the insulating films MZ4 and MZ5 which are located between the lower surface KM1 of the memory gate electrode MG and the semiconductor substrate SB can be set to, e.g., about 10 to 20 nm.

Next, a description will be given of the manufacturing process of the semiconductor device in Embodiment 5 with reference to FIGS. 37 to 44. FIGS. 37 to 44 are main-portion cross-sectional views of the semiconductor device in Embodiment 5 during the manufacturing process thereof.

The manufacturing process of the semiconductor device in Embodiment 5 is the same as in Embodiment 1 described above until the structure in FIG. 9 described above is obtained by performing Step S6 (step of forming the control gate CLG) described above. Accordingly, a repeated description thereof is omitted herein and a description will be given of the process steps subsequent thereto.

Figure 37:
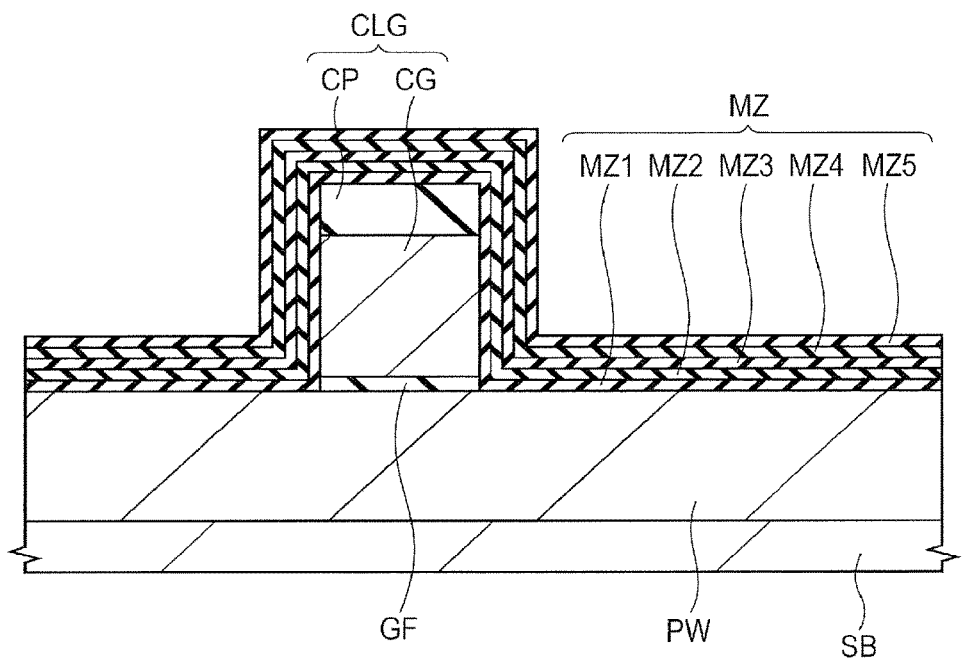
FIG. 37 is a main-portion cross-sectional view of the semiconductor device in the still other embodiment during the manufacturing process thereof.

In Embodiment 5 also, in the same manner as in Embodiment 1 described above, the manufacturing process is performed up to Step S6 (step of forming the control gate CLG) described above to provide the structure in FIG. 9 described above. Then, as shown in FIG. 37, a step equivalent to Step S7 described above is performed to form the insulating film MZ over the entire main surface of the semiconductor substrate SB, i.e., over the main surface (top surface) of the semiconductor substrate SB and over the surfaces (upper and side surfaces) of the control gate CLG.

In Embodiment 5, the insulating film MZ is made of a multi-layer film including the insulating film MZ1 made of a silicon dioxide film, the insulating film MZ2 made of a silicon nitride film, the insulating film MZ3 made of a silicon oxynitride film, the insulating film MZ4 made of a silicon nitride film, and the insulating film MZ5 made of a silicon dioxide film, which are successively stacked in ascending order.

Figure 38:
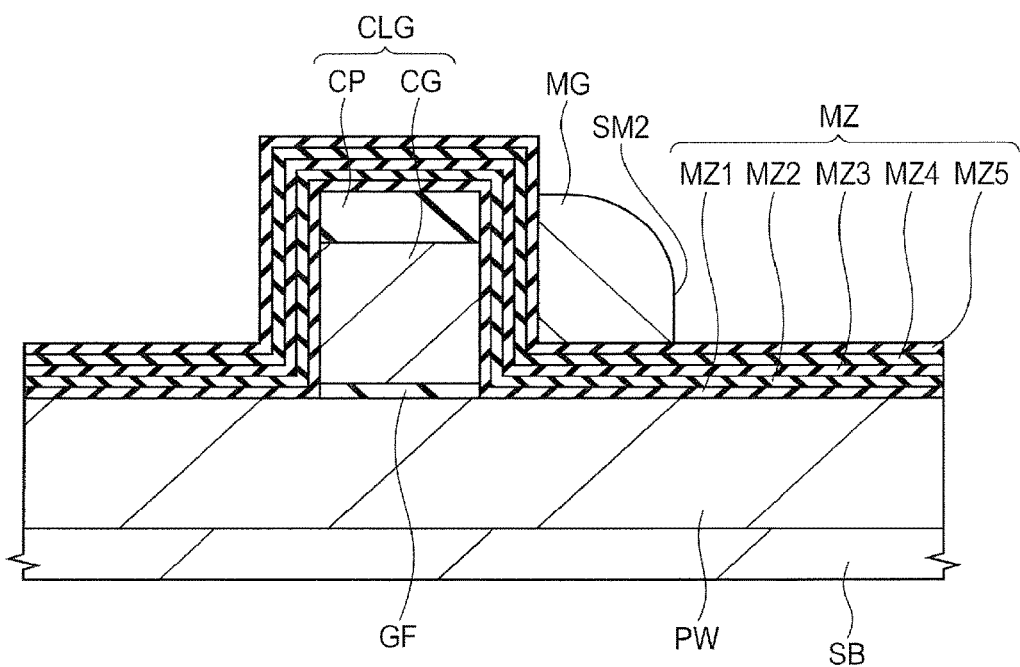
FIG. 38 is a main-portion cross-sectional view of the semiconductor device during the manufacturing process thereof, which is subsequent to FIG. 37.

Next, in the same manner as in Embodiment 1 described above, Step S8 (step of forming the silicon film PS2) described above, Step S9 (step of etching back the silicon film PS2) described above, and Step S10 (step of removing the silicon spacer SP) described above are performed. As a result, as shown in FIG. 38, a structure is obtained in which, over one of the both side surfaces of the control gate CLG, the memory gate electrode MG is formed via the insulating film MZ. The memory gate electrode MG is formed over the insulating film MZ so as to be adjacent to the control gate CLG via the insulating film MZ.

Figure 39:
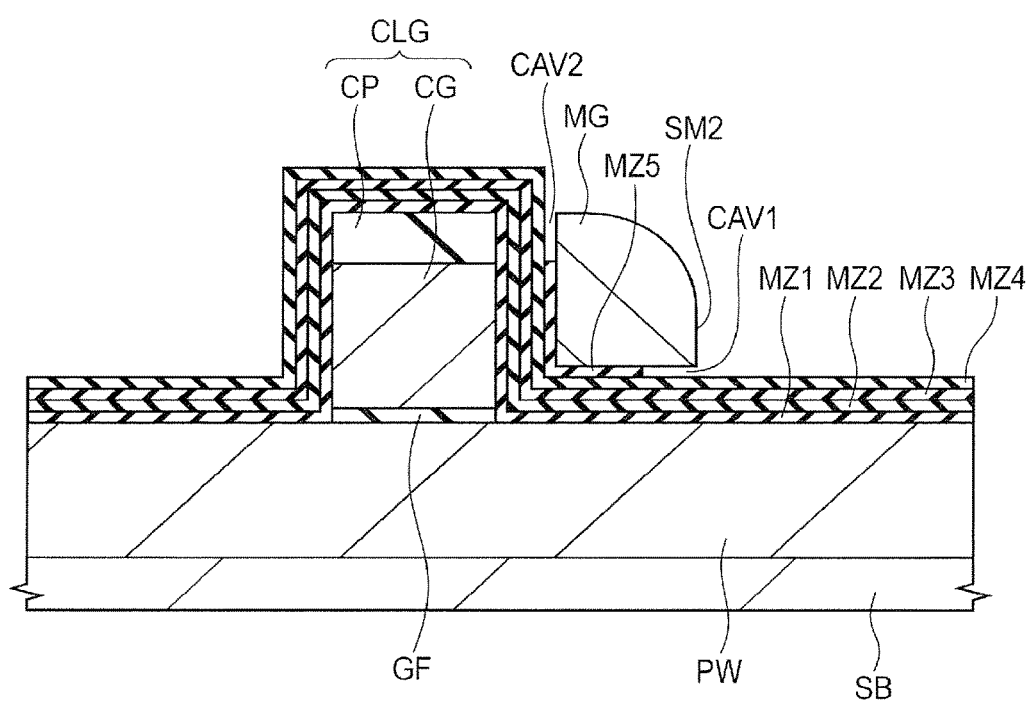
FIG. 39 is a main-portion cross-sectional view of the semiconductor device during the manufacturing process thereof, which is subsequent to FIG. 38.

Next, as shown in FIG. 39, the exposed portion of the insulating film MZ5 is removed by etching. In this etching step (hereinafter referred to as the etching step in FIG. 39), isotropic etching is performed and, preferably, wet etching is performed.

In the etching step in FIG. 39, it is preferable to use an etching solution with which the insulating film MZ5 is more likely to be etched and the memory gate electrode MG and the insulating film MZ4 are less likely to be etched than the insulating film MZ5. As an example of the etching solution, hydrofluoric acid or the like can be used appropriately.

In the etching step in FIG. 39, even after the exposed portion of the insulating film MZ5 which is uncovered with the memory gate electrode MG is etched and removed, the etching is continued for a predetermined period of time. As a result, the upper portion of the insulating film MZ5 located between the memory gate electrode MG and the control gate CLG is etched and a part of the insulating film MZ5 located between the memory gate electrode MG and the semiconductor substrate SB (p-type well PW) is side-etched.

Accordingly, when the etching step in FIG. 39 is performed, a state is achieved in which, between the lower surface of the memory gate electrode MG and the semiconductor substrate SB (p-type well PW), the end portion (T5a) of the insulating film MZ5 is recessed inwardly from (closer to the side surface SM1 than) the side surface SM2 of the memory gate electrode MG and the cavity CAV1 is formed under the memory gate electrode MG. In addition, a state is achieved in which, between the memory gate electrode MG and the control gate CLG, the end portion (T5b) of the insulating film MZ5 is recessed downwardly from the upper surface of the memory gate electrode MG and, between the memory gate electrode MG and the control gate CLG, the cavity CAV2 is formed. That is, immediately under the memory gate electrode MG, the portion from which the insulating film MZ5 has been removed serves as the cavity CAV1 and, between the memory gate electrode MG and the control gate CLG, the portion from which the insulating film MZ5 has been removed serves as the cavity CAV2.

Figure 40:
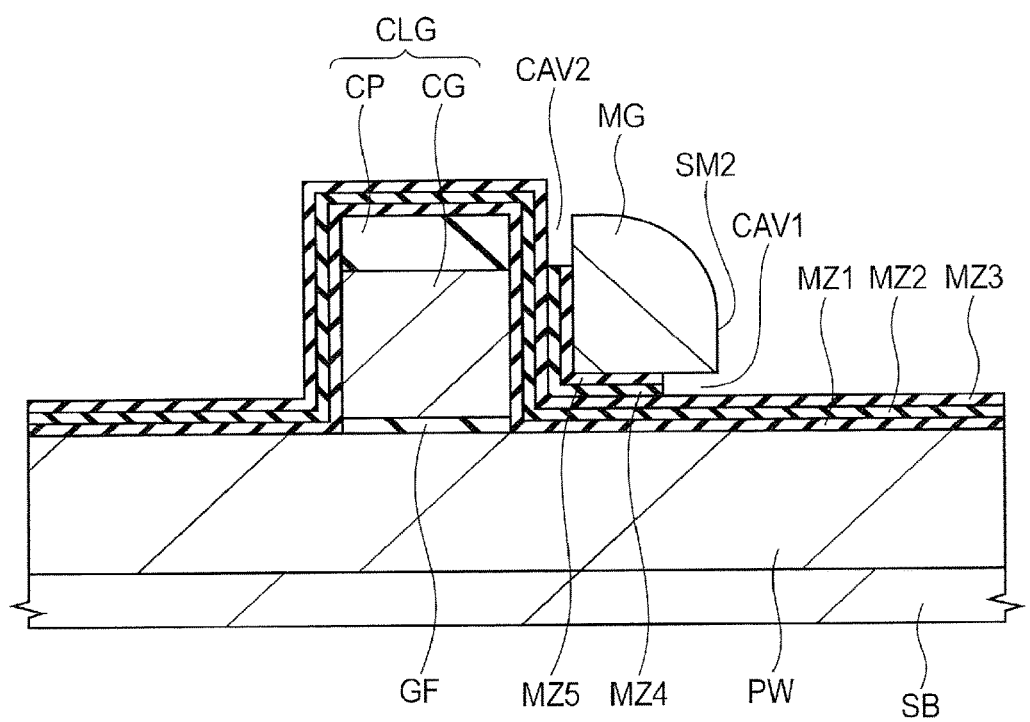
FIG. 40 is a main-portion cross-sectional view of the semiconductor device during the manufacturing process thereof, which is subsequent to FIG. 39.

Next, as shown in FIG. 40, the exposed portion of the insulating film MZ4 is removed by etching. In the etching step (hereinafter referred to as the etching step in FIG. 40), isotropic etching is performed and, preferably, wet etching is performed.

In the etching step in FIG. 40, it is preferable to use an etching solution with which the insulating film MZ4 is more likely to be etched and the memory gate electrode MG and the insulating films MZ3 and MZ5 are less likely to be etched than the insulating film MZ4. As an example of the etching solution, a hot phosphoric acid or the like can preferably be used.

In the etching step in FIG. 40, not only the exposed portion of the insulating film MZ4 which is uncovered with the memory gate electrode MG is etched and removed, but also the insulating film MZ4 exposed in the cavities CAV1 and CAV2 is also etched and removed. That is, in the etching step in FIG. 40, the exposed portion of the insulating film MZ4 which is uncovered with the insulating film MZ5 is etched and removed.

In the etching step in FIG. 40, the portion of the insulating film MZ2 which is covered with the insulating film MZ3 is not etched unless the etching time is excessively elongated. As a result, the position of the end portion of the insulating film MZ4 is substantially the same as the position of the end portion of the insulating film MZ5. When the etching step in FIG. 40 is performed, the cavities CAV1 and CAV2 are expanded accordingly due to the insulating film MZ4 that has been removed.

Figure 41:
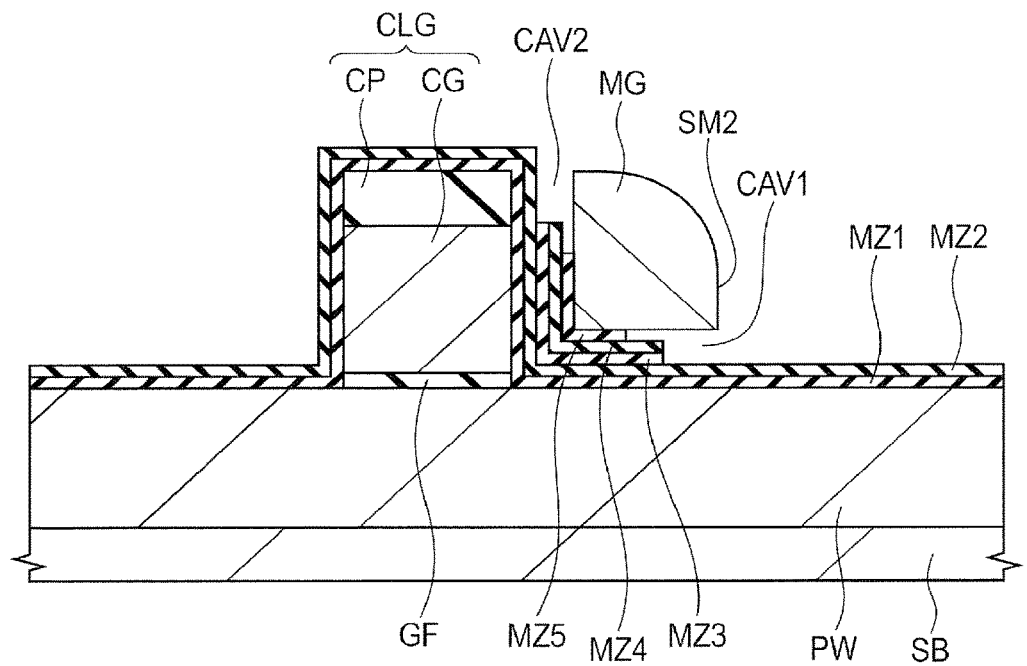
FIG. 41 is a main-portion cross-sectional view of the semiconductor device during the manufacturing process thereof, which is subsequent to FIG. 40.

Next, as shown in FIG. 41, the exposed portion of the insulating film MZ3 is removed by etching. In the etching step (hereinafter referred to as the etching step in FIG. 41), isotropic etching is performed and, preferably, wet etching is performed.

In the etching step in FIG. 41, it is preferable to use an etching solution with which the insulating film MZ3 is more likely to be etched and the memory gate electrode MG and the insulating film MZ2 are less likely to be etched than the insulating film MZ3. As an example of the etching solution, a hydrofluoric acid or the like can be used appropriately.

In the etching step in FIG. 41, not only the exposed portion of the insulating film MZ3 which is uncovered with the memory gate electrode MG is etched and removed, but also the insulating film MZ3 exposed in the cavities CAV1 and CAV2 is etched and removed. That is, in the etching step in FIG. 41, the exposed portion of the insulating film MZ3 which is uncovered with the insulating film MZ4 is etched and removed. As a result, the position of the end portion of the insulating film MZ3 is substantially the same as the position of the end portion of the insulating film MZ4.

However, in the etching step in FIG. 41, not only the insulating film MZ3 made of the silicon oxynitride film, but also the insulating film MZ5 made of the silicon dioxide film is etched (side-etched). That is, when the silicon oxynitride film is etched using a hydrofluoric acid or the like, the silicon nitride film is barely etched, while the silicon dioxide film may also be etched. Accordingly, when the insulating film MZ3 made of the silicon oxynitride film is etched, the insulating films MZ2 and MZ4 each made of the silicon nitride film are barely etched. However, since the end portion of the insulating film MZ5 made of the silicon dioxide film is exposed to the etching solution, the etching of the insulating film MZ5 proceeds from the end portion thereof to provide a state where the end portion of the insulating film MZ5 is retracted from the end portion of the insulating film MZ4. When the etching step in FIG. 41 is performed, the cavities CAV1 and CAV2 are expanded accordingly due to the insulating films MZ3 and MZ5 that have been removed.

Figure 42:
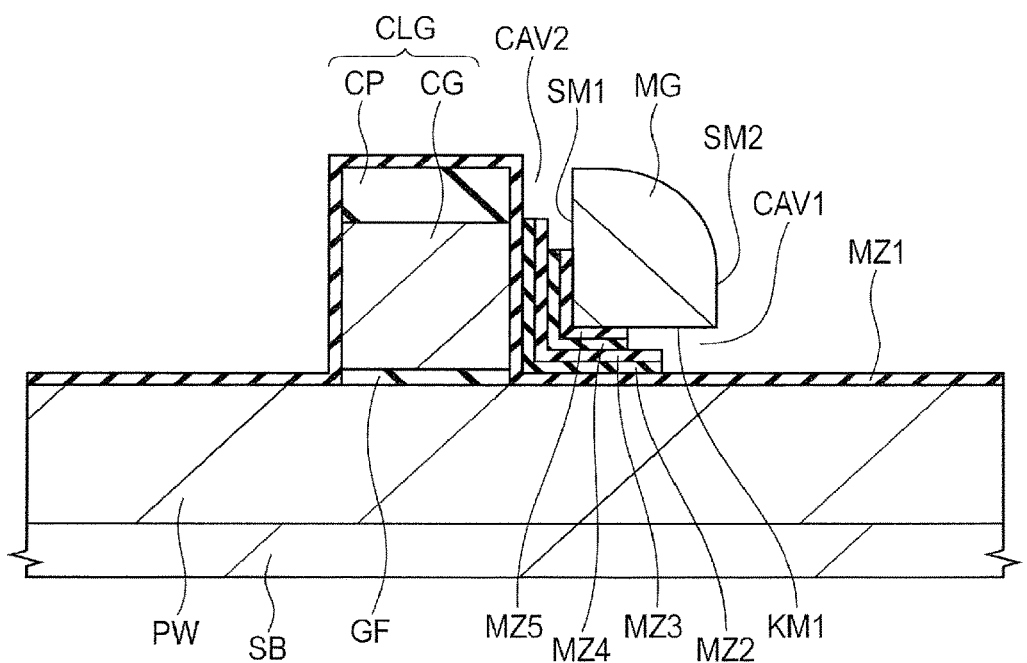
FIG. 42 is a main-portion cross-sectional view of the semiconductor device during the manufacturing process thereof, which is subsequent to FIG. 41.

Next, as shown in FIG. 42, the exposed portion of the insulating film MZ2 is removed by etching. In this etching step (hereinafter referred to as the etching step in FIG. 42), isotropic etching is performed and, preferably, wet etching is performed.

In the etching step in FIG. 42, it is preferable to use an etching solution with which the insulating film MZ2 is more likely to be etched and the memory gate electrode MG and the insulating films MZ1 and MZ3 are less likely to be etched than the insulating film MZ2. As an example of the etching solution, a hot phosphoric acid or the like can be used appropriately.

In the etching step in FIG. 42, not only the exposed portion of the insulating film MZ2 which is uncovered with the memory gate electrode MG is etched and removed, but also the insulating film MZ2 exposed in the cavities CAV1 and CAV2 is also etched and removed. That is, in the etching step in FIGS. 42, the exposed portion of the insulating film MZ2 uncovered with the insulating film MZ3 is etched and removed.

However, in the etching step in FIG. 42, not only the insulating film MZ2 made of the silicon nitride film, but also the insulating film MZ4 made of the silicon nitride film may be etched. That is, since the insulating films MZ2 and MZ4 are made of the same material (which is silicon nitride herein), when the insulating film MZ2 is etched in the etching step in FIG. 42, the portion of the insulating film MZ4 which is uncovered with the insulating film MZ5 is also etched and removed. As a result, in the etching step in FIG. 42, not only the portion of the insulating film MZ2 which is uncovered with the insulating film MZ3 is etched and removed, but also the portions of the insulating film MZ4 which are uncovered with the insulating film MZ5 and exposed in the cavities CAV1 and CAV2 are etched and removed. Accordingly, when the etching step in FIG. 42 is performed, the position of the end portion of the insulating film MZ2 is substantially the same as the position of the end portion of the insulating film MZ3 and the position of the end portion of the insulating film MZ4 is substantially the same as the position of the end portion of the insulating film MZ5. When the etching step in FIG. 42 is performed, the cavities CAV1 and CAV2 are expanded accordingly due to the insulating films MZ2 and MZ4 that have been removed.

Consequently, when the etching step in FIG. 39, the etching step in FIG. 40, the etching step in FIG. 41, and the etching step in FIG. 42 are performed, a state is achieved in which the respective end portions (T5a, T4a, T3a, and T2a) of the insulating films MZ5, MZ4, MZ3, and MZ2 which are located between the memory gate electrode MG and the semiconductor substrate SB are located inwardly of (closer to the side surface SM1 than) the side surface SM2 of the memory gate electrode MG. This provides a state in which, between the memory gate electrode MG and the semiconductor substrate SB, the respective end portions (T4a and T5a) of the insulating films MZ4 and MZ5 are located inwardly of (closer to the side surface SM1 than) the respective end portions (T2a and T3a) of the insulating films MZ2 and MZ3. Also, between the memory gate electrode MG and the semiconductor substrate SB, the position of the end portion (T2a) of the insulating film MZ2 substantially corresponds to (is substantially aligned with) the position of the end portion (T3a) of the insulating film MZ3, and the position of the end portion (T4a) of the insulating film MZ4 substantially corresponds to (is substantially aligned with) the position of the end portion (T5a) of the insulating film MZ5.

On the other hand, a state is achieved in which the respective end portions (T5b, T4b, T3b, and T2b) of the insulating films MZ5, MZ4, MZ3, and MZ2 which are located between the memory gate electrode MG and the control gate CLG are located below the upper surface of the memory gate electrode MG. This provides a state in which, between the memory gate electrode MG and the control gate CLG, the respective end portions (T4b and T5b) of the insulating films MZ4 and MZ5 are located under the respective end portions (T2b and T3b) of the insulating films MZ2 and MZ3. Also, between the memory gate electrode MG and the control gate CLG, the position of the end portion (T2b) of the insulating film MZ2 substantially corresponds to (is substantially aligned with) the position of the end portion (T3b) of the insulating film MZ3, and the position of the end portion (T4b) of the insulating film MZ4 substantially corresponds to (is substantially aligned with) the position of the end portion (T5b) of the insulating film MZ5.

In Embodiment 5 also, the subsequent process steps are basically the same as in Embodiment 1 described above.

Figure 43:
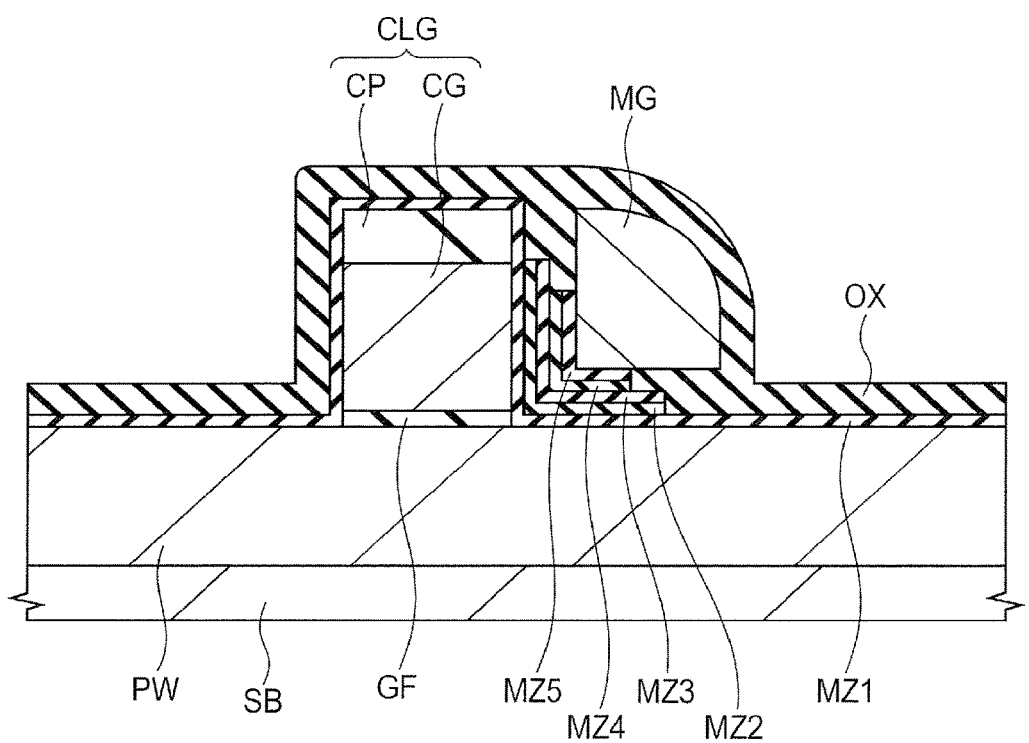
FIG. 43 is a main-portion cross-sectional view of the semiconductor device during the manufacturing process thereof, which is subsequent to FIG. 42.
Figure 44:
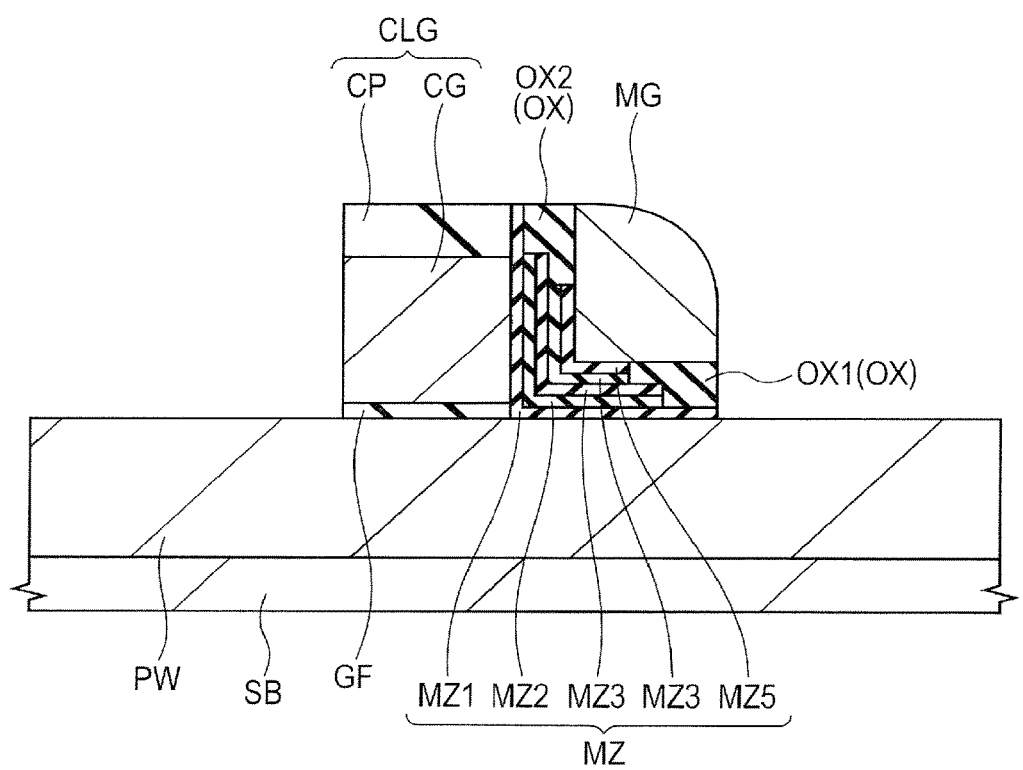
FIG. 44 is a main-portion cross-sectional view of the semiconductor device during the manufacturing process thereof, which is subsequent to FIG. 43.

That is, in Embodiment 5 also, Step S13 described above is performed to form the silicon dioxide film OX as an insulating film over the main surface (entire main surface) of the semiconductor substrate SB so as to cover the control gate CLG and the memory gate electrode MG, as shown in FIG. 43. In Embodiment 5 also, in the same manner as in Embodiment 1 described above, in Step S13, the silicon dioxide film OX is formed so as to be embedded in the cavity CAV1. At the same time, the silicon dioxide film OX is also embedded in the cavity CAV2.

Next, in Embodiment 5 also, Step S14 described above is performed to etch and remove the exposed portions of the silicon dioxide film OX and the insulating film MZ1 which are uncovered with the memory gate electrode MG.

In the etching step in Step S14, the exposed portion of the silicon dioxide film OX which is uncovered with the memory gate electrode MG is etched and removed, and the exposed portion of the insulating film MZ1 resulting from the removal of the silicon dioxide film OX is etched and removed. The portions of the silicon dioxide film OX which are embedded in the cavities CAV1 and CAV2 are not removed but remain. The remaining silicon dioxide film OX embedded in the cavity CAV1 between the memory gate electrode MG and the semiconductor substrate SB serves as the silicon dioxide film OX1. The remaining silicon dioxide film OX embedded in the cavity CAV2 between the memory gate electrode MG and the control gate CLG serves as the silicon dioxide film OX2.

Then, the step of forming the n⁻-type semiconductor regions EX1 and EX2 in Step S15 described above and the process steps subsequent thereto are performed. However, the depiction and repeated description thereof is omitted herein.

In Embodiment 5 also, in the same manner as in Embodiment 1, between the lower surface KM1 of the memory gate electrode MG and the semiconductor substrate SB, the end portion T2a of the insulating film MZ2 and the end portions (T3a, T4a, and T5a) of the top insulating film (including the insulating films MZ3, MZ4, and MZ5 herein) are located closer to the side surface SM1 than the end portion T6 of the lower surface KM1 of the memory gate electrode MG. Between the lower surface KM1 of the memory gate electrode MG and the semiconductor substrate SB, in the region where the insulating film MZ is not formed, the silicon dioxide film OX1 is embedded.

Consequently, between the lower surface KM1 of the memory gate electrode MG and the semiconductor substrate SB, in the region closer to the semiconductor region MS, the insulating film MZ2 (silicon nitride film) serving as the charge storage layer as well as the insulating film MZ3 made of the silicon oxynitride film and the insulating film MZ4 made of the silicon nitride film, in each of which charges may be stored, no longer exist. Instead, the silicon dioxide film is embedded therein. Accordingly, it is possible to inhibit or prevent a phenomenon in which, during the write operation, electrons are injected from the semiconductor substrate SB into the charge storage layer (insulating film MZ2) along the path shown by the arrow YG3 in FIG. 23 described above. It is also possible to inhibit or prevent a phenomenon in which electrons are injected from the semiconductor substrate SB into the silicon oxynitride film (insulating film MZ3) or the silicon nitride film (insulating film MZ4) in the top insulating film along the path shown by the arrow YG3 in FIG. 23 described above. Therefore, even when the top insulating film includes the silicon oxynitride film for an improved erase property, it is possible to inhibit or prevent charges from being stored in the region of the insulating film located between the memory gate electrode MG and the semiconductor substrate SB which is closer to the semiconductor region MS.

As a result, in the insulating film located between the memory gate electrode MG and the semiconductor substrate SB, the position to which electrons are injected during the write operation is more easily caused to correspond to the position to which holes are injected during the erase operation. This can reduce the difference between the distribution of the electrons injected during the write operation and the distribution of the holes injected during the erase operation. Therefore, it is possible to improve the resistance to data rewriting (the number of times data rewriting can be performed) and thus improve the performance of the semiconductor device having the nonvolatile memory.

In Embodiment 5 also, in the same manner as in Embodiment 1 described above, between the lower surface KM1 of the memory gate electrode MG and the semiconductor substrate SB, the position of the end portion T2a of the charge storage layer (insulating film MZ2) substantially corresponds to (is substantially aligned with) the position of the end portion T3a of the insulating film MZ3 adjacent to the charge storage layer (insulating film MZ2). As a result, between the lower surface KM1 of the memory gate electrode MG and the semiconductor substrate SB, the entire upper surface of the insulating film MZ2 is covered with the insulating film MZ3 and the silicon dioxide film OX1 is barely in contact with the upper surface of the insulating film MZ2. In this case, after the insulating film MZ is formed in Step S7, the top surface (upper surface) of the portion of the insulating film MZ2 which is to serve as the charge storage layer can retain the state covered with the insulating film MZ3. Accordingly, it is possible to inhibit or prevent the insulating film MZ2 which is to serve as the charge storage layer from being damaged by a cleaning step or the like. This can enhance the reliability of the insulating film MZ2 as the charge storage layer and thus improve the reliability of the semiconductor device having the nonvolatile memory.

Also, in Embodiment 5, between the lower surface KM1 of the memory gate electrode MG and the semiconductor substrate SB, the end portions T4a and T5a of the insulating films MZ4 and MZ5 are located closer to the side surface SM1 than the end portions T2a and T3a of the insulating films MZ2 and MZ3.

Between the lower surface KM1 of the memory gate electrode MG and the semiconductor substrate SB, the end portions T4a and T5a of the insulating films MZ4 and MZ5 are located closer to the side surface SM1 than the end portion T2a of the insulating film MZ2. This provides a state where the silicon dioxide film OX1 overlaps a part of the insulating film MZ2 via the insulating film MZ3. As a result, in the region where the silicon dioxide film OX1 overlaps the insulating film MZ2, not only the insulating film MZ3 made of the silicon oxynitride film, but also the silicon dioxide film OX1 functions as the charge block layer. The silicon dioxide film OX1 has a band gap larger than those of the silicon oxynitride film (insulating film MZ3) and the silicon nitride film (insulating film MZ4) and accordingly has an energy barrier higher than those thereof. Consequently, in the region where the silicon dioxide film OX1 overlaps the insulating film MZ2, it is possible to inhibit or prevent the occurrence of a phenomenon in which the charges retained in the insulating film MZ2 as the charge storage layer from moving into the memory gate electrode MG. This can improve the charge retaining property of the memory cell.

Therefore, Embodiment 5 can provide both of the advantage of Embodiment 1 described above, which is to maximally prevent the insulating film MZ2 serving as the charge storage layer from being exposed during the manufacturing process and improve the reliability, and the advantage of Embodiment 2 described above, which is to locate the silicon dioxide film OX1 over a part of the insulating film MZ2 and improve the charge retaining property.

In Embodiment 5 also, it is possible to form the offset spacers OS1 and OS2 in the same manner as in Embodiment 2 or 4 described above. In that case, in Embodiment 5 also, in the same manner as in Embodiment 2 or 4 described above, an equivalent to the silicon dioxide film OX1 is configured of a part of the offset spacer OS1.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:
1. A semiconductor device having a memory cell of a nonvolatile memory, comprising:
   a semiconductor substrate;
   a first gate electrode formed over the semiconductor substrate via a first gate insulating film; and a second gate electrode formed over the semiconductor substrate via a multi-layer insulating film, and adjacent to the first gate electrode via the multi-layer insulating film, wherein the multi-layer insulating film includes a first insulating film, a second insulating film over the first insulating film, and a third insulating film over the second insulating film, wherein the second insulating film has a charge storing function, wherein the second gate electrode has a lower surface facing the semiconductor substrate, a first side surface adjacent to the first gate electrode via the multi-layer insulating film, and a second side surface opposite to the first side surface, and wherein a fourth insulating film is formed between the lower surface of the second gate electrode and the semiconductor substrate and is in contact with the first, second and third insulating films such that the fourth insulating film is located closer to a first end portion of the second side surface of the second gate electrode than to a second end portion of the first side surface of the second gate electrode.

2. The semiconductor device according to claim 1, wherein the fourth insulating film is located over the first insulating film such that the fourth insulating film is located between the lower surface of the second gate electrode and a top surface of the first insulating film, and wherein, a third end portion of the third insulating film and a fourth end portion of the second insulating film are located between the lower surface of the second gate electrode and the semiconductor substrate, and are in contact with the fourth insulating film.

3. The semiconductor device according to claim 2, wherein a fifth end portion of the first insulating film is located between the lower surface of the second gate electrode and the semiconductor substrate, and wherein the third end portion of the third insulating film and the fourth end portion of the second insulating film are located closer than the fifth end portion of the first insulating film to the second end portion of the first side surface of the second gate electrode.

4. The semiconductor device according to claim 3, further comprising:

a first side-wall insulating film formed over the second side surface of the second gate electrode, the fourth insulating film and the first insulating film, wherein the first side-wall insulating film is in contact with the second side surface of the second gate electrode, the fourth insulating film and the first insulating film.

5. The semiconductor device according to claim 3, wherein the fourth insulating film extends to the second side surface of the second gate electrode such that the second side surface of the second gate electrode is covered with the fourth insulating film.

6. The semiconductor device according to claim 5, further comprising:

a first side-wall insulating film formed over the fourth insulating film, wherein the fourth insulating film is located between the second side surface of the second gate electrode and the first side-wall insulating film such that the fourth insulating film is in contact with the first side-wall insulating film and the second side surface of the second gate electrode.

7. The semiconductor device according to claim 1, wherein, a third end portion of the third insulating film, a fourth end portion of the second insulating film and a fifth end portion of the first insulating film are located between the lower surface of the second gate electrode and the semiconductor substrate, and are in contact with the fourth insulating film, and wherein the fourth insulating film is in contact with a top surface of the substrate.

8. The semiconductor device according to claim 7, wherein the third end portion of the third insulating film is located closer than the fourth end portion of the second insulating film to the second end portion of the first side surface of the second gate electrode.

9. The semiconductor device according to claim 7, wherein the third end portion of the third insulating film is located closer than the fifth end portion of the first insulating film to the second end portion of the first side surface of the second gate electrode.

10. The semiconductor device according to claim 8, further comprising:

a first side-wall insulating film formed over the second side surface of the second gate electrode, wherein the first side-wall insulating film is in contact with the second side surface of the second gate electrode.

11. The semiconductor device according to claim 10, wherein the first side-wall insulating film is formed over the fourth insulating film such that the first side-wall insulating film is in contact with the fourth insulating film.

12. The semiconductor device according to claim 10, wherein the first insulating film is a silicon dioxide film, and the second insulating film is a silicon nitride film.

13. The semiconductor device according to claim 12, wherein the third insulating film is a multi-layer film including a silicon oxynitride film and a fifth insulating film over the silicon oxynitride film.

14. The semiconductor device according to claim 12, wherein the third insulating film is a single-layer film silicon oxynitride.

15. The semiconductor device according to claim 12, further comprising:

a first semiconductor region and a second semiconductor region each formed in the semiconductor substrate to be used as a source or drain region included in the memory cell, wherein the first and second gate electrodes are disposed over the semiconductor substrate to be located between the first and second semiconductor regions.

16. The semiconductor device according to claim 15, wherein a charge having a first polarity is injected from the second gate electrode into the second insulating film of the multi-layer insulating film to perform an erase operation of the memory cell.

17. The semiconductor device according to claim 16, wherein, in the erase operation of the memory cell, the charge having the first polarity is injected into the second insulating film of the multi-layer insulating film by tunneling.

18. The semiconductor device according to claim 17, wherein a charge having a second polarity opposite to the first polarity is injected from the semiconductor substrate into the second insulating film of the multi-layer insulating film to perform a write operation of the memory cell.

19. The semiconductor device according to claim 18,
wherein, in the write operation of the memory cell, the charge having the second polarity is injected into a portion of the second insulating film of the multi-layer insulating film which is closer to the first gate electrode by source-side injection.

20. The semiconductor device according to one of claim 9, further comprising:
a first side-wall insulating film formed over the second side surface of the second gate electrode,
wherein the first side-wall insulating film is in contact with the second side surface of the second gate electrode.

21. The semiconductor device according to claim 20,
wherein the first side-wall insulating film is formed over the fourth insulating film such that the first side-wall insulating film is in contact with the fourth insulating film.

22. The semiconductor device according to claim 20,
wherein the first insulating film is a silicon dioxide film, and the second insulating film is a silicon nitride film.

23. The semiconductor device according to claim 22,
wherein the third insulating film is a multi-layer film including a silicon oxynitride film and a fifth insulating film over the silicon oxynitride film.

24. The semiconductor device according to claim 22,
wherein the third insulating film is a single-layer film silicon oxynitride.

25. The semiconductor device according to claim 22, further comprising:
a first semiconductor region and a second semiconductor region each formed in the semiconductor substrate to be used as a source or drain region included in the memory cell,
wherein the first and second gate electrodes are disposed over the semiconductor substrate to be located between the first and second semiconductor regions.

26. The semiconductor device according to claim 25,
wherein a charge having a first polarity is injected from the second gate electrode into the second insulating film of the multi-layer insulating film to perform an erase operation of the memory cell.

27. The semiconductor device according to claim 26,
wherein, in the erase operation of the memory cell, the charge having the first polarity is injected into the second insulating film of the multi-layer insulating film by tunneling.

28. The semiconductor device according to claim 27,
wherein a charge having a second polarity opposite to the first polarity is injected from the semiconductor substrate into the second insulating film of the multi-layer insulating film to perform a write operation of the memory cell.

29. The semiconductor device according to claim 28,
wherein, in the write operation of the memory cell, the charge having the second polarity is injected into a portion of the second insulating film of the multi-layer insulating film which is closer to the first gate electrode by source-side injection.

\* \* \* \* \*